US010387712B2

(12) United States Patent
Zeng et al.

(10) Patent No.: US 10,387,712 B2
(45) Date of Patent: Aug. 20, 2019

(54) DISPLAY PANEL AND DISPLAY APPARATUS

(71) Applicant: Shanghai Tianma Micro-Electronics Co., Ltd., Shanghai (CN)

(72) Inventors: Yang Zeng, Shanghai (CN); Qing Zhang, Shanghai (CN); Lihua Wang, Shanghai (CN); Liang Xie, Shanghai (CN); Lingxiao Du, Shanghai (CN); Hong Ding, Shanghai (CN); Huiping Chai, Shanghai (CN); Kang Yang, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 20 days.

(21) Appl. No.: 15/812,435

(22) Filed: Nov. 14, 2017

(65) Prior Publication Data

US 2018/0068157 A1 Mar. 8, 2018

(30) Foreign Application Priority Data

Apr. 27, 2017 (CN) .......................... 2017 1 0287808

(51) Int. Cl.
*G06K 9/00* (2006.01)

(52) U.S. Cl.
CPC ........... *G06K 9/0004* (2013.01); *G06K 9/001* (2013.01); *G06K 9/0008* (2013.01)

(58) Field of Classification Search
CPC .... G06K 9/0004; G06K 9/001; G06K 9/0008; G06K 9/00013; G06K 9/00114; H01L 27/323; G06F 3/0412
See application file for complete search history.

(56) References Cited

U.S. PATENT DOCUMENTS

2013/0120760 A1* 5/2013 Raguin .................. G01B 11/24
356/612
2017/0161540 A1* 6/2017 Mienko ................. G06F 3/0421
2018/0233531 A1* 8/2018 Huang .............. H01L 27/14678
2018/0301494 A1* 10/2018 Park .................. H01L 27/14627

FOREIGN PATENT DOCUMENTS

CN 105550664 A 5/2016
CN 106298859 A 1/2017

* cited by examiner

*Primary Examiner* — Yon J Couso
(74) *Attorney, Agent, or Firm* — Alston & Bird LLP

(57) ABSTRACT

A display panel and a display apparatus are provided. The display panel includes: an organic light emitting display panel including an array substrate and organic light emitting configurations disposed on the array substrate; a fingerprint identification module arranged in a display region and arranged at a side facing away from the organic light emitting configurations of the array substrate; an angle limiting film arranged between the organic light emitting display panel and the fingerprint identification module. The fingerprint identification module includes a first substrate, at least one fingerprint identification unit for performing fingerprint identification according to light rays reflected, through a touch body, on the fingerprint identification unit. The angle limiting film filters out the following among the light rays reflected on the fingerprint identification unit: relative to the angle limiting film, the light rays have an incident angle greater than a penetration angle of the angle limiting film.

20 Claims, 38 Drawing Sheets

DISPLAY PANEL AND DISPLAY APPARATUS

CROSS-REFERENCE TO RELATED APPLICATIONS

This application claims priority to a Chinese patent application No. CN201710287808.6 filed on Apr. 27, 2017, the disclosure of which is incorporated herein by reference in its entirety.

TECHNICAL FIELD

Embodiments of the present disclosure relate to the technical field of displays, and particularly relate to a display panel and a display apparatus.

BACKGROUND

Fingerprints are inherent and unique for everyone. Various display apparatuses with a fingerprint identification function, such as a mobile phone, a tablet personal computer, a smart wearable device, etc., have appeared on market. When a user operates a display apparatus with the fingerprint identification function, the user only needs to touch a fingerprint identification module of the display apparatus with a finger to perform authority verification, simplifying an authority verification process.

In an existing display apparatus with the fingerprint identification function, the fingerprint identification module generally performs an identification action by detecting light rays reflected, through a touch body (such as a finger), on a fingerprint identification unit, i.e. by detecting a ridge and a valley of the fingerprint profile through the light rays. However, light rays reflected through different positions of the touch body may be irradiated on the same fingerprint identification unit, thereby causing a serious crosstalk phenomenon in a fingerprint identification process, which affects the accuracy and precision of fingerprint identification of a fingerprint identification sensor.

SUMMARY

The present disclosure provides a display panel and a display apparatus, so as to avoid a crosstalk phenomenon existed in a fingerprint identification process and improve fingerprint identification accuracy and precision.

In a first aspect, embodiments of the present disclosure provide a display panel, including: a display module, a fingerprint identification module and an angle limiting film.

The display module includes an array substrate, and a plurality of organic light emitting configurations disposed on the array substrate.

The fingerprint identification module is located in a display region, and arranged at a side, facing away from the organic light emitting configurations, of the array substrate. The fingerprint identification module includes: a first substrate; and at least one fingerprint identification unit disposed on the first substrate, the at least one fingerprint identification unit is configured to perform fingerprint identification according to light rays reflected on the fingerprint identification unit through a touch body.

The angle limiting film is arranged between the display module and the fingerprint identification module. The angle limiting film is configured to filter out the following light rays among the light rays reflected on the fingerprint identification unit through the touch body: relative to the angle limiting film, the light rays have an incident angle greater than a penetration angle of the angle limiting film. A transmittance of the angle limiting film for incident light rays perpendicular to the angle limiting film is "$\alpha$". The penetration angle of the angle limiting film means an incident angle of the light rays with a transmittance of $k\alpha$ relative to the angle limiting film, and $0<k<1$.

In a second aspect, embodiments of the present disclosure further provide a display apparatus, including the display panel described in the first aspect.

In the display panel and the display apparatus provided by an embodiment of the present disclosure, an angle limiting film is provided between the display module and the fingerprint identification module, and the angle limiting film is capable of filtering out the following light rays among the light rays reflected, through the touch body, on the fingerprint identification unit: relative to the angle limiting film, the light rays have an incident angle greater than the penetration angle of the angle limiting film. Therefore, compared with the existing art in which a crosstalk phenomenon is caused because the light rays reflected through different positions of the touch body are irradiated on the same fingerprint identification unit, the light rays reflected on the same fingerprint identification unit through different positions of the touch body can be selectively filtered out through the angle limiting film. That is, the light rays with an incident angle relative to the angle limiting film greater than the penetration angle of the angle limiting film can be filtered out, thereby effectively avoiding a crosstalk phenomenon caused by that the light rays reflected through different positions of the touch body are irradiated on the same fingerprint identification unit, and improving accuracy and precision for fingerprint identification.

BRIEF DESCRIPTION OF DRAWINGS

By reading detailed description made to non-limiting embodiments through reference to the following drawings, other features, objects and advantages of the present application will become more apparent.

DETAILED DESCRIPTION

Figure 1A:
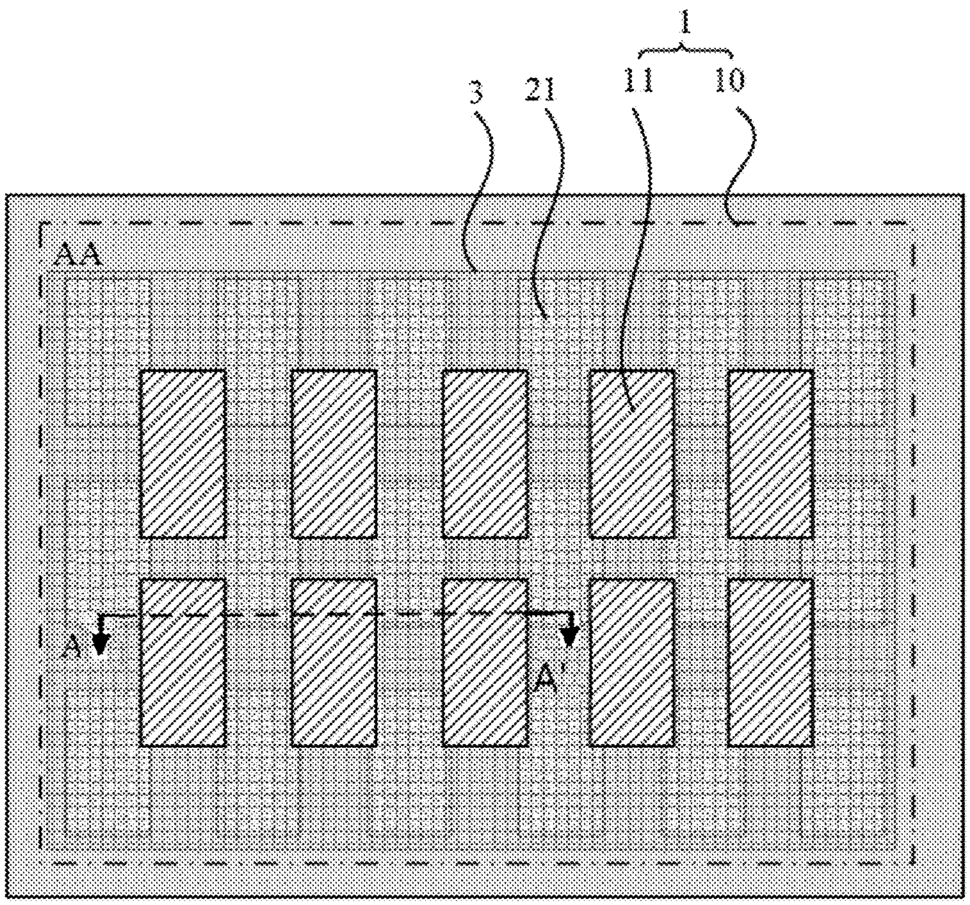
FIG. 1*a* is a top view of a structural schematic diagram illustrating a display panel provided by an embodiment of the present disclosure.

The present disclosure is further described below in detail in combination with drawings and embodiments. It can be understood that specific embodiments described herein are only used for explaining the present disclosure, not limiting the present disclosure. It should also be noted that to facilitate description, drawings only show some structures relevant to the present disclosure, not all of the structures. Throughout the description, identical or similar drawing signs represent identical or similar structures, elements or flows. It should be noted that embodiments in the present application and features in embodiments can be combined mutually without conflict.

Embodiments of the present disclosure provide a display panel, including a display module, a fingerprint identification module and an angle limiting film. The display module includes an array substrate, and a plurality of organic light emitting configurations disposed on the array substrate. The fingerprint identification module is located in a display region, and arranged at a side, facing away from the organic light emitting configurations, of the array substrate. The fingerprint identification module includes a first substrate, and at least one fingerprint identification unit disposed on the first substrate. The at least one fingerprint identification unit is configured to perform fingerprint identification according to light rays reflected, through a touch body, on the fingerprint identification unit. The angle limiting film is arranged between the display module and the fingerprint identification module, and is configured to filter out the following light rays among the light rays reflected on the fingerprint identification unit through the touch body: relative to the angle limiting film, the light rays have an incident angle greater than a penetration angle of the angle limiting film. A transmittance of the angle limiting film for incident light rays perpendicular to the angle limiting film is $\alpha$. The penetration angle of the angle limiting film means an incident angle of the light rays with a transmittance of $k\alpha$ relative to the angle limiting film, and $0<k<1$.

For everyone, skin wrinkles including the fingerprint are different in patterns, breakpoints and cross points, and are unique and are not changed through the life. Accordingly, each fingerprint corresponds to a person, so that a real identity of the person is verified by comparing the fingerprint of the person with a pre-saved fingerprint data. This is called as a fingerprint identification technology. Benefiting from an electronic integrated manufacturing technology and a rapid and reliable algorithm research, an optical fingerprint identification technology in the fingerprint identification technology is popular in daily life, and becomes a technology having a deepest research, a widest application and a most mature development in current biological detection. A working principle of the optical fingerprint identification technology is as follows: light rays emitted from a light source in the display panel are irradiated on fingers, and reflected through the finger to form a reflection light; the formed reflection light is transmitted to finger sensors; and the finger sensors acquire optical signals incident on the finger sensors. Since the fingerprint has specific wrinkles, the reflection light formed at ridges and valleys of the finger has different intensities. Therefore, the optical signals acquired by the sensors are different, thereby realizing the fingerprint identification function, and accordingly determining the real identify of the user.

However, the light rays reflected through different positions of the touch body may be irradiated on the same fingerprint identification unit. For example, the light rays emitted via a ridge of the touch body and an adjacent valley may be irradiated on the same fingerprint identification unit. In this way, the fingerprint identification unit having received the light rays fail to detect accurate positions of the ridge and valley of the fingerprint, thereby causing a serious crosstalk phenomenon in the fingerprint identification process, and affecting the accuracy and precision of fingerprint identification of the fingerprint identification sensor.

In embodiments of the present disclosure, an angle limiting film is provided between the display module and the fingerprint identification module, and the angle limiting film is capable of filtering out the following light rays among the light rays reflected, through the touch body, on the fingerprint identification unit: relative to the angle limiting film, the light rays have an incident angle greater than the penetration angle of the angle limiting film. Therefore, compared with the existing art in which a crosstalk phenomenon is caused because the light rays reflected through different positions of the touch body are irradiated on the same fingerprint identification unit, the light rays reflected on the same fingerprint identification unit through different positions of the touch body can be selectively filtered out through the angle limiting film. That is, the light rays with an incident angle relative to the angle limiting film greater than the penetration angle of the angle limiting film can be filtered out, thereby effectively avoiding a crosstalk phenomenon caused by that the light rays reflected through different positions of the touch body are irradiated on the same fingerprint identification unit, and improving accuracy and precision for fingerprint identification.

The above is a core concept of the present disclosure, and embodiments of the present disclosure will be clearly and completely described below in combination with drawings in the embodiments of the present disclosure. All other embodiments obtained by those ordinary skilled in the art without contributing creative labor based on embodiments in the present disclosure belong to a protection scope of the present disclosure.

Figure 1B:
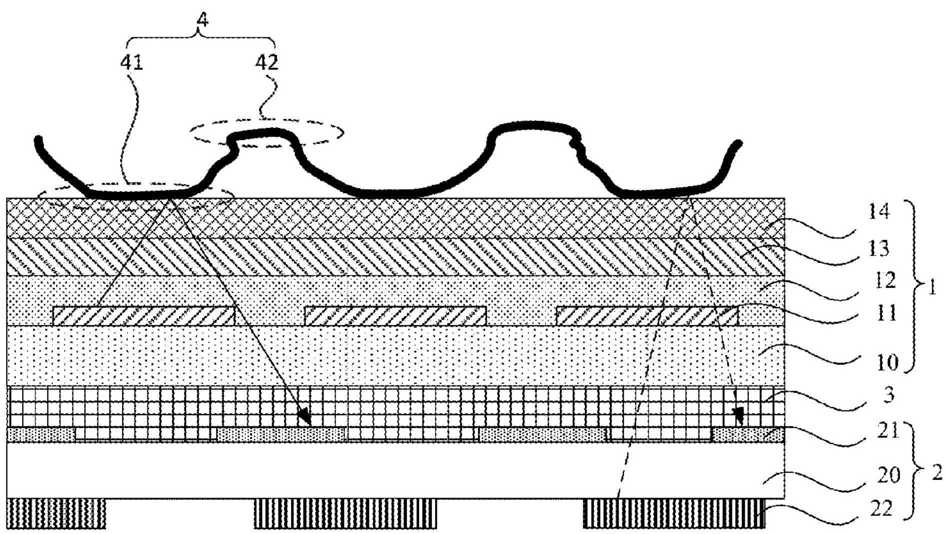
FIG. 1*b* is a cross sectional structural schematic diagram along line AA' in FIG. 1*a;*

FIG. 1*a* is a top view of structural schematic diagram illustrating a display panel provided by an embodiment of the present disclosure. FIG. 1*b* is a cross sectional structural schematic diagram along line AA' in FIG. 1*a*. In combination with FIG. 1*a* and FIG. 1*b*, the display panel includes a display module 1, a fingerprint identification module 2 and an angle limiting film 3. The display module 1 includes an array substrate 10, and a plurality of organic light emitting configurations 11 disposed on the array substrate 10. The fingerprint identification module 2 is located in a display region AA, and is arranged at a side, facing away from the organic light emitting configurations 11, of the array substrate 10. The fingerprint identification module 2 includes a first substrate 20, and at least one fingerprint identification unit 21 disposed on the first substrate 20. The angle limiting film 3 is arranged between the display module 1 and the fingerprint identification module 2.

The fingerprint identification module 2 is configured to perform fingerprint identification according to the light rays reflected on the fingerprint identification unit 21 through the touch body 4. The angle limiting film 3 is configured to filter out the following light rays among the light rays reflected on the fingerprint identification unit 21 through the touch body 4: relative to the angle limiting film 3, the light rays have an incident angle greater than a penetration angle of the angle limiting film 3. A transmittance of the angle limiting film 3 for incident light rays perpendicular to the angle limiting film can be set as "$\alpha$". The penetration angle of the angle limiting film 3 means an incident angle of the light rays with a transmittance of $k\alpha$ relative to the angle limiting film 3, and $0<k<1$. Light with an incident angle relative to the angle limiting film 3 greater than the penetration angle of the angle limiting film 3 can be filtered out by the angle limiting film 3. Optionally, "k" can be set to be equal to 0.1, i.e., the penetration angle of the angle limiting film 3 is the incident angle of the light rays with a transmittance of $0.1\alpha$ relative to the angle limiting film 3.

As shown in FIG. 1*b*, light rays emitted from light sources are irradiated on the touch body 4. Corresponding to different light sources, light rays emitted from light sources may be light rays indicated by solid lines shown in FIG. 1*b*, or light rays indicated by dotted lines shown in FIG. 1*b*. The fingerprint identification unit 21 can perform fingerprint identification according to the light rays emitted from any light source. The touch body 4 is usually a finger. The fingerprint is composed of a series of ridges 41 and valleys 42 on a skin surface of a fingertip. Since distances from the ridges 41 and the valleys 42 to the fingerprint identification unit are different, intensities of light rays reflected from the ridges 41 and the valleys 42 and received by the fingerprint identification unit 21 are different. Accordingly, current signals converted by the reflection light formed at the ridges 41 and the reflection light formed at the valleys 42 are different in magnitude. Therefore, fingerprint identification can be performed according to the magnitude of the current signals. It should be noted that the touch body 4 may also be a palm and the like, and a palm winkle may also be used to realize detection and identification functions.

Optionally, the organic light emitting configuration 11 is configured to provide a light source for the fingerprint identification module 2. The fingerprint identification unit 21 performs fingerprint identification according to the light rays emitted from the organic light emitting configuration 11 and reflected, through the touch body 4, on the fingerprint identification unit 21, such as the light rays indicated by solid lines shown in FIG. 1*b*. The angle limiting film 3 is configured to filter out the following light rays among the light rays emitted from the organic light emitting configuration 11 and reflected, through the touch body 4, on the fingerprint identification unit 21: the incident angle of the light rays relative to the angle limiting film 3 is greater than the penetration angle of the angle limiting film 3. Therefore, the crosstalk phenomenon, caused by irradiating light emitted from the organic light emitting configurations 11 and reflected through different positions of the touch body 4 on the same fingerprint identification unit 21, is effectively avoided, thereby improving accuracy and precision for performing fingerprint identification by the fingerprint identification module.

Optionally, as for the light rays reflected perpendicularly from the touch body 4, the transmittance may be greater than 1% when being irradiated on the fingerprint identification unit 21 after passing through the display module 1. Specifically, when the fingerprint identification unit 21 performs fingerprint identification according to the light rays emitted from the organic light emitting configurations 11, if the transmittance of the light rays reflected perpendicularly from the touch body 4 and irradiated on the fingerprint identification unit 21 through the display module 1 is too small, the intensity of the light rays arrived at the fingerprint identification unit 21 is small, and the fingerprint identification precision is influenced. Exemplarily, as for the light rays reflected perpendicularly from the touch body 4 and irradiated on the fingerprint identification unit 21 through the display module 1, the transmittance may be adjusted by adjusting the thickness of each film through which the light rays pass.

Optionally, the display panel may include a light exiting side and a non-light exiting side. The light exiting side is the side, facing away from the array substrate 10, of the organic light emitting configuration 11. The non-light exiting side is the side, facing away from the organic light emitting configurations 11, of the array substrate 10. When the fingerprint identification unit 21 performs fingerprint identification according to the light rays emitted from the organic light emitting configurations 11, a luminance ratio of the light exiting side to the non-light exiting side of the display panel needs to be greater than 10:1. Light rays on the non-light exiting side of the display panel will affect the process of fingerprint identification, which is performed based on the light rays emitted from the organic light emitting configurations 11 and reflected on the fingerprint identification unit 21 through the touch body 4, so that there exists crosstalk in the light rays detected by the fingerprint identification unit. If the luminance at the non-light exiting side of the display panel is too high, the fingerprint identification precision may be seriously affected.

It should be noted that relative positions of the organic light emitting configuration 11 and the fingerprint identification unit 21 illustrated in FIG. 1*a* and FIG. 1*b* are an example. The relative positions of the organic light emitting configuration 11 and the fingerprint identification unit 21 are not limited in the embodiments of the present disclosure as long as the light rays emitted from the organic light emitting configurations 11 can be ensured to be reflected, through the touch body 4, on the fingerprint identification unit 21.

Optionally, the fingerprint identification module 2 may further include a fingerprint identification light source 22 arranged on a side, facing away from the fingerprint identification unit 21, of the first substrate 20. The fingerprint identification unit 21 is configured to perform fingerprint identification according to the light rays emitted from the fingerprint identification light source 22 and reflected, through the touch body 4, on the fingerprint identification unit 21, such as the light rays indicated by dotted lines shown in FIG. 1*b*. The angle limiting film 3 is configured to filter out the following light rays among the light rays emitted from the fingerprint identification light source 22 and reflected, through the touch body 4, on the fingerprint identification unit 21: relative to the angle limiting film 3, the light rays have an incident angle greater than a penetration angle of the angle limiting film 3. As a result, a crosstalk phenomenon, which is caused because the light of the fingerprint identification light source 22 is reflected through different positions of the touch body 4 and irradiated on the same fingerprint identification unit 21, is avoided, and accuracy and precision for fingerprint identification is improved.

Optionally, the light rays emitted from the fingerprint identification light source 22 are irradiated on the touch body 4 through a gap between two adjacent fingerprint identification units 21. Then, the light rays are perpendicularly reflected from the touch body 4 and irradiated on the fingerprint identification unit 21 through the display module 1. In this way, the transmittance of the light rays may be greater than 10%. Specifically, if a transmittance of the light rays reflected perpendicularly from the touch body 4 and irradiated on the fingerprint identification unit 21 through the display module 1 is small, the intensity of the light rays arrived at the fingerprint identification unit 21 is small, thereby affecting the fingerprint identification precision. In addition, compared with the situation that the fingerprint identification is performed by the fingerprint identification unit 21 according to the light rays emitted from the organic light emitting configuration 11, in a process of performing fingerprint identification by the fingerprint identification unit 21 according to the light rays emitted from the fingerprint identification light source 22 and in a process that the light rays emitted from the fingerprint identification light source 22 arrive at the fingerprint identification unit 21, the light rays pass through more films. That is to say, the total thickness of the films passed through is larger, thus the transmittance of the light rays reflected perpendicularly from the touch body 4 and irradiated on the fingerprint identification unit 21 through the display module 1 is larger.

It should be noted that the location and the type of the fingerprint identification light source 22 are not limited by an embodiment of the present disclosure. The light source may be a point light source or may be an area light source as long as the light rays emitted from the fingerprint identification light source 22 can be ensured to be reflected, through the touch body 4, on the fingerprint identification unit 21. Meanwhile, the light rays indicated by solid lines and dotted lines shown in FIG. 1*b* only exemplarily show some light rays emitted by the organic light emitting configuration 11 and the fingerprint identification light source 22. The light rays emitted from the organic light emitting configuration 11 and the fingerprint identification light source can be divergent. In addition, embodiments of the present disclosure do not limit the light source which may be the organic light emitting configuration 11 or an external suspending type fingerprint identification light source 22 as long as the light rays emitted from the light source can be ensured to be reflected on the fingerprint identification unit 21 through the touch body 4 for performing fingerprint identification.

Figure 2:
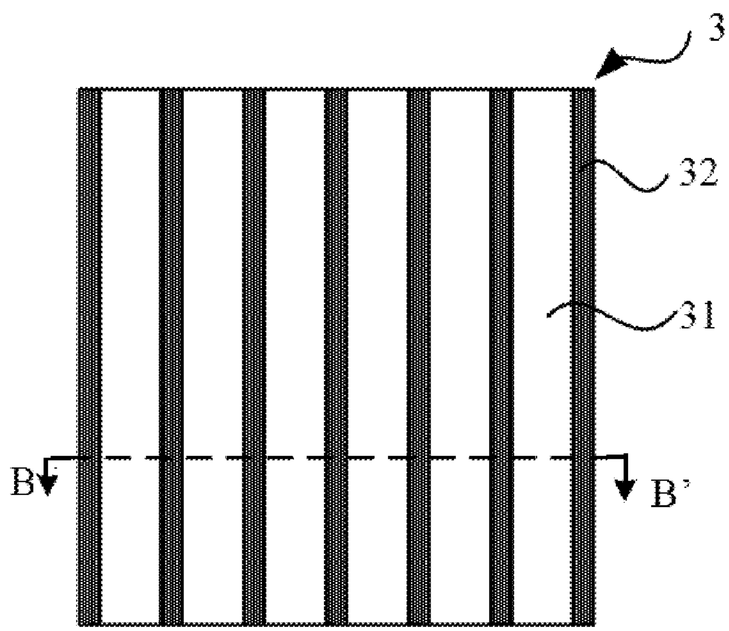
FIG. 2*a* is a top view of structural schematic diagram illustrating an angle limiting film provided by an embodiment of the present disclosure.
FIG. 2*b* is a cross sectional structural schematic diagram along line BB' in FIG. 2*a;*
FIG. 2*c* is a cross sectional structural schematic diagram illustrating a display panel provided by an embodiment of the present disclosure.
FIG. 2*d* is a geometrical relationship diagram illustrating a diffusion distance of an angle limiting film shown in FIG. 2*a;*
FIG. 2*e* is a top view of the structural schematic diagram illustrating another angle limiting film provided by an embodiment of the present disclosure.
Figure 2B:
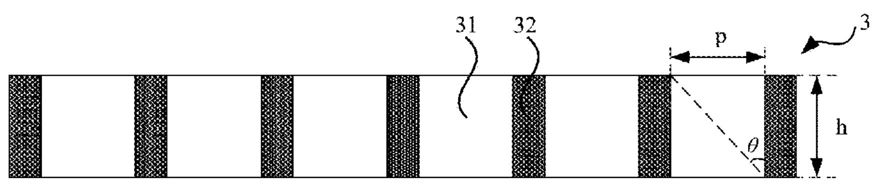

FIG. 2*a* is a top view of structural schematic diagram illustrating an angle limiting film provided by an embodiment of the present disclosure. FIG. 2*b* is a cross sectional structural schematic diagram along line BB' in FIG. 2*a*. In combination with FIG. 2*a* and FIG. 2*b*, the angle limiting film 3 includes a plurality of opaque regions 32 and a plurality of transparent regions 31. The plurality of opaque regions 32 and the plurality of transparent regions 31 are arranged alternatively along the same direction and parallel to the plane of the first substrate 20. The opaque regions 32 are provided with light absorbing materials.

Specifically, since the opaque regions 32 are provided with light absorbing materials, the light rays are absorbed by the light absorbing materials in the opaque regions 32 when being irradiated on the opaque regions 32. That is, the part of light reflected through the touch body 4 fail to pass through the angle limiting film 3 to be irradiated on the fingerprint identification unit 21, and is effectively filtered out by the angle limiting film 3. As shown in FIG. 2*b*, since the light rays irradiated on the opaque regions 32 are absorbed by the light absorbing materials in the regions, the penetration angle of the angle limiting film 3 meets the following formula:

$$\theta = \arctan\frac{p}{h} \quad \text{(formmula 1)}$$

where "θ" is the penetration angle of the angle limiting film 3; "p" is the width of each transparent region 31 along an arrangement direction of the transparent regions 31; and "h" is the thickness of the angle limiting film 3. It can be seen from FIG. 2*b* that "θ", "p" and "h" meet a computation relationship of tan θ=p/h. Therefore, the penetration angle of the angle limiting film 3 meets the above formula. Since the light rays irradiated on the opaque regions 32 will be absorbed by the light absorbing materials in such regions, light rays with the incident angle relative to the angle limiting film 3 greater than the computed penetration angle can be filtered out by the angle limiting film 3. Such part of light rays is not required for the fingerprint identification. The arrangement of the angle limiting film 3 can prevent the light rays with the incident angle relative to the angle limiting film 3 greater than the penetration angle of the angle limiting film 3 from being irradiated on the fingerprint identification unit 21, thereby avoiding an interference to the fingerprint identification process.

Optionally, in the case that the angle limiting film 3 includes a plurality of opaque regions 32 and transparent regions 31 which are parallel to the plane of the first substrate 20 and are arranged alternatively along the same direction, and the opaque regions 32 are provided with the light absorbing materials, a diffusion distance of the angle limiting film 3 meets the following formula:

$$\Delta X = \frac{p \cdot (H + h)}{h} \quad \text{(formula. 2)}$$

where ΔX is the diffusion distance of the angle limiting film 3; and "H" is the thickness of the display module 1. The diffusion distance of the angle limiting film 3 means a distance between the following two reflection points on the touch body 4: the reflection point of the actual detection light rays corresponding to a fingerprint identification unit 21, and the reflection point of interference detection light rays corresponding to the same fingerprint identification unit 21. A reflection light ray with a minimum incident angle relative to the fingerprint identification unit 21 is the actual detection light ray. Compared with the incident angle of the actual detection light ray relative to the fingerprint identification unit 21, a reflection light ray with greater incident angle relative to the fingerprint identification unit 21 is the interference detection light ray.

Figure 2C:
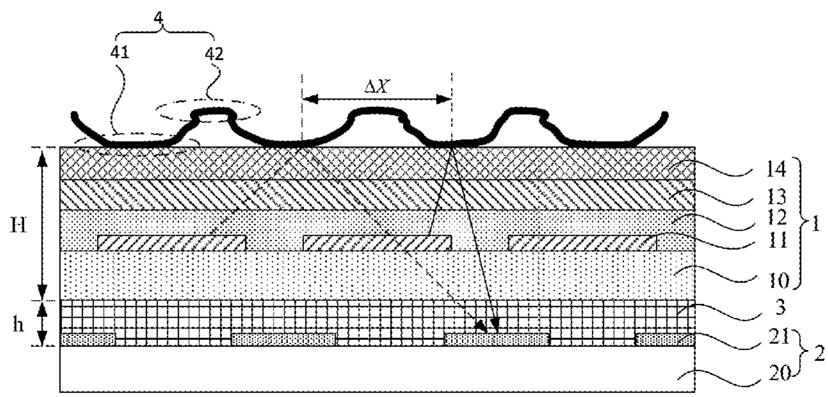

Exemplarily, as shown in FIG. 2*c*, description is made by taking the following situation as an example: the fingerprint identification unit 21 performs fingerprint identification according to the light rays emitted from the organic light emitting configurations 11 and reflected, through the touch body 4, on the fingerprint identification unit 21. The light ray indicated by solid lines in FIG. 2*c* is the reflection light ray with the minimum incident angle relative to the fingerprint identification unit 21, i.e. the actual detection light ray, and the light ray indicated by dotted lines in FIG. 2*c* is the reflection light ray with a greater incident angle relative to the fingerprint identification unit 21 compared with the incident angle of the actual detection light ray relative to the fingerprint identification unit 21, i.e. the interference detection light ray. In the case that no angle limiting film 3 is arranged, the actual detection light ray and the interference detection light ray are irradiated on the same fingerprint identification unit 21 after being reflected through different positions of the touch body 4, such as two adjacent ridges 41. In other words, there exists crosstalk in the fingerprint identification process in that case.

Figure 2D:
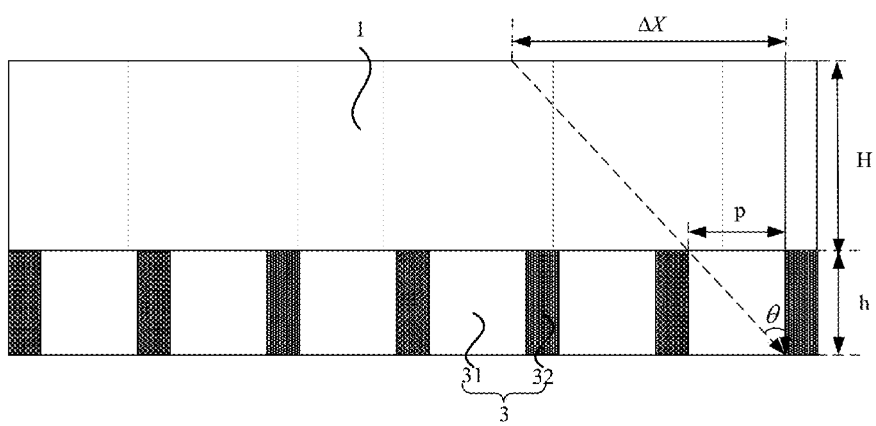

In this case, the diffusion distance of the angle limiting film 3 is a distance between the following reflection points on the touch body 4: the reflection point of the actual detection light ray shown in the FIG. 2*c*, and the reflection point of the interference detection light ray shown in the FIG. 2*c*. Exemplarily, as shown in FIG. 2*d*, the incident angle of the actual detection light ray relative to the fingerprint identification unit 21 is approximately 0°. As for the interference light rays that can pass through the angle limiting film 3, a minimum incident angle relative to the fingerprint identification unit 21 may be the penetration angle of the angle limiting film 3. Therefore, the following computation relationship is met:

$$\tan\theta = \frac{p}{h} = \frac{\Delta X}{H+h}. \quad \text{(formula 3)}$$

Therefore, the diffusion distance of the angle limiting film 3 meets the above formula. The larger the diffusion distance of the angle limiting film 3 is, the lower the accuracy and the precision of fingerprint identification performed by the display panel are.

Figure 2E:
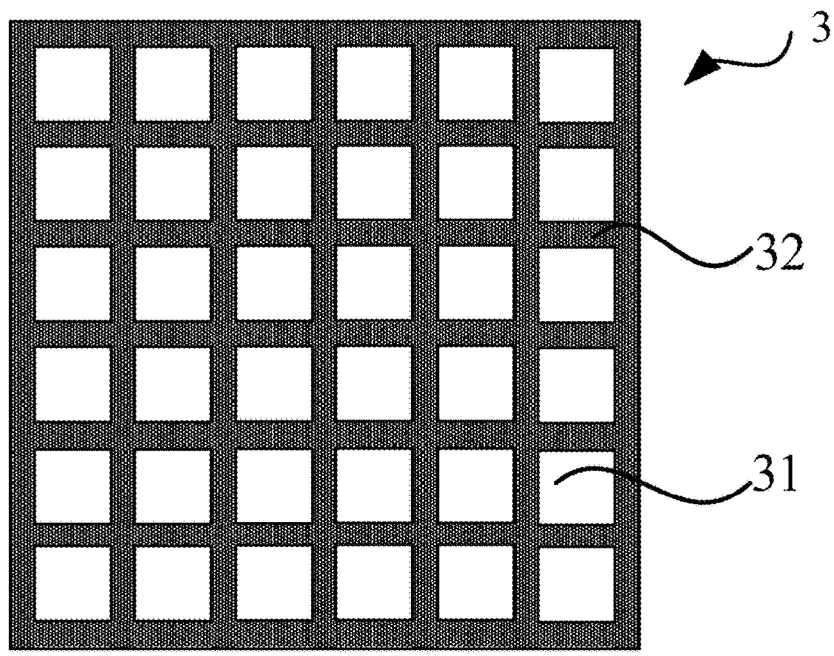

In FIG. 2*a*, the angle limiting film 3 is exemplarily configured as a one-dimensional structure in which the transparent regions 31 and the opaque regions 32 are arranged alternatively along the horizontal direction in FIG. 2*a*. However, the angle limiting film 3 may also be configured as a two-dimensional structure as shown in FIG. 2*e*. In this case, the transparent regions 31 and the opaque regions 32 are arranged alternatively along a diagonal direction of the angle limiting film 3 shown in FIG. 2*e*. Compared with the angle limiting film 3 of the one-dimensional structure, the angle limiting film 3 of the two-dimensional structure can selectively filter out the light rays being incident on the angle limiting film 3 in all directions.

Figure 3A:
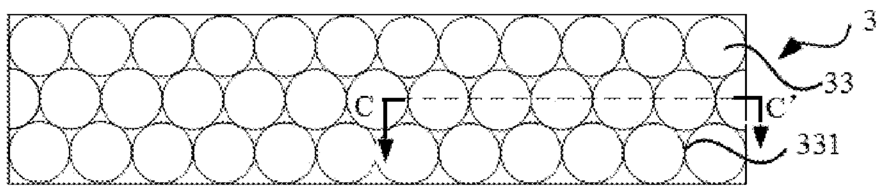
FIG. 3*a* is a top view of structural schematic diagram illustrating another angle limiting film provided by an embodiment of the present disclosure.
Figure 3B:
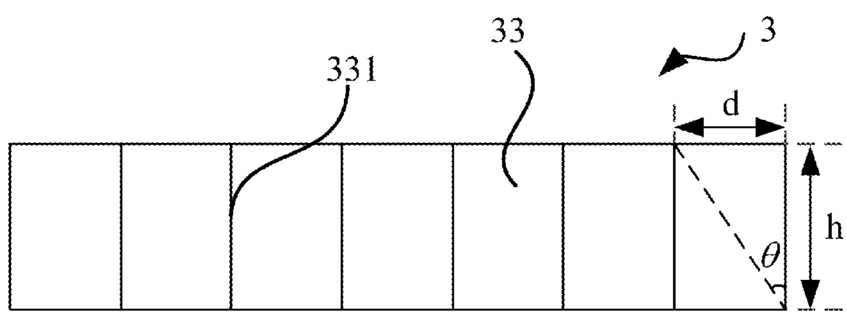
FIG. 3*b* is a cross sectional structural schematic diagram along line CC' in FIG. 3*a;*

FIG. 3*a* is a top view of structural schematic diagram illustrating another angle limiting film provided by an embodiment of the present disclosure. FIG. 3*b* is a cross sectional structural schematic diagram along line CC' in FIG. 3*a*. With reference to FIG. 3*a* and FIG. 3*b*, the angle limiting film includes porous configurations 33. The light rays incident on a side wall 331 of each of the porous configurations 33 are absorbed by the side wall 331. In other words, the light rays incident on the side wall 331 fail to be irradiated on the fingerprint identification unit 21. Exemplarily, the porous configuration 33 may be a glass capillary. The side wall 331 of the glass capillary is coated with black light absorbing materials, and thus the side wall 331 can absorb the light rays incident on the side wall 331, thereby filtering out a part of light rays by the angle limiting film 3. Optionally, the light absorbing materials may be or may not be provided between adjacent porous configurations 33.

Specifically, since the light rays incident on the side wall 331 are absorbed by the side wall 331 of the porous configuration 33, the penetration angle of the angle limiting film 3 meets the following formula:

$$\theta = \arctan\frac{d}{h} \quad \text{(formula. 4)}$$

where "θ" is the penetration angle of the angle limiting film 3; "d" is a diameter of the porous configuration 33; and "h" is the thickness of the angle limiting film 3. It can be seen from FIG. 3*b* that "θ", "d" and "h" comply with a computation relationship of $$\tan\theta = \frac{d}{h}.$$

Therefore, the penetration angle of the angle limiting film 3 meets the above formula.

Optionally, in the case that the angle limiting film 3 includes porous configurations 33 and the side wall 331 of each of the porous configurations 33 can absorb the light rays incident on the side wall 331, the diffusion distance of the angle limiting film 3 meets the following formula:

$$\Delta X = \frac{d\cdot(H+h)}{h} \quad \text{(formula 5)}$$

where Δx is the diffusion distance of the angle limiting film 3; and "H" is the thickness of the display module 1. A derivation process of the formula is similar to the derivation process of the diffusion distance of the angle limiting film 3 with the structure shown in FIG. 2*a*, and is not repeated herein. Similarly, the larger the diffusion distance of the angle limiting film 3 is, the lower the accuracy and the precision of fingerprint identification performed by the display panel are.

Figure 3C:
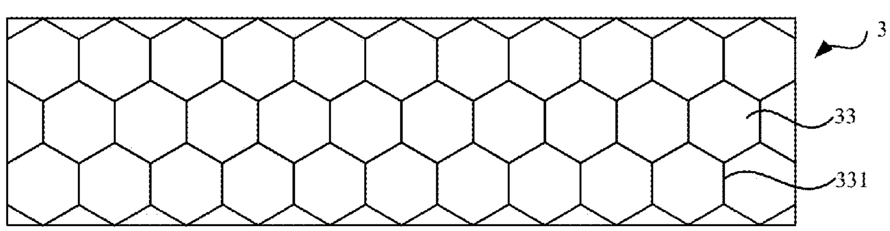
FIG. 3*c* is a top view of the structural schematic diagram illustrating another angle limiting film provided by an embodiment of the present disclosure.

It should be noted that, as viewed for the top view of, the porous configurations 33 of the angle limiting film 3 may have a circular shape as shown in FIG. 3*a* or an orthohexagonal shape as shown in FIG. 3*c*. Shapes of the porous configurations 33 are not limited in embodiments of the present disclosure.

Figure 4A:
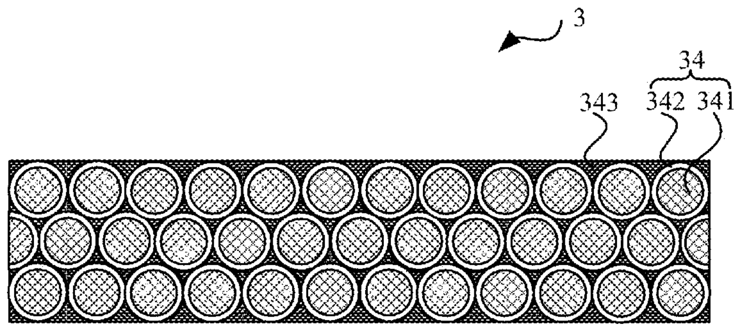
FIG. 4*a* is a top view of the structural schematic diagram illustrating another angle limiting film provided by an embodiment of the present disclosure.
Figure 4B:
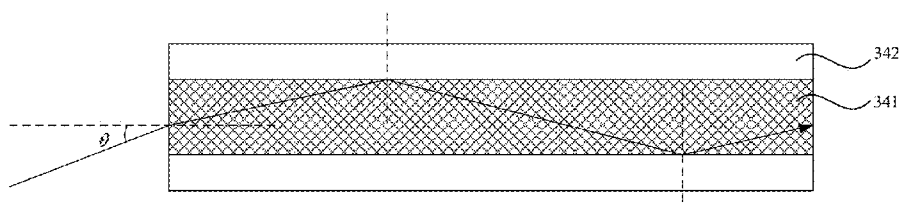
FIG. 4*b* is a cross sectional structural schematic diagram along an extension direction of optical fiber configurations in FIG. 4*a;*

FIG. 4*a* is a top view of structural schematic diagram illustrating another angle limiting film provided by an embodiment of the present disclosure. As shown in FIG. 4*a*, the angle limiting film 3 includes a plurality of optical fiber configurations 34 arranged along the same direction. FIG. 4*b* is a cross sectional structural schematic diagram along an extension direction of the optical fiber configurations 34 in FIG. 4*a*. With reference to FIG. 4*a* and FIG. 4*b*, each of the optical fiber configurations 34 includes an inner core 341 and an outer shell 342. Light absorbing materials 343 are provided between every two adjacent optical fiber configurations 34. Therefore, the light rays leaked to a region between two optical fiber configurations 34 from the optical fiber configuration 34 can be absorbed by the light absorbing materials 343, so as to filtering out a part of the light rays by the angle limiting film 3.

Specifically, the inner core 341 and the outer shell 342 of the optical fiber configuration 34 have different refractive indexes. The penetration angle of the angle limiting film 3 meets the following formula:

$$n\cdot\sin\theta=\sqrt{n_{core}^{2}-n_{clad}^{2}} \quad \text{(formula. 6)}$$

where "θ" is the penetration angle of the angle limiting film 3; "n" is the refractive index of a film, which comes into contact with the angle limiting film 3, in the display module 1; $n_{core}$ is the refractive index of the inner core 341 of the optical fiber configuration 34; and $n_{clad}$ is the refractive index of the outer shell 342 of the optical fiber configuration 34. As shown in FIG. 4*b*, if the incident angle, relative to the angle limiting film 3 formed with the optical fiber configurations 34, of the light rays reflected from the touch body 4 is greater than θ, a total reflection will not occurred to these light rays in the optical fiber configurations 34. In other words, these light rays can pass through the optical fiber configurations 34 and are absorbed by the light absorbing materials 343 between the optical fiber configurations 34. As a result, such part of the light rays is filtered out by the angle limiting film 3, and fail to be irradiated on the fingerprint identification unit 21. Therefore, with the angle limiting film 3, the light rays with an incident angle relative to the angle limiting film 3 greater than the penetration angle of the angle limiting film 3 can be filtered out. The crosstalk phenomenon, which is caused because that the light rays emitted from the fingerprint identification light sources 22 are reflected from different positions of the touch body 4 and irradiated on the same fingerprint identification unit 21, is avoided, and the accuracy and precision for fingerprint identification are improved.

Figure 4C:
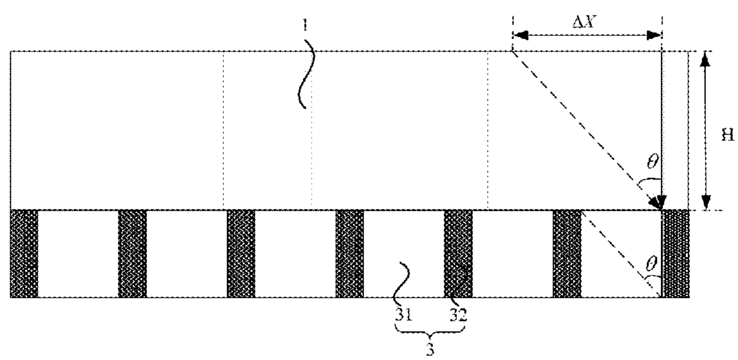
FIG. 4*c* is a geometrical relationship diagram illustrating a diffusion distance of an angle limiting film shown in FIG. 4*a;*

Optionally, in the case that the angle limiting film 3 includes a plurality of optical fiber configurations 34 arranged along the same direction, the inner core 341 and the outer shell 342 of the optical fiber configurations 34 have different refractive indexes, and light absorbing materials 343 are provided between every two adjacent optical fiber configurations 34, the diffusion distance of the angle limiting film 3 meets the following formula:

$$\Delta H=H\cdot\tan\theta \quad \text{(formula. 7)}$$

where ΔX is the diffusion distance of the angle limiting film 3; and "H" is the thickness of the display module 1. As shown in FIG. 4*c*, the incident angle of the actual detection light ray relative to the fingerprint identification unit 21 is approximately 0°. As for the interference light rays that can pass through the angle limiting film 3, a minimum incident angle relative to the fingerprint identification unit 21 may be the penetration angle of the angle limiting film 3, i.e., a critical value of the incident angle at which the total reflection will occur to the light rays in the optical fiber configurations 34. Therefore, the following computation relationship is met $$\tan\theta=\frac{\Delta X}{H}.$$

Similarly, the larger the diffusion distance of the angle limiting film 3 is, the lower the accuracy and the precision of fingerprint identification performed by the display panel are.

Figure 5A:
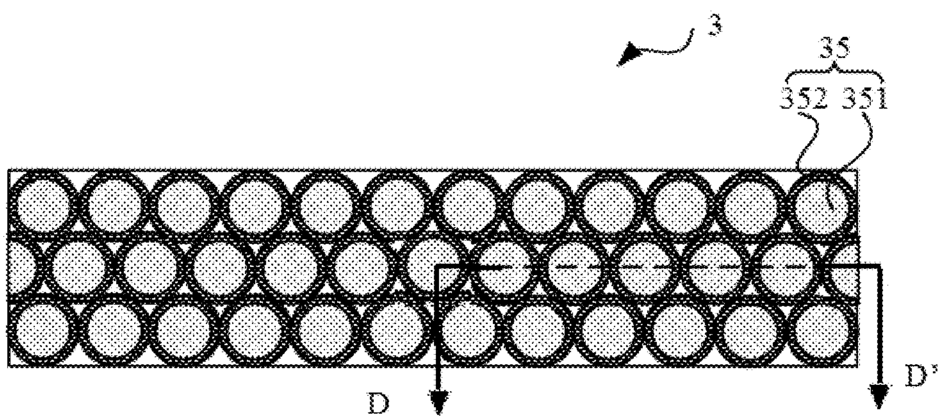
FIG. 5*a* is a top view of structural schematic diagram illustrating another angle limiting film provided by an embodiment of the present disclosure.
Figure 5B:
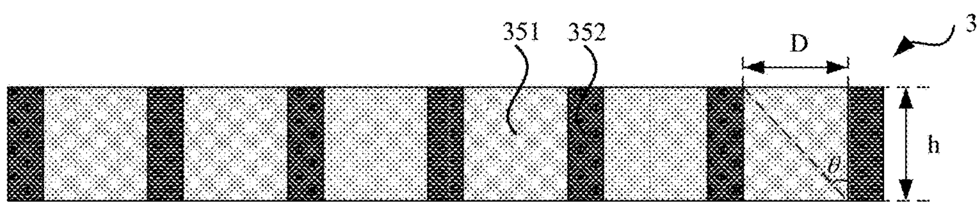
FIG. 5*b* is a cross sectional structural schematic diagram along line DD' in FIG. 5*a;*

FIG. 5*a* is a top view of structural schematic diagram illustrating another angle limiting film provided by an embodiment of the present disclosure. FIG. 5*b* is a cross sectional structural schematic diagram along line DD' in FIG. 5*a*. With reference to FIG. 5*a* and FIG. 5*b*, the angle limiting film 3 includes a plurality of columnar configurations 35 arranged along the same direction. Each of the columnar configurations 35 includes an inner core 351 and an outer shell 352. The inner core 351 and the outer shell 352 have the same refractive index, and the outer shell 352 includes light absorbing materials. Therefore, the light rays passing through the inner core 351 and being irradiated on the outer shell 352 are absorbed by the outer shell 352. In other words, the light rays irradiated on the outer shell 352 fail to be irradiated on the fingerprint identification unit 21. Optionally, the light absorbing materials may be or may not be provided between adjacent columnar configurations 35.

Specifically, the light rays passing through the inner core 351 and being irradiated on the outer shell 352 are absorbed by the outer shell 352. Therefore, the penetration angle of the angle limiting film 3 meets the following formula:

$$\theta=\arctan\frac{D}{h} \quad \text{(formula 8)}$$

where "θ" is the penetration angle of the angle limiting film 3; "D" is the diameter of the inner core 351; and "h" is the thickness of the angle limiting film 3. It can be seen from FIG. 5*b* that "θ", "D" and "h" comply with a computation relationship of $$\tan\theta=\frac{D}{h}.$$

Therefore, the penetration angle of the angle limiting film 3 meets the above formula.

Optionally, in the case that the angle limiting film 3 includes a plurality of columnar configurations 35 arranged along the same direction, each of the columnar configurations 35 includes the inner core 351 and the outer shell 352, the inner core 351 and the outer shell 352 have the same refractive index, and the outer shell 352 includes the light absorbing materials, the diffusion distance of the angle limiting film 3 meets the following formula:

$$\Delta X=\frac{D\cdot(H+h)}{h} \quad \text{(formula 9)}$$

where ΔX is the diffusion distance of the angle limiting film 3; and "H" is the thickness of the display module 1. A derivation process of the formula is similar to the derivation process of the diffusion distance of the angle limiting film 3 with the structure shown in FIG. 2*a*, and is not repeated herein. The larger the diffusion distance of the angle limiting film 3 is, the lower the accuracy and the precision of fingerprint identification performed by the display panel are.

It should be noted that, as viewed from the top view of the angle limiting film 3, shapes of the columnar configurations 35 can be correspondingly a circular structure shown in FIG. 5*a* or can be correspondingly structures of other shapes. The shapes of the columnar configurations 35 are not limited by an embodiment of the present disclosure.

Optionally, the diffusion distance of the angle limiting film 3 is less than 400 μm. The larger the diffusion distance of the angle limiting film 3 is, the larger the distance between the following two reflection points on the touch body 4 is: the reflection point of the interference detection light rays on the touch body 4, and the reflection point of the actual detection light rays on the touch body 4. When the distance between the reflection points on the touch body 4 of the actual detection light rays and the interference detection light rays is greater than the distance between the valley 42 and an adjacent ridge 41 in the fingerprint, the fingerprint identification process of the display panel may have an error. As a result, the fingerprint identification cannot be performed, and the fingerprint identification accuracy of the display panel is seriously affected.

Optionally, the organic light emitting configuration 11 is configured to provide a light source for the fingerprint identification module 2. When the fingerprint identification is performed by the fingerprint identification units 21 according to the light rays emitted from the organic light emitting configurations 11 and then reflected, through the touch body 4, on the fingerprint identification units 21, in the fingerprint identification phase, only one organic light emitting configuration 11 emits light within a range twice of the diffusion distance of the angle limiting film 3. Specifically, since only one organic light emitting configuration 11 emits light within a range twice of the diffusion distance of the angle limiting film 3, a probability that the light rays emitted from different organic light emitting configurations 11 are reflected, through different parts of the touch body 4, to the same fingerprint identification unit 21 can be significantly reduced. Accordingly, a crosstalk phenomenon, which is caused because the light emitted from the fingerprint identification light sources 22 are reflected through different parts of the touch body 4 and are irradiated on the same fingerprint identification unit 21, is reduced, thereby improving accuracy and precision for fingerprint identification.

Optionally, an optical adhesive layer is arranged between the fingerprint identification module 2 and the angle limiting film 3, and is configured to bond the fingerprint identification module 2 and the angle limiting film 3. Optionally, the fingerprint identification unit 21 includes an optical fingerprint sensor configured to perform fingerprint detection and identification according to the light rays reflected through the touch body 4. Exemplarily, the fingerprint identification unit 21 includes light absorbing materials such as amorphous silicon or gallium arsenide or arsenic sulfide, or other light absorbing materials. The materials of the fingerprint identification unit 21 are not limited by an embodiment of the present disclosure.

Optionally, as shown in FIG. 1*b* and FIG. 2*c*, the display panel may further include an encapsulating layer 12, a polarizer 13 and a cover glass 14 successively arranged on the organic light emitting configurations 11. The encapsulating layer 12 may include an encapsulating glass or a film encapsulating layer. When the encapsulating layer 12 includes an encapsulating glass, the display panel cannot bend. When the encapsulating layer 12 includes a film encapsulating layer, the display panel may be bent. Optionally, the first substrate 20 as the base of the fingerprint identification unit 21 may include a glass substrate or a flexible substrate. Exemplarily, the cover glass 14 may bonded to the polarizer 13 with optical adhesive.

Optionally, the display panel may further include a touch electrode layer. The touch electrode layer are arranged between the encapsulation layer 12 and the polarizer 13, or arranged between the cover plate glass 14 and the polarizer 13. The display panel integrated with the touch electrode can realize a touch function while having a display function.

It should be noted that drawings shown in embodiments of the present disclosure only exemplarily indicate sizes of all elements and thicknesses of all films, and do not represent actual sizes of all the elements and all the films in the display panel.

According to embodiments of the present disclosure, the angle limiting film 3 is arranged between the display module 1 and the fingerprint identification module 2, and is capable of filtering out the following light rays among the light rays reflected, through the touch body 4, on the fingerprint identification unit 21: relative to the angle limiting film 3, the light rays have an incident angle greater than the penetration angle of the angle limiting film 3. That is, the light rays reflected on the same fingerprint identification unit 21 through different parts of the touch body 4 in the existing art, can be selectively filtered out through the angle limiting film 3, thereby effectively avoiding the crosstalk phenomenon, which is caused because the light rays reflected through different parts of the touch body 4 are irritated on the same fingerprint identification unit 21, and improving accuracy and precision for fingerprint identification.

Figure 6A:
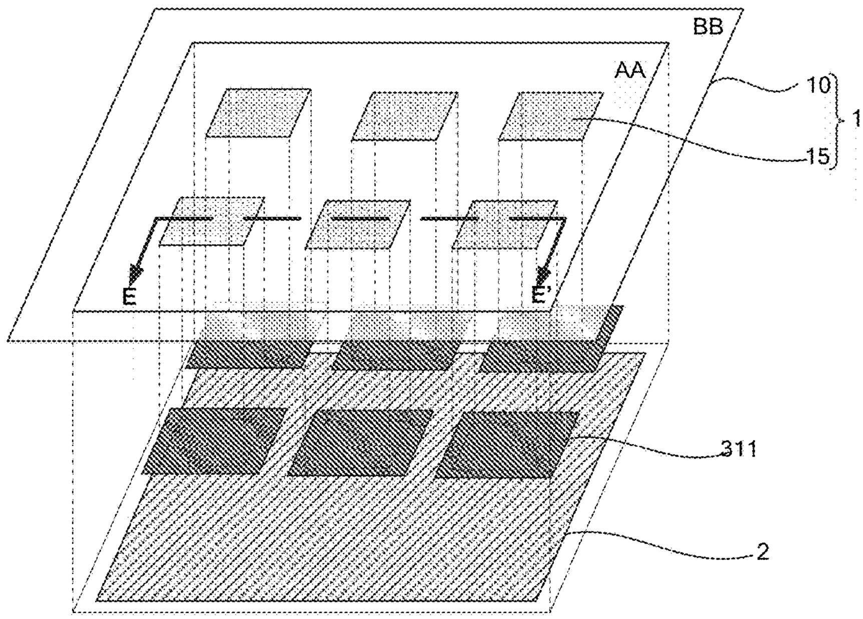
FIG. 6*a* is a perspective structural schematic diagram illustrating a display panel provided by an embodiment of the present disclosure.
Figure 6B:
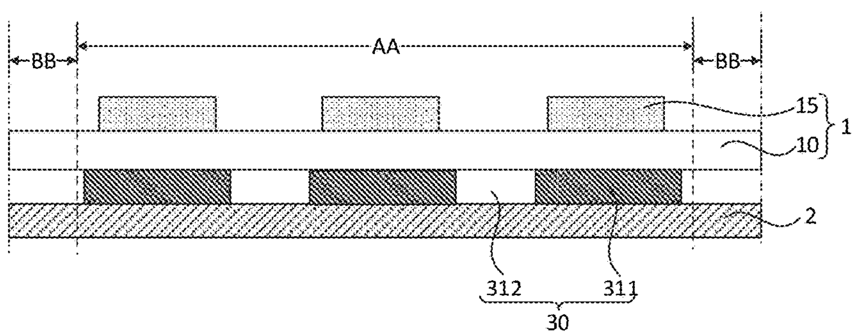
FIG. 6*b* is a cross sectional structural schematic diagram along line EE' in FIG. 6*a;*

FIG. 6*a* is a perspective structural schematic diagram illustrating a display panel provided by an embodiment of the present disclosure. FIG. 6*b* is a cross sectional structural schematic diagram along line EE' in FIG. 6*a*. In the case that fingerprint identification is performed with the light rays emitted from the fingerprint identification light source 22, with reference to FIG. 6*a* and FIG. 6*b*, the display panel includes a display module 1, a fingerprint identification module 2 and at least one layer of black matrix 30. The display module 1 includes an array substrate 10 and a plurality of pixel circuits 15. The array substrate 10 includes a display region AA and a non-display region BB that encircles the display region AA. The plurality of pixel circuits 15 are located in the display region AA of the array substrate 10, and each pixel circuit 15 includes a plurality of thin film transistors (not shown in FIG. 6*a* and FIG. 6*b*). Each of the thin film transistors includes a gate, a source and a drain. The fingerprint identification module 2 is formed in the display region AA and arranged at s side facing away from the thin film transistor (included in the pixel circuit 15) of the array substrate 10. The black matrix 30 is arranged between the thin film transistor (included in the pixel circuit 15) and the fingerprint identification module 2, and includes opaque regions 311 and transparent regions 312 located between the opaque regions 311. Projections, on the array substrate 10, of the gate, the source and the drain of the thin film transistor (included in the pixel circuit 15) are located in projections of the opaque regions 311 on the array substrate 10.

In embodiments of the present disclosure, a black matrix is arranged between the thin film transistors and the fingerprint identification module and the black matrix includes shading regions and an opening region located between the shading regions, so that the projections, on the first substrate, of the gate, the source and the drain of the thin film transistor are located in projections, on the first substrate, of shading regions. When the fingerprint identification is performed according to light emitted from a fingerprint identification light source, the light rays emitted from the fingerprint identification module can be shared with the shading regions of the black matrix so as to reduce reflection light formed by the light rays on the gate, the source and the drain of the thin film transistor. Therefore, a possibility that the reflection light formed on the gate, the source and the drain of the thin film transistor is incident to the fingerprint identification module is reduced, and the noise formed because the part of reflection light is incident to the fingerprint identification module, is further reduced. In addition, an opening region is arranged on the black matrix to allow the light rays emitted from the fingerprint identification module to pass through the opening region and to be irradiated on the finger pressed on the display panel, and allow the reflection light formed through fingerprint reflection of the finger to pass through the opening region. Through such arrangement, a signal-to-noise ratio of the fingerprint identification module is improved, and the fingerprint identification precision of the fingerprint identification module is improved.

Optionally, the material of the opaque region 311 of the black matrix 30 may be metal being black, an organic material being black or a material doped with black pigment. Since these materials have good absorptive capacity for the light rays, it is beneficial to absorbing the light rays emitted from the fingerprint identification module 2 and irradiated in the opaque region 311 of the black matrix 30 when the fingerprint identification is performed according to light emitted from the fingerprint identification light source. Therefore, the possibility that the reflection light formed on the gate, the source and the drain of the thin film transistor is incident to the fingerprint identification module 2, is further reduced, and the fingerprint identification precision of the fingerprint identification module 2 is improved. Typically, the material of the opaque region 311 of the black matrix 30 can be chrome.

Figure 7:
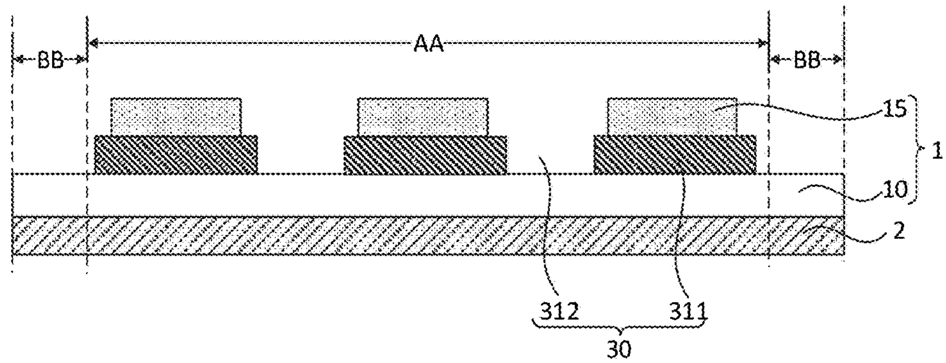
FIG. 7 is a cross sectional structural schematic diagram illustrating another display panel provided by an embodiment of the present disclosure.
Figure 8:
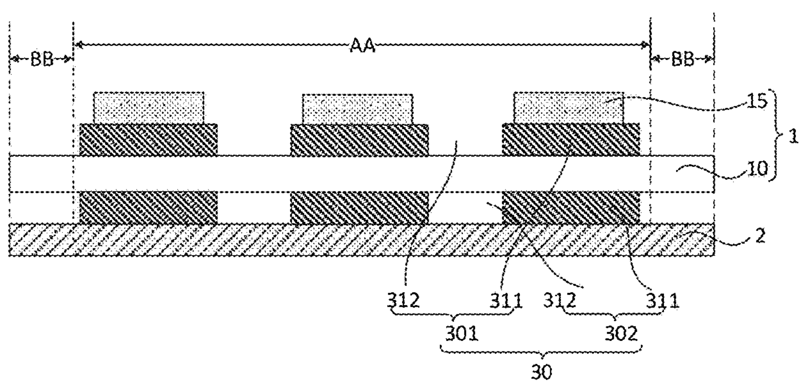
FIG. 8 is a cross sectional structural schematic diagram illustrating another display panel provided by an embodiment of the present disclosure.

It should be noted that, in FIG. 6*b*, the black matrix 30 is arranged between the array substrate 10 and the fingerprint identification module 2, which is only a specific example of the present disclosure, rather than a limitation to the present disclosure. Optionally, as shown in FIG. 7, the black matrix 30 is arranged between the thin film transistor (included in the pixel circuit 15) and the array substrate 10. Alternatively, as shown in FIG. 8, the display panel includes two layers of black matrix 30. The first layer of black matrix 301 is arranged between the thin film transistor (included in the pixel circuit 15) and the array substrate 10, and the second layer of black matrix 302 is arranged between the array substrate 10 and the fingerprint identification module 2.

During specific manufacture, according to a market need, the array substrate 10 may be configured as a rigid substrate, for example a substrate of quartz or a glass material; or configured as a flexible substrate, for example a substrate of a polyimide material. A structure of a typical display panel is described in detail below, but the listed examples are only used for explaining the present disclosure, rather than limiting the present disclosure.

Figure 9:
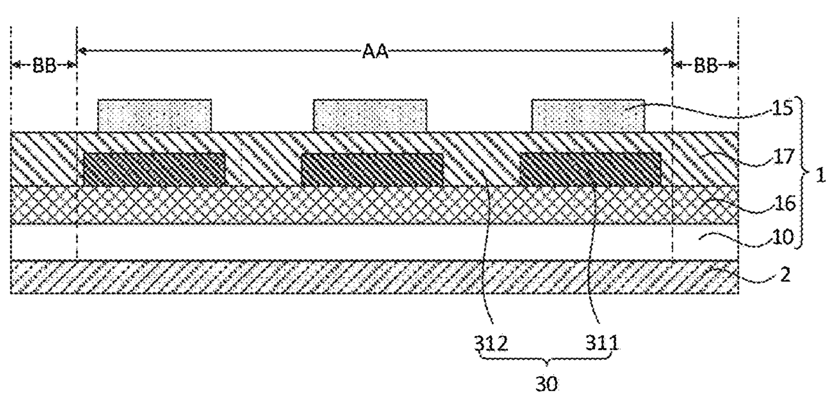
FIG. 9 is a cross sectional structural schematic diagram illustrating another display panel provided by an embodiment of the present disclosure.

FIG. 9 is a cross sectional structural schematic diagram illustrating another display panel provided by an embodiment of the present disclosure. Specifically, referring to FIG. 9, the array substrate 10 in the display panel is a rigid substrate. The black matrix 30 is arranged between the thin film transistor (included in the pixel circuit 15) and the array substrate 10. The display panel further includes a first planarizing layer 16 and a second planarizing layer 17. The first planarizing layer 16 is disposed on a surface close to the black matrix 30 of the array substrate 10. The second planarizing layer 17 is disposed on a surface close to the thin film transistor (included in the pixel circuit 15) of the black matrix 30. The second planarizing layer 17 covers the opaque region 311 of the black matrix 30 and fills the transparent region 312 of the black matrix 30.

The material of the array substrate 10 may be quartz or glass and the like. The array substrate 10 is configured to provide a supporting function in subsequent manufacturing processes of the pixel circuit 15, the organic light emitting configurations 11 and other components.

In practice, due to a limit of surface polishing precision of the array substrate 10, cleanness of the array substrate 10 and other factors, the array substrate 10 has small defects. The first planarizing layer 16 (which may be located on the array substrate 10) is arranged hereby for filling the small defects on the array substrate 10, and planarizing the surface of the array substrate 10.

Considering that, in the actual manufacturing process of the black matrix 30, a film is deposited only at a position on the array substrate 10 where the opaque region 311 of the black matrix 30 is to be arranged, and not deposited at a position on the array substrate 10 where the transparent region 312 of the black matrix 30 is to be arranged, a thickness difference exists between the opaque region 311 and the transparent region 312 of the black matrix 30 after the black matrix 30 is formed. In subsequent manufacture, part of regions forming a relevant film of the pixel circuit 15 will sink into the transparent region 312 of the black matrix 30, and thus displacement of part of components in the pixel circuit 15 near the transparent region 312 of the black matrix 30 is caused, causing that the pixel circuit 15 has a bad phenomenon of a short circuit or an open circuit, and a display effect of the display panel is affected. In the present embodiment, the second planarizing layer 17 is arranged on a surface close to the thin film transistor (included in the pixel circuit 15) of the black matrix 30, and the second planarizing layer 17 covers the opaque region 311 of the black matrix 30 and fills the transparent region 312 of the black matrix 30 for eliminating the thickness difference between the opaque region 311 of the black matrix 30 and the transparent region 312 of the black matrix 30, preventing a bad phenomenon of displacement of some components in the pixel circuit 15 formed in subsequent manufacturing process, and increasing a yield of the display panel. Optionally, the second planarizing layer 17 may also be arranged to only fill the transparent region 312 of the black matrix 30.

During specific manufacture, the materials of the first planarizing layer 16 and the second planarizing layer 17 may be any insulating material. Since polyimide has stable physical and chemical properties, good electrical insulating property, simple manufacturing process and low cost, optionally, the materials of the first planarizing layer 16 and the second planarizing layer 17 may be polyimide.

Figure 10:
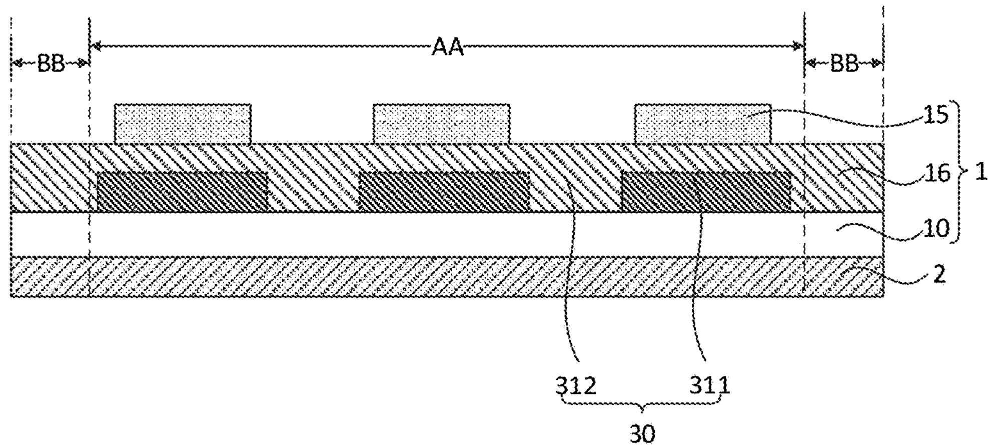
FIG. 10 is a cross sectional structural schematic diagram illustrating another display panel provided by an embodiment of the present disclosure.

FIG. 10 is a cross sectional structural schematic diagram illustrating another display panel provided by an embodiment of the present disclosure. Specifically, with reference to FIG. 10, the array substrate 10 in the display panel is a flexible substrate. The black matrix 30 is arranged between the thin film transistor (included in the pixel circuit 15) and the array substrate 10. The display panel further includes a first planarizing layer 16. The first planarizing layer 16 is arranged on a surface close to the thin film transistor (included in the pixel circuit 15) of the black matrix 30. The first planarizing layer 16 covers the opaque region 311 of the black matrix 30 and fills the transparent region 312 of the black matrix 30.

Similarly, in the present embodiment, the first planarizing layer 16 is arranged on the surface close to the thin film transistor (included in the pixel circuit 15) of the black matrix 30, and the first planarizing layer 16 covers the opaque region 311 of the black matrix 30 and fills the transparent region 312 of the black matrix 30 for eliminating a thickness difference between the opaque region 311 of the black matrix 30 and the transparent region 312 of the black matrix 30, preventing a bad phenomenon of displacement of some components in the pixel circuit 15 in subsequent preparation technologies, and increasing a yield of the display panel.

During specific manufacture, the materials of the array substrate 10 and the second planarizing layer 17 may be any insulating material. Since polyimide has stable physical and chemical properties, good electrical insulating property, strong toughness, simple manufacturing process and low cost, optionally, the materials of the array substrate 10 and the second planarizing layer 17 may be polyimide.

Based on the above embodiments, in the display panel, the thin film transistor forming the pixel circuit 15 may be a top gate structure, or may be a bottom gate structure, depending on product demands during specific manufacture. A structure of a typical display panel is described in detail below, but the listed examples are only used for explaining the present disclosure, rather than limiting the present disclosure.

Figure 11:
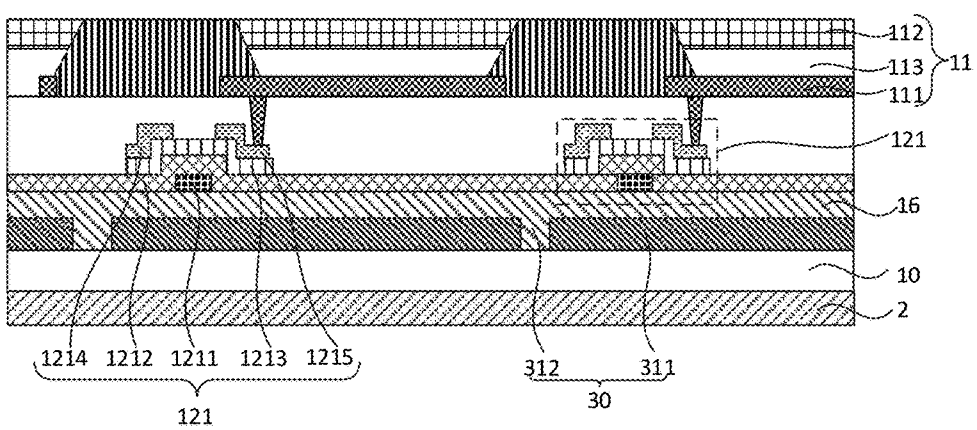
FIG. 11 is a cross sectional structural schematic diagram illustrating another display panel provided by an embodiment of the present disclosure.

FIG. 11 is a cross sectional structural schematic diagram illustrating another display panel provided by an embodiment of the present disclosure. Specifically, referring to FIG. 11, the pixel circuit of the display panel exemplarily includes only one thin film transistor 121. The thin film transistor 121 is a bottom gate structure and includes: a gate 1211 formed on the array substrate 10; a first insulation layer 1212 formed on the gate 1211; an active layer 1213 formed on the first insulation layer 1212 and a source 1214 and a drain 1215 formed on the active layer 1213.

Figure 12:
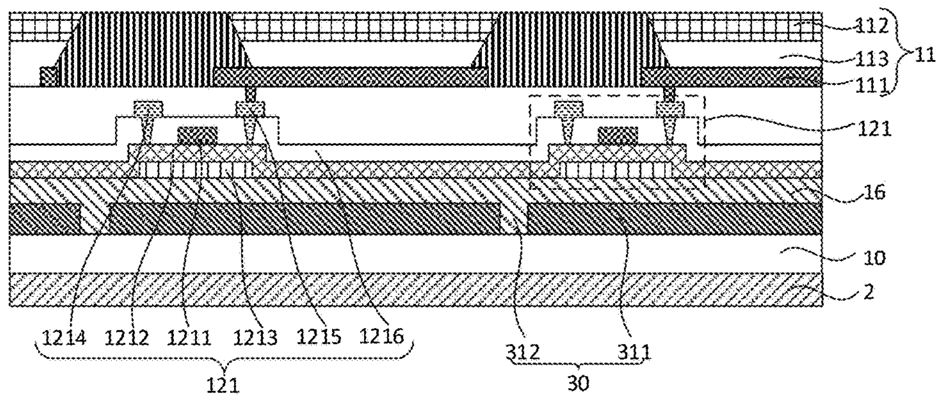
FIG. 12 is a cross sectional structural schematic diagram illustrating another display panel provided by an embodiment of the present disclosure.

FIG. 12 is a cross sectional structural schematic diagram illustrating another display panel provided by an embodiment of the present disclosure. Specifically, referring to FIG. 12, the pixel circuit of the display panel exemplarily includes only one thin film transistor 121. The thin film transistor 121 is a top gate structure and includes: an active layer 1213 formed on the array substrate 10; a first insulation layer 1212 formed on the active layer 1213; a gate 1211 formed on the first insulation layer 1212; a second insulation layer 1216 formed on the gate, and a source 1214 and a drain 1215 formed on the second insulation layer 1216.

It should be noted that if the display panel is an organic light emitting display panel, as shown in FIG. 11 or FIG. 12, the organic light emitting configuration 11 may include a first electrode 111, a second electrode 112 and a light emitting layer 113 arranged between the first electrode 111 and the second electrode 112. During operation, optionally, the first electrode 111 is an anode and the second electrode 112 is a cathode; or the first electrode 111 is the cathode and the second electrode 112 is the anode. If the display panel is a liquid crystal display panel, the light emitting unit may be a sub-pixel unit.

Figure 13A:
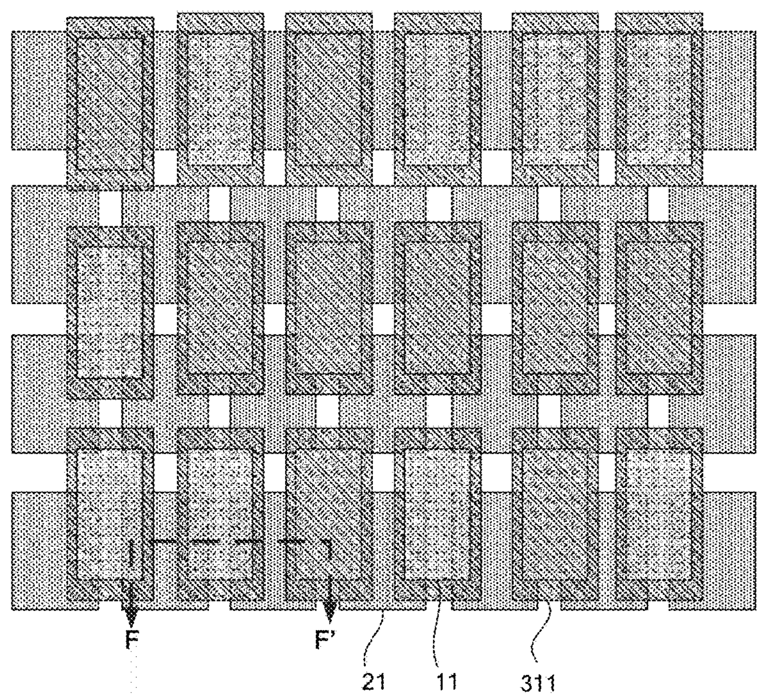
FIG. 13*a* is a top view of structural schematic diagram illustrating another display panel provided by an embodiment of the present disclosure.
Figure 13B:
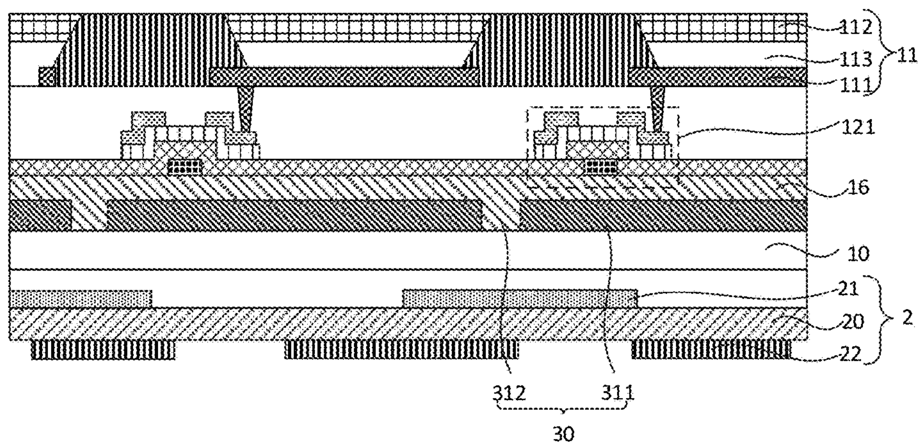
FIG. 13*b* is a cross sectional structural schematic diagram along line FF' in FIG. 13*a;*

FIG. 13*a* is a top view of the structural schematic diagram illustrating another display panel provided by an embodiment of the present disclosure. FIG. 13*b* is a cross sectional structural schematic diagram along line FF' in FIG. 13*a*. Specifically, referring to FIG. 13*a* and FIG. 13*b*, the fingerprint identification module 2 includes a first substrate 20, and a plurality of fingerprint identification units 21 separately arranged on the first substrate 20. The fingerprint identification units 21 are arranged on a side close to the array substrate 10 of the first substrate 20. A perpendicular projection, on the array substrate 10, of the fingerprint identification unit 21 is at least partly located in a perpendicular projection, on the array substrate 10, of the transparent region 312 of the black matrix 30. Through such arrangement, a shielding effect of light rays formed through fingerprint reflection of the user's finger due to the opaque region 311 of the black matrix 30 is reduced when the fingerprint identification is performed according to light emitted from the fingerprint identification light source 22, enabling the light rays formed through the fingerprint reflection of the user's finger to pass through the opening region 312 of the black matrix 30 and to be incident to the fingerprint identification unit 21 as much as possible, and improving the signal-to-noise ratio of the fingerprint identification unit 21.

Optionally, the fingerprint identification light source 22 in the fingerprint identification module 2 is a collimated light source or an area light source. Compared with use of the area light source, the collimated light source can weaken a crosstalk of the light rays reformed through the fingerprint reflection of the finger of the user between different fingerprint sensors, thereby improving the fingerprint identification precision. However, since the collimated light source has a larger thickness than the area light source, the thickness of the display panel will be increased by using the collimated light source.

Figure 14A:
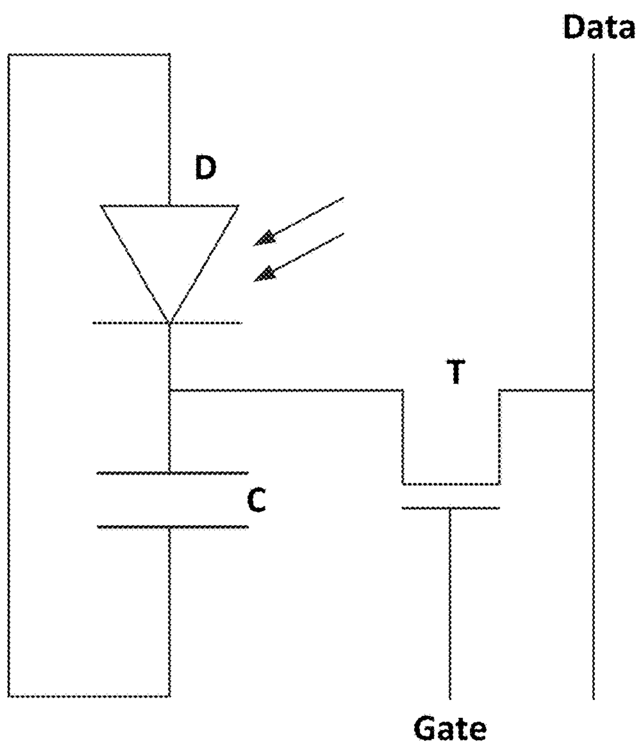
FIG. 14*a* is a circuit diagram illustrating a fingerprint sensor in a fingerprint identification module.
Figure 14B:
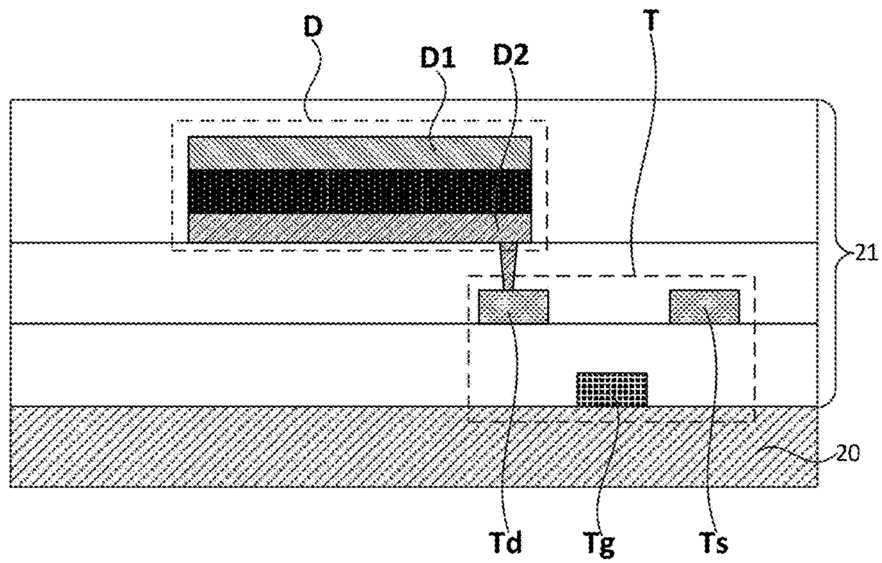
FIG. 14*b* is a cross sectional structural schematic diagram illustrating a fingerprint sensor in a fingerprint identification module.

Exemplarily, the fingerprint identification unit 21 may be a fingerprint sensor. FIG. 14*a* is a circuit diagram illustrating a fingerprint sensor in a fingerprint identification module. FIG. 14*b* is a cross sectional structural schematic diagram illustrating a fingerprint sensor in a fingerprint identification module. Specifically, referring to FIG. 14*a* and FIG. 14*b*, the fingerprint sensor includes a photodiode "D", a storage capacitor "C" (not shown in FIG. 14*b*) and a thin film transistor "T". A positive pole "D1" of the photodiode "D" is electrically connected with a first electrode of the storage capacitor "C". A negative pole "D2" of the photodiode "D" is electrically connected with a second electrode of the storage capacitor "C" and the drain "Td" of the thin film transistor "T". The gate "Tg" of the thin film transistor "T" is electrically connected with a switch control line "Gate". The source "Ts" of the thin film transistor "T" is electrically connected with a signal detection line "Data".

Figure 15:
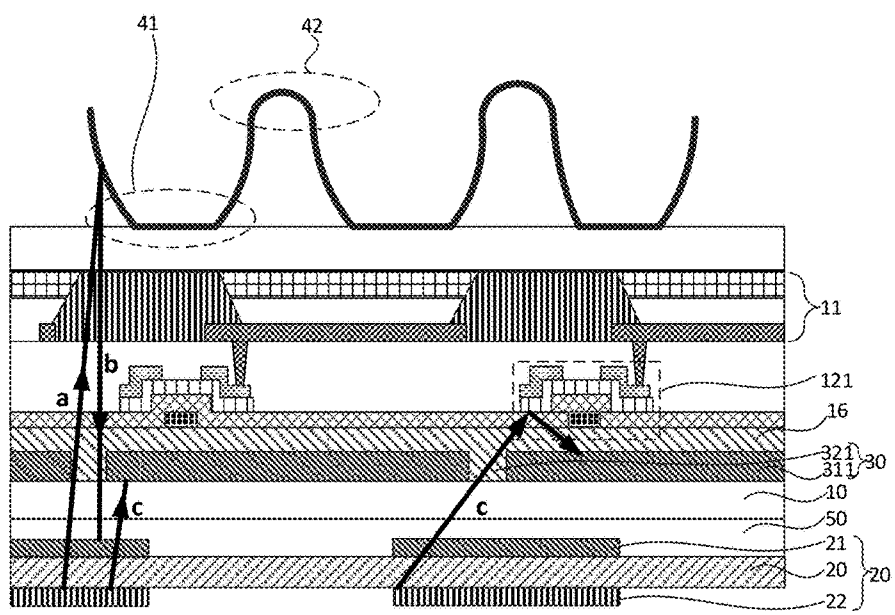
FIG. 15 is a schematic diagram illustrating fingerprint identification operation performed by a fingerprint identification module.

FIG. 15 is a schematic diagram illustrating fingerprint identification operation performed by a fingerprint identification module. A fingerprint identification principle is described in detail below in combination with FIG. 14*a*, FIG. 14*b* and FIG. 15. Referring to FIG. 14*a*, FIG. 14*b* and FIG. 15, in a fingerprint identification phase, a thin film transistor T in the fingerprint identification unit 21 is turned on under the control of a driving chip (not shown in FIG. 14*a*, FIG. 14*b* and FIG. 15) electrically connected with the fingerprint sensor. Assuming that fingerprint identification is performed by using the fingerprint identification light source, when the user presses the finger on the display panel, light emitted from the fingerprint identification light source 22 in the fingerprint identification module 2 is divided into following two parts: light ray "a", which passes through the transparent region 312, irradiates on the finger, and forms reflection light "b" after reflected on a surface of the fingerprint of the finger; and light ray "c", which irradiates on the opaque region 311 of the black matrix 30, and is absorbed by the opaque region 311 of the black matrix 30. The reflection light "b" formed through the fingerprint reflection of the finger is incident to the fingerprint identification unit 21, and is received by a photosensitive diode D of the fingerprint identification unit 21, and then is transformed into a current signal. The firmed current signal is transmitted to the signal detection line "Data" through the thin film transistor T. Since the ridge 41 in the fingerprint of the finger pressed on the display panel comes into contact with a surface of the display panel and the valley 42 does not come into contact with the surface of the display panel, reflectivity of the light rays irradiated on the valley 42 and the ridge 41 of the fingerprint is different. Accordingly, intensities of reflection light "b" formed at the ridge 41 and reflection light "b" formed at the valley 42, which are received by the fingerprint identification unit 21, are different, causing that current signals converted by the reflection light "b" formed at the ridge 41 and the reflection light "b" formed at the valley 42 are different in magnitudes. Fingerprint identification can be performed according to the magnitudes of the current signals.

In the above embodiments, to prevent the relevant displacement between the display module 1 and the fingerprint identification module 2 and ensure that the display panel has high light transmittance, optionally, as shown in FIG. 15, the fingerprint identification module 2 and the array substrate 10 may be bonded through optical adhesive 50. The material of the optical adhesive 50 may be acrylic material and silicon material.

In embodiments of the present disclosure, a black matrix is arranged between the thin film transistor and the fingerprint identification module and the black matrix is configured to include the shading regions and an opening region located between the shading regions, so that the projections, on the first substrate, of the gate, the source and the drain of the thin film transistor are located in a projection, on the first substrate, of the shading region. When the fingerprint identification is performed according to light emitted from the fingerprint identification light source, the light rays emitted from the fingerprint identification module can be shaded by the shading region of the black matrix, thereby reducing reflection light formed on the gate, the source and the drain of the thin film transistor by light rays, reducing a possibility that the reflection light formed on the gate, the source and the drain of the thin film transistor is incident to the fingerprint identification module, and further reducing the noise formed after the part of reflection light is incident to the fingerprint identification module. In addition, the opening region is arranged on the black matrix to allow the light rays emitted from the fingerprint identification module to pass through the opening region and to be irradiated to the finger pressed by the user on the display panel, and allow the reflection light formed through fingerprint reflection of the finger to pass through the opening region. Through such arrangement, the signal-to-noise ratio of the fingerprint identification module is improved, and the fingerprint identification precision of the fingerprint identification module is improved.

Figure 16A:
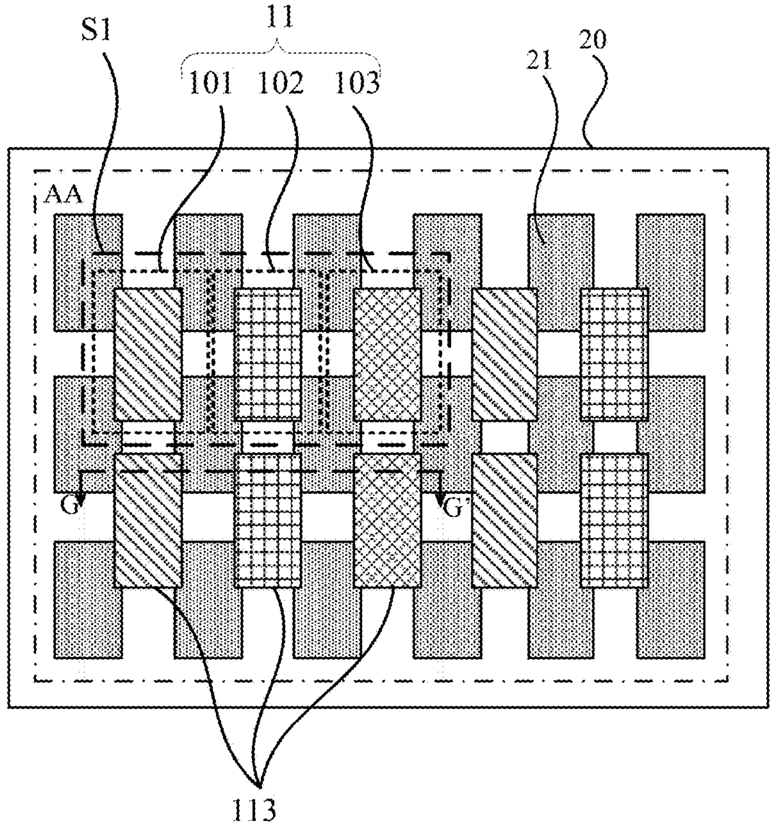
FIG. 16*a* is a top view of structural schematic diagram illustrating a display panel provided by an embodiment of the present disclosure.
Figure 16B:
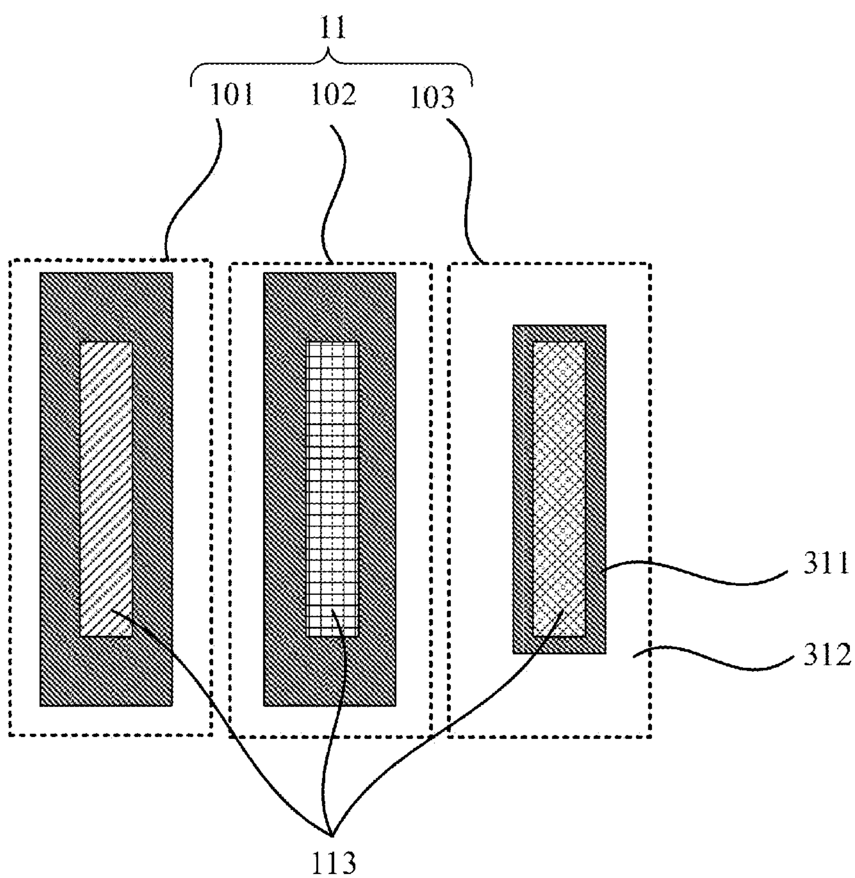
FIG. 16*b* is a local amplified schematic diagram illustrating S1 region in FIG. 1*a;*
Figure 16C:
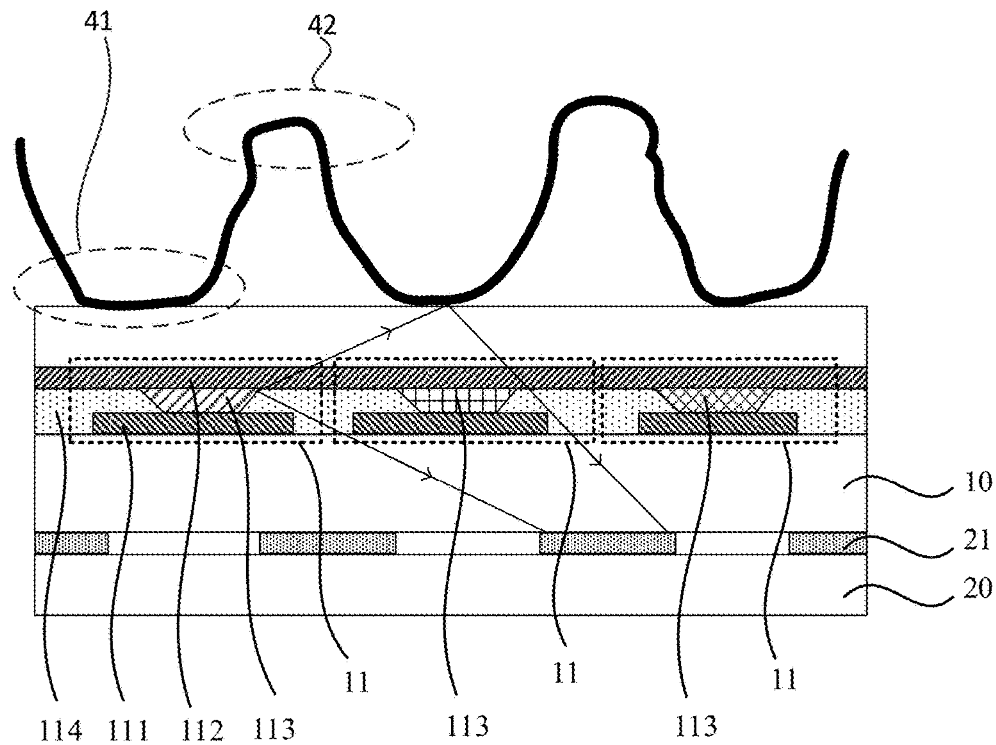
FIG. 16*c* is a cross sectional structural schematic diagram along line GG' in FIG. 1*a;*

FIG. 16*a* is a top view of the structural schematic diagram illustrating a display panel provided by an embodiment of the present disclosure. FIG. 16*b* is a local amplified schematic diagram illustrating S1 region in FIG. 16*a*. FIG. 16*c* is a cross sectional structural schematic diagram along line GG' in FIG. 16*a*. With reference to FIG. 16*a*, FIG. 16*b* and FIG. 16*c*, assuming that the fingerprint is performed according to light rays emitted from the organic light emitting configuration 11, the display panel provided in embodiments of the present disclosure includes an array substrate 10, a plurality of organic light emitting configurations 11 and at least one fingerprint identification unit 21. The plurality of organic light emitting configurations 11 are arranged on the array substrate 10. The fingerprint identification unit 21 is located in a display region 11 and arranged at a side close to the array substrate 10 of the organic light emitting configurations 11. The fingerprint identification unit 21 is configured to perform fingerprint identification according to light rays reflected, through a touch body (such as a finger), on the fingerprint identification unit 21. Each organic light emitting configuration 11 includes a red organic light emitting configuration 101, a green organic light emitting configuration 102 and a blue organic light emitting configuration 103. The red organic light emitting configuration 101 and/or the green organic light emitting configuration 102 are configured to emit light and are served as the light sources of the fingerprint identification unit 21. Compared with the blue organic light emitting configuration 103, the red organic light emitting configuration 101 and/or the green organic light emitting configuration 102 served as the light source of the fingerprint identification unit 21 has a smaller transparent area at a side opposite to the display side of the display panel. It should be noted that the number of the organic light emitting configurations 11 and the arrangement of the red organic light emitting configuration 101, the green organic light emitting configuration 102 and the blue organic light emitting configuration 103 in the organic light emitting configurations 11 are not limited by an embodiment of the present disclosure.

Exemplarily, with reference to FIG. 16*b* and FIG. 16*c*, each organic light emitting configuration 11 successively includes a first electrode 111, a light emitting layer 113 and a second electrode 112 along a direction in which the organic light emitting configuration 11 faces away from the array substrate 10. Each organic light emitting configuration 11 includes a red organic light emitting configuration 101, a green organic light emitting configuration 102 and a blue organic light emitting configuration 103. Each organic light emitting configuration 11 includes a light emitting layer 113. A transparent region 312 and an opaque region 311 are arranged on the light emitting layer 113 in a direction facing away from the light exiting side of the display panel. For a top emitting type display panel, the light exiting side of the display panel is a direction in which the organic light emitting configuration 11 faces away from the array substrate 10. The light emitting layer 113 may include a first auxiliary functional layer, a light emitting material layer and a second auxiliary functional layer. The first auxiliary functional layer is a hole type auxiliary functional layer, and may have a multilayer structure, e.g., including one or more of a hole injection layer, a hole transportation layer and an electron blocking layer. The second auxiliary functional layer is an electronic type auxiliary functional layer and may have a multilayer structure, e.g., including one or more of an electron transportation layer, an electron injection layer, and a hole blocking layer. When being applied an external electric field, electrons and holes are injected into the light emitting material layer in the light emitting layer 113 from the second electrode 112 and the first electrode 111 respectively and are recombined to generate an exciton. The exciton is driven by the external electric field to migrate, energy is transferred to light emitting molecule in the light emitting material layer and the electrons are excited to jump from a ground state to an excitation state. The excited state energy is released in a radiative jump manner, and thus the light rays are generated. In the present embodiment, the first electrode 111 is configured as an anode, and the second electrode 112 is configured as a cathode. In other embodiments, the first electrode 111 can also be set as the cathode and the second electrode 112 is the anode. Embodiments of the present disclosure do not limit this.

The display panel provided in embodiments of the present disclosure includes a plurality of organic light emitting configurations disposed on the array substrate, and at least one fingerprint identification unit. Each organic light emitting configuration includes a red organic light emitting configuration, a green organic light emitting configuration and a blue organic light emitting configuration. When fingerprint identification is performed according to the light rays emitted from the organic light emitting configurations, in a light emitting display phase, the red organic light emitting configuration, the green organic light emitting configuration and the blue organic light emitting configuration emit light according to preset modes. In a fingerprint identification phase, the red organic light emitting configuration and/or the green organic light emitting configuration are configured to emit light and are served as light sources of the fingerprint identification unit because the light rays emitted from the blue organic light emitting configuration have a lower transmittance. This is because that the light rays emitted from the blue organic light emitting configuration have a shorter wavelength while various film (an organic insulation layer, an inorganic insulation layer, a polarizer and the like) in the display panel has a stronger absorption effect on the light rays with the shorter wavelength. Moreover, compared with the blue organic light emitting configuration, the red organic light emitting configuration and/or the green organic light emitting configuration as the light source of the fingerprint identification unit is set to have a smaller transparent area towards a side opposite to the display side of the display panel. Since the organic light emitting configurations as the light sources have a smaller transparent area, stray light directly irradiated on the fingerprint identification unit without being reflected through the touch body (such as the finger) is reduced. Only light rays reflected through the touch body is carried with the fingerprint information, while the light rays (stray light) directly irradiated on the fingerprint identification unit without being reflected through the touch body are not carried with the fingerprint information. Therefore, in embodiments of the present disclosure, noise in fingerprint detection is reduced by reducing the stray light, and the fingerprint identification precision is improved.

Optionally, with reference to FIG. 16*c*, the display panel further includes a first substrate 20. The first substrate 20 is arranged at one side, facing away from the organic light emitting configurations 11, of the array substrate 10. The fingerprint identification unit 21 is arranged between the array substrate 10 and the first substrate 20. The fingerprint identification unit 21 and the first substrate 20 may be used as a part of the fingerprint identification module. The fingerprint identification module may further include some metal connection wires and an IC driving circuit (not shown in the drawings).

Optionally, with reference to FIG. 16*b* and FIG. 16*c*, each organic light emitting configuration 11 successively includes the first electrode 111, the light emitting layer 113 and the second electrode 112 along a direction in which the organic light emitting configuration 11 faces away from the array substrate 10. The first electrode 111 is a reflection electrode. For example, the reflection electrode is configured to include an indium tin oxide conductive film, a reflection electrode layer (Ag) and another indium tin oxide conductive film successively arranged. The indium tin oxide conductive film is a high-work-function material and is beneficial to hole injection. The light emitting layer 113 of the red organic light emitting configuration 101, the light emitting layer 111 of the green organic light emitting configuration 102 and the light emitting layer 113 of the blue organic light emitting configuration 103 are further spaced by a pixel definition layer 114. As shown in FIG. 16*b* and FIG. 16*c*, both the red organic light emitting configuration 101 and the green organic light emitting configuration 102 are exemplarily served as the light sources for fingerprint identification in embodiments of the present disclosure. The area of the first electrode 111 of the red organic light emitting configuration 101 and the green organic light emitting configuration 102 is greater than the area of the first electrode 111 of the blue organic light emitting configuration 103. The light rays emitted from the light emitting layer 113 in the organic light emitting configuration 11 to the side of the array substrate 10 are blocked by the first electrode 111 arranged between the light emitting layer 113 and the fingerprint identification unit 21. Moreover, the reflection electrodes of the red organic light emitting configuration 101 and the green organic light emitting configuration 102 as the light sources of the fingerprint identification unit 21 are extended relative to the existing art. Therefore, the stray light to be irradiated on the fingerprint identification unit 21 is blocked, and the fingerprint identification precision is improved. In other words, the area of the reflection electrode in the blue organic light emitting configuration 103 is configured to be unchanged, and the areas of the reflection electrodes in the red organic light emitting configuration 101 and the green organic light emitting configuration 102 are increased based on the existing art, so as to block the stray light. In addition, the reflection electrode is adjacent to or in contact with the light emitting functional layer, and the light rays emitted from the light emitting functional layer to the side of the array substrate are close to an edge of the reflection electrode. Therefore, the reflection electrode can be configured to extend by a certain distance to block the light rays emitted from the light emitting functional layer from being directly irradiated on the fingerprint identification unit. Moreover, when the reflection electrode is extended to a certain degree, the stray light irradiated on the fingerprint identification unit can be completely blocked, thereby greatly improving the fingerprint identification precision.

Optionally, with reference to FIG. 16*b* and FIG. 16*c*, when fingerprint identification is performed according to the light rays emitted from the organic light emitting configurations, a ratio of the area of the first electrode 111 of the organic light emitting configurations 11 served as the light sources of the fingerprint identification unit to the area of the light emitting layer 113 is in a range of 1.2 to 6, and a ratio of the area of the first electrode 111 of the organic light emitting configurations 11 not served as the light sources of the fingerprint identification unit 21 to the area of the light emitting layer 113 is in a range of 1 to 1.2. Exemplarily, with reference to FIG. 16*b* and FIG. 16*c*, the red organic light emitting configuration 101 and the green organic light emitting configuration 102 are served as the light sources of the fingerprint identification unit, and the opaque region 311 in FIG. 16*b* is a perpendicular projection, on the array substrate 10, of the first electrode 111 of the organic light emitting configuration 11. It can be seen that, compared with the blue organic light emitting configuration 103, the ratio of the area of the opaque region 311 (the area of the first electrode) to the area of the light emitting layer 113 is larger in the red organic light emitting configuration 101 and the green organic light emitting configuration 102. When the ratio of the area of the first electrode to the area of the light emitting functional layer is set to be in a range of 1.2 to 6 in the organic light emitting configurations served as the light sources of the fingerprint identification unit, the first electrode can effectively prevent the light rays emitted from the light emitting functional layer from being directly irradiated on the fingerprint identification unit, thereby effectively preventing the stray light, reducing noise in the fingerprint detection and improving the fingerprint identification precision. It can be understood that the larger the scope of the ratio of the area of the first electrode to the area of the light emitting functional layer in the organic light emitting configurations as the light sources of the fingerprint identification unit is, the more effective the blocking of the first electrode for the stray light is. When the ratio of the area of the first electrode to the area of the light emitting functional layer is 6 in the organic light emitting configurations as the light sources of the fingerprint identification unit, most of the stray light is exactly blocked by the first electrode, thereby greatly improving the fingerprint identification precision.

Figure 16D:
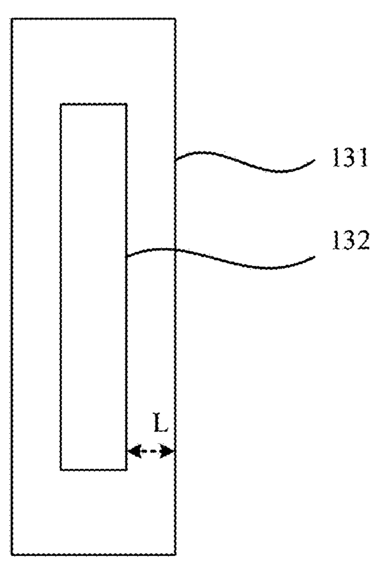
FIG. 16*d* is a schematic diagram illustrating a distance range between a first closed coil and a second closed coil.

Optionally, with reference to FIG. 16*c* to FIG. 16*d*, as for the organic light emitting configuration 11 served as the light source of the fingerprint identification unit 21, the perpendicular projection, on the array substrate 10, of the border of the first electrode 111 forms a first closed coil 131, and the perpendicular projection, on the array substrate 10, of the border of the light emitting layer 113 forms a second closed coil 132. FIG. 16*d* is a schematic diagram illustrating a range of the distance between the first closed coil and the second closed coil. With reference to FIG. 16*d*, the second closed coil 132 is encircled by the first closed coil 131. With respect to any point on the first closed coil 131, there exists a corresponding point, a distance between which and the point on the first closed coil 131 is the shortest distance L, on the second closed coil 132. The range of the distance between the first closed coil 131 and the second closed coil 132 is a set of the shortest distances L for all points on the first closed coil 131. The range of the distance between the first closed coil 131 and the second closed coil 132 is 3 μm to 30 μm. The range of the distance between the first closed coil 131 and the second closed coil 132 represents an extension degree of the first electrode within a plane of the first electrode in any direction. When the range of the distance between the first closed coil 131 and the second closed coil 132 is 3 μm to 30 μm, the first electrode can effectively block the stray light, and the fingerprint identification precision is improved.

Figure 16E:
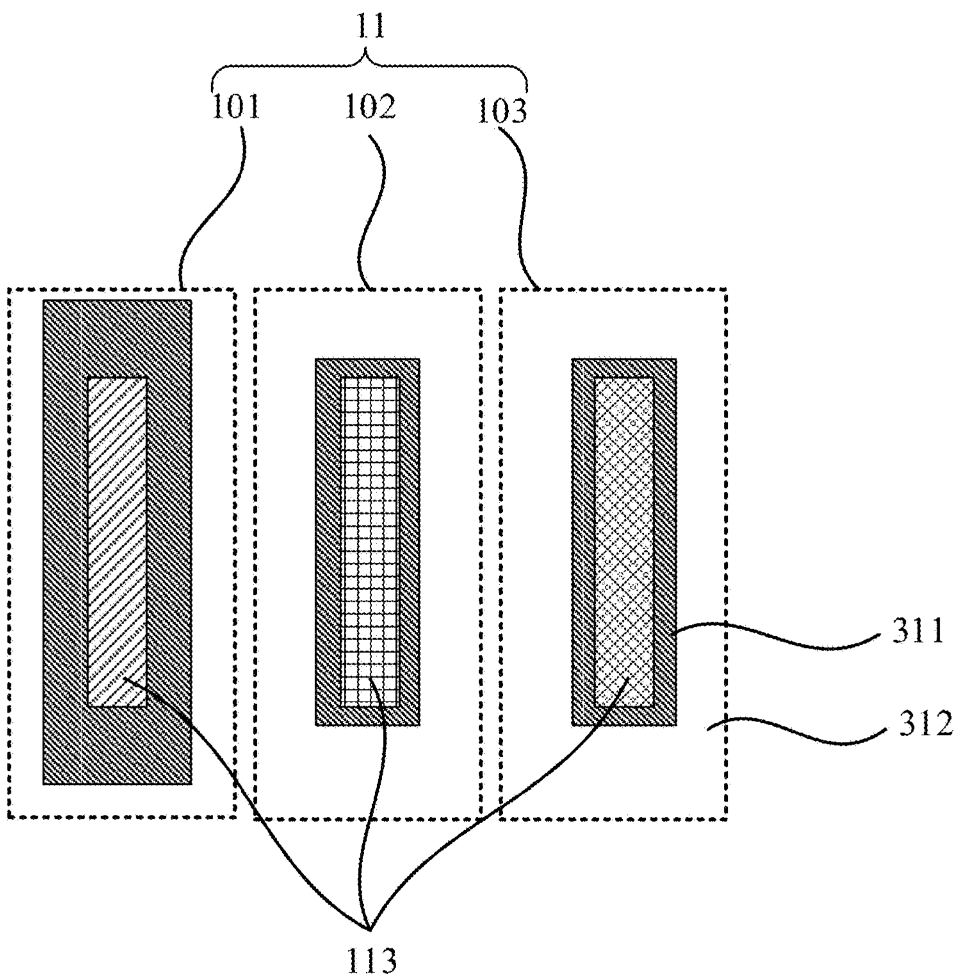
FIG. 16*e* is a local amplified schematic diagram illustrating another S1 region provided by an embodiment of the present disclosure.

FIG. 16*e* is a local amplified schematic diagram illustrating another S1 region provided by an embodiment of the present disclosure. As shown in FIG. 16*e*, compared with the transparent area of the blue organic light emitting configuration 103 towards a side opposite to the display side of the display panel, the transparent area of the red organic light emitting configuration 101 served as the light source of the fingerprint identification unit towards the side opposite to the display side of the display panel is smaller; and compared with the transparent area of the green organic light emitting configuration 102 towards the side opposite to the display side of the display panel, the transparent area of the red organic light emitting configuration 101 served as the light source of the fingerprint identification unit towards the side opposite to the display side of the display panel is smaller. Since only the red organic light emitting configuration is served as the light source for fingerprint identification, it is only required to block the light rays emitted from the light emitting functional layer in the red organic light emitting configuration to the side opposite to the display side of the display panel. For example, only the first electrode in the red organic light emitting configuration needs to be designed to be extended, and no additional configuration is required for the green organic light emitting configuration and the blue organic light emitting configuration. Through such arrangement, not only the fingerprint identification precision is ensured, but also a sufficient transparent area, through which signal light reflected through the touch body (such as the finger) passes, is ensured, so that the intensity of the signal light detected on the fingerprint identification unit is improved. In addition, a working voltage of the red organic light emitting unit may be properly increased to improve the intensity of the light emitted from the light source, so as to improve the intensity of the signal light detected on the fingerprint identification unit. In other embodiments, optionally, only the green organic light emitting configuration is served as the light source for fingerprint identification. In this case, compared with the transparent area of the blue organic light emitting configuration towards the side opposite to the display side of the display panel, the transparent area of the green organic light emitting configuration towards the side opposite to the display side of the display panel is smaller; and compared with the transparent area of the red organic light emitting configuration towards the side opposite to the display side of the display panel, the transparent area of the green organic light emitting configuration towards the side opposite to the display side of the display panel is smaller.

Figure 17:
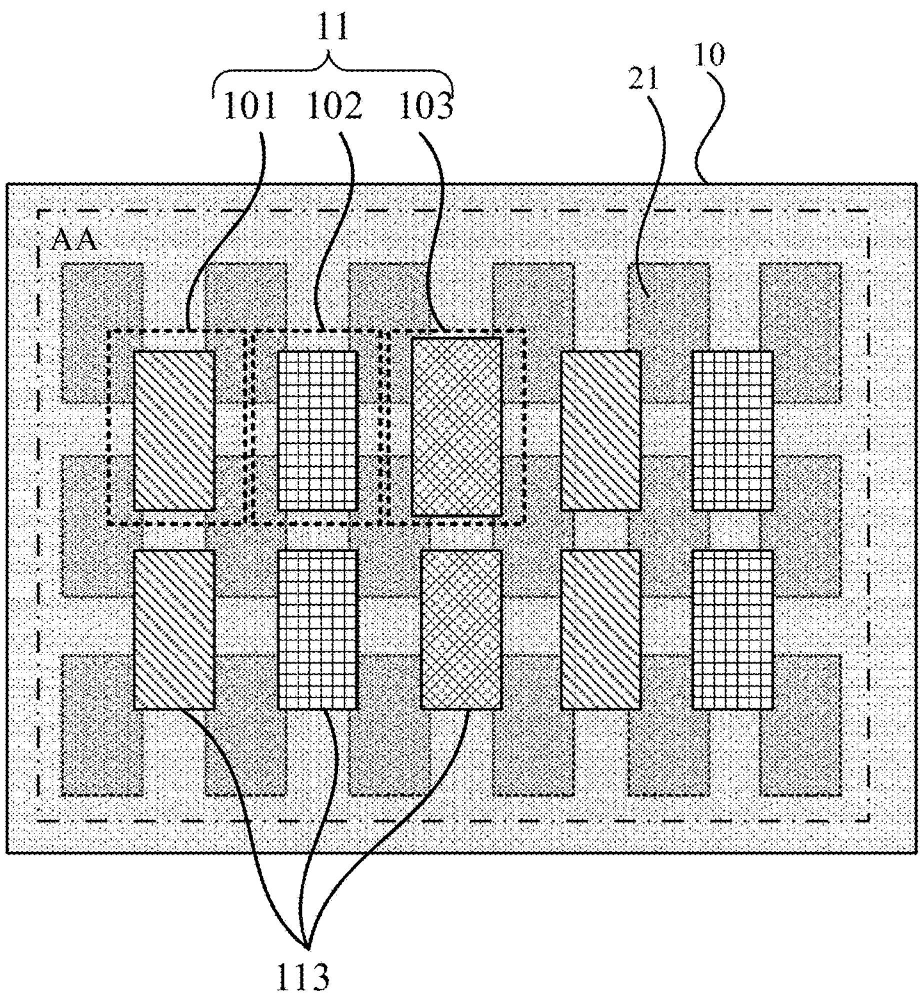
FIG. 17 is a top view of structural schematic diagram illustrating another display panel provided by an embodiment of the present disclosure.

FIG. 17 is a top view of structural schematic diagram illustrating another display panel provided by an embodiment of the present disclosure. Optionally, as shown in FIG. 17, when fingerprint identification is performed according to the light rays emitted from the organic light emitting configuration 11, the area of the light emitting layer of the blue organic light emitting configuration 103 is greater than the area of light emitting layer of the red organic light emitting configuration 101; and the area of the light emitting layer of the blue organic light emitting configuration 103 is greater than the area of light emitting layer of the green organic light emitting configuration 102. Since the material of the light emitting layer of the blue organic light emitting configuration has a shorter life than the material of light emitting layer of the red organic light emitting configuration and the green organic light emitting configuration, the light emitting layer of the blue organic light emitting configuration is designed to have a larger area. Therefore, the light emitting layer of the blue organic light emitting configuration is operated at a low voltage. Exemplarily, for example, the working voltage of the light emitting layers of the red organic light emitting configuration and the green organic light emitting configuration is set as 3V, and the working voltage of the light emitting layer of the blue organic light emitting configuration is set as 2V to increase the working life of the blue organic light emitting configuration. In this way, a balance in the working lives of the red organic light emitting configuration, the green organic light emitting configuration and the blue organic light emitting configuration is achieved, thereby prolonging the working life of the entire display panel.

Figure 18:
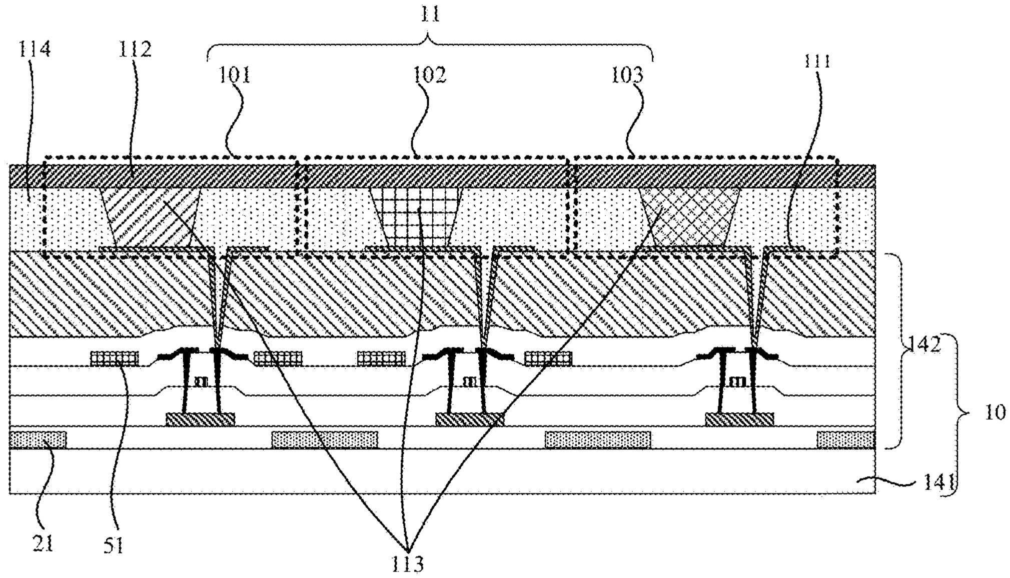
FIG. 18 is a cross sectional structural schematic diagram illustrating another display panel provided by an embodiment of the present disclosure.

FIG. 18 is a cross sectional structural schematic diagram illustrating another display panel provided by an embodiment of the present disclosure. Optionally, with reference to FIG. 18, when fingerprint identification is performed according to the light rays emitted from the organic light emitting configuration 11, the array substrate 10 further includes a plurality of shading pads 51. The shading pads 51 are arranged between the organic light emitting configurations 11 served as the light sources of the fingerprint identification unit 21, and the fingerprint identification units 21. Each organic light emitting configuration 11 successively includes a first electrode 111, a light emitting layer 113 and a second electrode 112 along a direction in which the organic light emitting configuration 11 faces away from the array substrate 10. The first electrode 111 is a reflection electrode. The area of a combination perpendicular projection, on the array substrate 10, of the first electrode 111 of the organic light emitting configurations 11 as the light sources of the fingerprint identification unit 21 and the shading pad 51 are greater than the area of the perpendicular projection, on the array substrate 10, of the first electrode 111 of the organic light emitting configurations 11 not served as the light sources of the fingerprint identification unit 21. The combination perpendicular projection, on the array substrate 10, of the first electrode 111 and the shading pad 51 is a union of the perpendicular projection, on the array substrate 10, of the first electrode 111 and the perpendicular projection, on the array substrate 10, of the shading pad 51. Specifically, if A and B are sets, then a union of A and B is a set including all elements of A and all elements of B and excluding other elements.

Optionally, with reference to FIG. 18, the perpendicular projection, on the array substrate 10, of the border of the first electrode 111 of the organic light emitting configurations 11 as the light sources of the fingerprint identification unit 21 is located in the perpendicular projection, on the array substrate 10, of the shading pad 51. Such arrangement is equivalent to extension of the reflection electrode. That is, such arrangement is equivalent to keeping the area of the reflection electrode in the blue organic light emitting configuration 103 unchanged and increasing the area of the reflection electrode in the red organic light emitting configuration 101 and/or the green organic light emitting configuration 102 compared with the existing art, so as to block the stray light. Embodiments of the present disclosure can effectively prevent the stray light from being irradiated on the fingerprint identification unit.

Optionally, with reference to FIG. 18, the array substrate 10 includes a second substrate 141 and the plurality of pixel driving circuits 142 arranged on the second substrate 141. Each pixel driving circuit 142 includes the data line, the scanning line and the capacitor metal plate (not shown in FIG. 18). The shading pads 51 are arranged on the same layer as the data line, the scanning line or the capacitor metal plate, thereby omitting a technological process. The shading pads can be made without adding a metal layer in the display panel, thereby increasing manufacturing efficiency and saving the production cost.

The shading pads 51 may be made of metal materials, or non-metal materials with a shading effect. The shading pads are used to prevent the stray light from being irradiated on the fingerprint identification unit in embodiments of the present disclosure, so as to improve the fingerprint identification precision. It should be noted that the above embodiments can be combined with each other to improve the fingerprint identification precision. For example, the reflection electrode of the organic light emitting configuration as the light source is extended, meanwhile the pixel driving circuits are designed to block a part of the stray light. Optionally, the reflection electrode of the organic light emitting configuration as the light source is extended, meanwhile the shading pads are designed to block a part of the stray light. Optionally, the shading pads are configured to block a part of the stray light, meanwhile the pixel driving circuits are designed to block a part of the stray light. Optionally, the reflection electrode of the organic light emitting configuration as the light source is extended, meanwhile the pixel driving circuits are designed to block a part of the stray light, and the shading pads are configured to block a part of the stray light.

Embodiments of the present disclosure further provide a display panel including a display module, a fingerprint identification module and a light source. The display module includes an array substrate and a polarizer disposed on the array substrate, and a light exiting side of the display module is located at a side, facing away from the array substrate, of the polarizer. The fingerprint identification module is arranged at a side, facing away from the polarizer, of the array substrate, and includes a fingerprint identification unit and a second polarizer located at a side, close to the display module, of the fingerprint identification unit. The light source is arranged at a side, facing away from the light exiting side of the display module, of the polarizer. The fingerprint identification unit is configured to perform fingerprint identification according to fingerprint signal light formed by light rays emitted from the light source and reflected, through the touch body, on the fingerprint identification unit. The polarizer and the second polarizer cooperate so that the fingerprint signal light passes through the polarizer and the second polarizer without light intensity loss. The second polarizer is configured to reduce the light intensity of the fingerprint noise light, and the fingerprint noise light is light other than the fingerprint signal light.

In embodiments of the present disclosure, the polarizer is arranged at the side, close to the light exiting side of the display module, of the array substrate, the fingerprint identification module is arranged at the side, facing away from the polarizer, of the array substrate, and the fingerprint identification module includes the fingerprint identification unit and the second polarizer arranged at the side close to the display module of the fingerprint identification unit. In the fingerprint identification phase, light emitted from the light source at the side, facing away from the light exiting side of the display module, of the polarizer is reflected through the touch body on a touch display screen and then forms the fingerprint signal light. At this moment, the polarizer and the second polarizer cooperate so that the fingerprint signal light passes through the polarizer and the second polarizer without light intensity loss. Meanwhile, before the light (fingerprint noise light) not reflected by the touch body reaches the fingerprint identification unit, the second polarizer can at least reduce the light intensity of the fingerprint noise light. Thus, interference of the fingerprint noise light can be decreased, a signal-to-noise ratio can be increased and then the fingerprint identification precision of the fingerprint identification module is improved.

In embodiments of the present disclosure, the fingerprint noise light includes partial light leaked from the organic light emitting configurations in the display panel towards the side of the fingerprint identification module, and/or a portion of light emitted by a plug-in light source and reflected by metal (such as the gate, the source and the drain of the thin film transistor, as well as a metal wire) in the display module.

As for a part of light leaked from the side of the fingerprint identification module by the organic light emitting configurations in the display module, the second polarizer may be a linear polarizer or a circular polarizer, so as to reduce the light intensity of this part of the fingerprint noise light by a half. As for the light reflected by the metal in the display module, the second polarizer may be a circular polarizer, so as to eliminate this part of fingerprint noise light completely. Optionally, when the second polarizer is the linear polarizer, the polarizer should be the linear polarizer having a consistent polarization direction with the second polarizer, so as to enable the fingerprint signal light to pass through the polarizer and the second polarizer without any light intensity loss;

and when the second polarizer is the circular polarizer, the polarizer shall be the circular polarizer matched with the second polarizer, so as to enable the fingerprint signal light to pass through the polarizer and the second polarizer without any light intensity loss.

Figure 19:
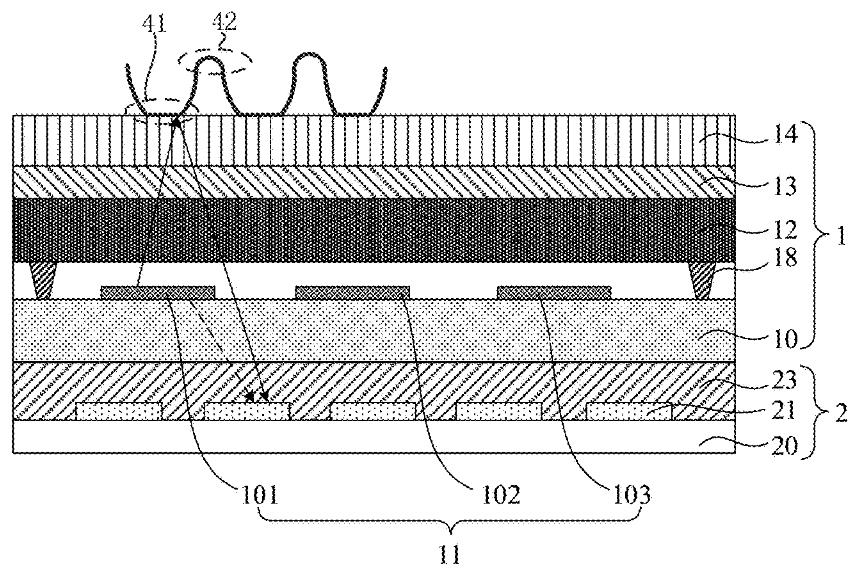
FIG. 19 is a cross sectional structural schematic diagram illustrating another display panel provided by an embodiment of the present disclosure.

Exemplarily, FIG. 19 is a schematic structural diagram illustrating a display panel provided by an embodiment of the present disclosure. As shown in FIG. 19, the display panel in the present embodiment includes: a display module 1 including an array substrate 10 and a polarizer 13 arranged on the array substrate 10, and a light exiting side of the display module 1 is arranged at a side, facing away from the array substrate 10, of the polarizer 13; and a fingerprint identification module 2. The fingerprint identification module 2 is arranged at a side, facing away from the polarizer 13, of the array substrate 10, and includes a fingerprint identification unit 21 and a second polarizer 23 arranged at a side, close to the display module 1, of the fingerprint identification unit 21. The fingerprint identification unit 21 is configured to perform fingerprint identification according to a fingerprint signal light formed by the light rays which are emitted from the light sources and reflected, through the touch body, on the fingerprint identification unit. The display module 1 further includes an organic light emitting configuration 12 which is arranged between the array substrate 10 and the polarizer 13 and configured to generate light for displaying images. Optionally, as shown in FIG. 19, the organic light emitting configuration may include a red organic light emitting configuration 101, a green organic light emitting configuration 102 and a blue organic light emitting configuration 103.

Optionally, fingerprint identification is performed according to the light rays emitted from the organic light emitting configurations 11. Exemplarily, the plurality of organic light emitting configurations 11 and the plurality of fingerprint identification units 21 are both arranged in an array. The fingerprint identification units 21 are arranged correspondingly to the organic light emitting configurations 11. Beams of fingerprint signal light generated by one organic light emitting configuration 11 as the light source may be received by one or more fingerprint identification units 21 corresponding to the organic light emitting configuration 11.

Considering that the above organic light emitting configuration 11 is used as not only the light source for displaying images, but also the light source for fingerprint identification, whether in the display phase or in the fingerprint identification phase, the organic light emitting configuration 11 needs to emit light; or in the display phase, light emitting driving signals are input into all the organic light emitting configurations; and in the fingerprint identification phase, the light emitting driving signals are input into a part of organic light emitting configurations. Therefore, based on the above solution, the display module 1 in the present embodiment further includes a first display driving circuit (not shown in the figure) configured to output the light emitting driving signals for driving at least part of the organic light emitting configurations in the fingerprint identification phase, so as to provide light sources for the fingerprint identification module 2.

Exemplarily, in the fingerprint identification phase, the first display driving circuit outputs driving signals for driving the red organic light emitting unit and/or the green organic light emitting unit to emit light based on the following reasons: the light rays emitted from the blue organic light emitting unit have a shorter wavelength while each film (such as the organic insulation layer, the inorganic insulation layer, the polarizer and the like) in the display panel has a stronger absorption effect on the light rays with the shorter wavelength, and thus the light rays emitted from the blue organic light emitting unit have a lower transmittance and are easy to be absorbed by the touch display panel; and the material of the light emitting functional layer of the blue organic light emitting unit has a shorter life than the material of light emitting functional layer of the red organic light emitting unit and the blue organic light emitting unit. Optionally, the display panel in the present embodiment further includes a touch functional layer. The structure and position of the touch functional layer are not limited herein as long as a touch position on the screen can be detected. After the finger's touch position on the screen is detected, in the fingerprint identification phase, the first display driving circuit outputs driving signals for driving the organic light emitting units in regions corresponding to the finger's touch position on the screen to emit light.

Optionally, the polarizer 13 in the present embodiment includes a linear polarizer; the second polarizer 23 includes a second linear polarizer; and polarization directions of the first linear polarizer and the second linear polarizer are consistent.

As shown in FIG. 19, the solid arrow indicates light rays emitted from the organic light emitting configuration 11 to the light exiting side and light rays of the fingerprint signal light formed after reflected through the touch body, and the dotted arrow indicates light rays leaked from the organic light emitting configuration 11 to the fingerprint identification module 2. Light emitted from the organic light emitting configuration 11, such as the red organic light emitting configuration 101, is firstly changed to linearly polarized light through the polarizer 13. The linearly polarized light, after being reflected through the touch body, is still linearly polarized light (fingerprint signal light at this moment), and the polarization direction is not changed. Then, the fingerprint signal light passes through the polarizer 13 again without any light intensity loss. Since the polarization direction of the second polarizer 23 and the polarization direction of the polarizer 13 are consistent, when the fingerprint signal light passes through the second polarizer 23, the fingerprint signal light passes through the second polarizer 23 without any light intensity loss, and reaches the fingerprint identification unit 21. However, the light leaked from the red organic light emitting configuration 101 is evenly distributed in each polarization direction, and is changed to light having only one polarization direction after passing through the second polarizer 23. As a result, half of the intensity of the light is lost. Therefore, when the light leaked from the organic light emitting configuration reaches the fingerprint identification unit 21, the light intensity is greatly reduced. In conclusion, the light intensity of the fingerprint signal light is not changed, while the light intensity of the fingerprint noise light is relatively reduced. Therefore, a signal-to-noise ratio of the fingerprint identification module 2 is increased, and thus the fingerprint identification precision of the fingerprint identification module 2 is improved.

Optionally, the display panel in the present embodiment is a rigid display panel. Specifically, as shown in FIG. 19, the array substrate 10 is a first glass substrate. The display module 1 further includes an encapsulation layer 12. The encapsulation layer 12 may also adopt a glass substrate. The organic light emitting configuration 11 is arranged between the first glass substrate 10 and the encapsulation layer 12. The first glass substrate 10 and the encapsulation layer 12 are supported by supporting pillars 18. An air gap exists between the first glass substrate 10 and the encapsulation layer 12. Optionally, a thickness of the air gap is 4 μm. The display panel further includes a cover plate glass 14. The cover plate glass 14 may be attached to a surface at a sides facing away from the organic light emitting configuration 11*s* of the polarizer 13 through a liquid optical adhesive.

Optionally, a thickness of the display module is 1410 μm. In the present embodiment, the fingerprint identification module 2 further includes a first substrate 20. The fingerprint identification unit 21 is arranged on a surface at one side close to the display module 1 of the first substrate 20. Thus, the fingerprint identification unit 21 can be directly made on the first substrate 20, so that not only arrangement of the fingerprint identification unit 21 is facilitated, but also the first substrate 20 performs a protective effect on the fingerprint identification unit 21. In addition, the second polarizer 23 is attached to the array substrate 10 through an optical adhesive layer (not shown in the figure), to attach the display module 1 and the fingerprint identification module 2 together to form the display panel.

In addition, the first polarizer 13 in embodiments of the present disclosure may include a first quarter-wave plate and a third linear polarizer which are stacked. The first quarter-wave plate is arranged at a side close to the organic light emitting configuration of the third linear polarizer. The second polarizer 23 may include a second quarter-wave plate and a fourth linear polarizer which are stacked. The second quarter-wave plate is arranged at a side close to the organic light emitting configuration of the fourth linear polarizer. The first quarter-wave plate and the second quarter-wave plate are the same in materials and thicknesses.

Facing a transmission direction of the fingerprint signal light, by taking an anticlockwise direction as a forward direction, an included angle between a direction of an optical axis of the first quarter-wave plate and the polarization direction of the third linear polarizer is 45°; and an included angle between a direction of an optical axis of the second quarter-wave plate and the polarization direction of the fourth linear polarizer is −45°. Or, an included angle between a direction of an optical axis of the first quarter-wave plate and the polarization direction of the third linear polarizer is −45°; and an included angle between a direction of an optical axis of the second quarter-wave plate and the polarization direction of the fourth linear polarizer is 45°. Thus, the first polarizer and the second polarizer are both circular polarizers.

Figure 20A:
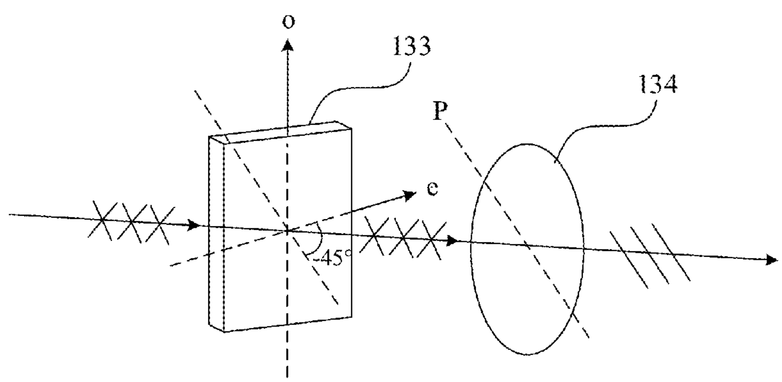
FIG. 20*a* is a schematic diagram illustrating an optical path prior to light emitted from organic light emitting configurations is reflected by a touch body according to an embodiment of the present disclosure.
Figure 20B:
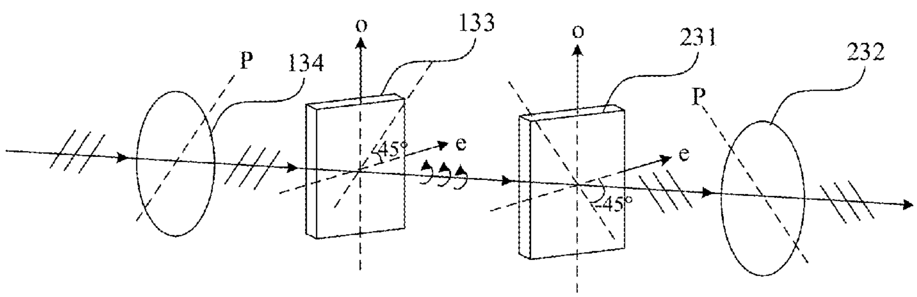
FIG. 20*b* is a schematic diagram illustrating an optical path after light emitted from organic light emitting configurations is reflected by a touch body according to an embodiment of the present disclosure.

Exemplarily, description is made by taking the following situation as an example: facing a transmission direction of the fingerprint signal light, by taking an anticlockwise direction as a forward direction, an included angle between a direction of an optical axis of the first quarter-wave plate and the polarization direction of the third linear polarizer is 45°; and an included angle between a direction of an optical axis of the second quarter-wave plate and the polarization direction of the fourth linear polarizer is −45°. In this case, the first quarter-wave plate and the second quarter-wave plate are made of calcite, and an "e" axis of the first quarter-wave plate and the second quarter-wave plate is served as an optical axis. By continuing to refer to FIG. 19, in the fingerprint identification phase, as shown in FIG. 20*a*, before the light emitted from the organic light emitting configuration 11 is reflected by the touch body, facing a transmission direction of the light, by taking an anticlockwise direction as the forward direction, an included angle between a direction of the "e" axis of the first quarter-wave plate 133 and the polarization direction P of the third linear polarizer 134 is −45°. Natural light emitted from the organic light emitting configuration 11 is still natural light after passing through the first quarter-wave plate 133, and after passing through the third linear polarizer 134, become linearly polarized light having a polarization direction the same as the polarization direction "P" of the third linear polarizer 134 and located in a second quadrant and a fourth quadrant. With reference to FIG. 20*b*, the linearly polarized light forms the fingerprint signal light after being reflected through the touch body, and is still linearly polarized light with an unchanged polarization direction. However, facing the transmission direction of the fingerprint signal light, an included angle between a direction of the e axis of the first quarter-wave plate 133 and the polarization direction of the third linear polarizer 134 is 45°, the fingerprint signal light is the linearly polarized light with the polarization direction located in a first quadrant and a third quadrant; and a polarization state and the light intensity of the fingerprint signal light when passing through the third linear polarizer 134 again are unchanged, and fingerprint signal light becomes levorotatory circularly polarized light when passing through the first quarter-wave plate 133 and the light intensity is unchanged. When passing through the second quarter-wave plate 231, the levorotatory circularly polarized light becomes the linearly polarized light with the polarization direction located in the second quadrant and the fourth quadrant and has unchanged light intensity. The linearly polarized light with the unchanged light intensity is outputted through the fourth linear polarizer 232 with the polarization direction parallel with the polarization direction of the linearly polarized light.

Figure 21:
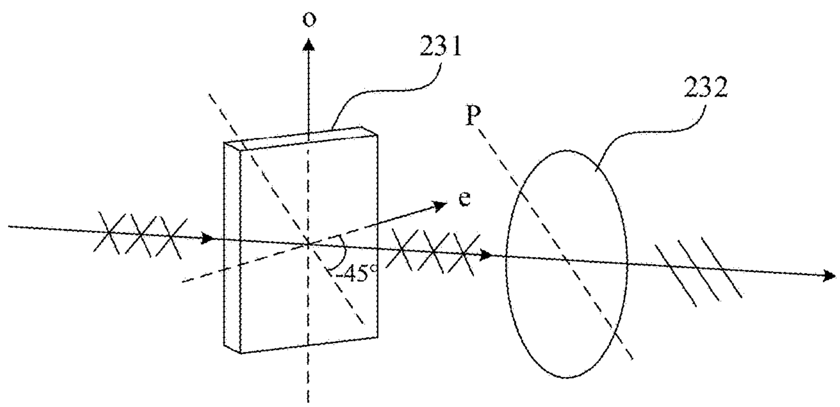
FIG. 21 is a schematic diagram illustrating an optical path of fingerprint noise light emitted from organic light emitting configurations provided by an embodiment of the present disclosure.

With reference to FIG. 21, the fingerprint noise light emitted from the organic light emitting configuration 11 directly enters the second polarizer 23. Facing the transmission direction of the fingerprint noise light, the inclined angle between the direction of the "e" axis of the second quarter-wave plate 231 and the polarization direction "P" of the fourth linear polarizer 232 is −45°. The fingerprint noise light is still the natural light after passing through the second quarter-wave plate 231. The natural light passes through the fourth linear polarizer 232 to become linearly polarized light. The polarization direction of the linearly polarized light is identical with the polarization direction "P" of the fourth linear polarizer 232, and is in the second quadrant and the fourth quadrant, but a half of the light intensity of the linearly polarized light is lost. Therefore, the second polarizer 23 can reduce the light intensity of the fingerprint noise light to increase the signal-to-noise ratio.

Figure 22:
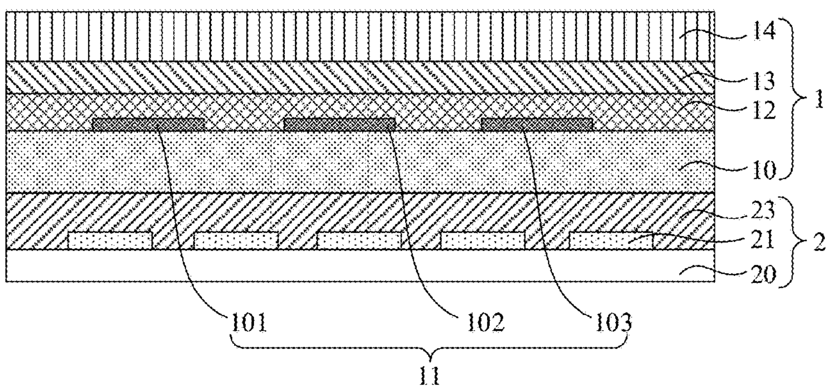
FIG. 22 is a cross sectional structural schematic diagram illustrating another display panel provided by an embodiment of the present disclosure.

FIG. 22 is a cross sectional structural schematic diagram illustrating another display panel provided by an embodiment of the present disclosure. The display panel may be a flexible display panel. Specifically, as shown in FIG. 22, the array substrate 10 is a flexible substrate. The display module 1 further includes an encapsulation layer 12, for example, a film encapsulation layer to replace the second glass substrate in above embodiments, and the film encapsulation layer 12 covers the organic light emitting configuration 11.

Figure 23:
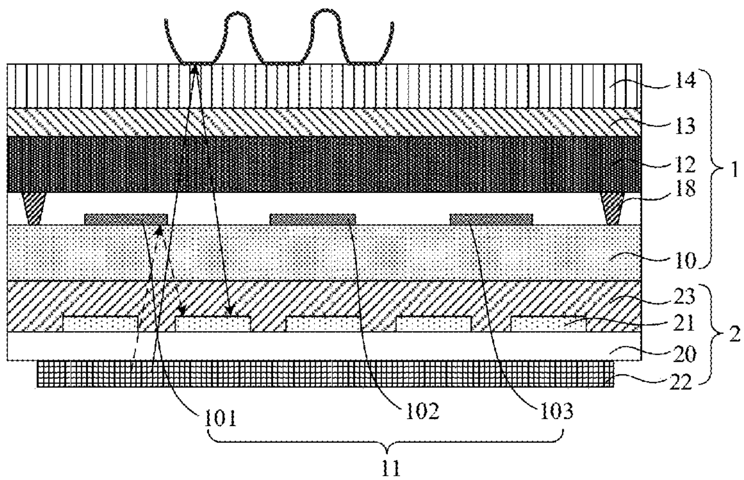
FIG. 23 is a cross sectional structural schematic diagram illustrating another display panel provided by an embodiment of the present disclosure.

FIG. 23 is a cross sectional structural schematic diagram illustrating another display panel provided by an embodiment of the present disclosure. As shown in FIG. 23, The display panel in the present embodiment may include: a display module 1 which includes an array substrate 10 and a polarizer 13 disposed on the array substrate 10, a light exiting side of the display module 1 is located at a side facing away from the array substrate 10 of the polarizer 13; organic light emitting configurations 11 located between the array substrate 10 and the polarizer 13 and configured to generate light for image display; and a fingerprint identification module 2, located at one side facing away from the polarizer 13 of the array substrate 10 and including a fingerprint identification unit 21 and a second polarizer 23 located at one side close to the display module 1 of the fingerprint identification unit 21. The fingerprint identification unit 21 is configured to perform fingerprint identification according to fingerprint signal light formed by that the light rays emitted by the light sources are reflected on the fingerprint identification unit 21 through the touch body. The fingerprint identification light source 22 is located on one side facing away from the display module 1 of the fingerprint identification module 2. The fingerprint identification light source 22 may be served as a light source of the fingerprint identification module 2.

Considering that the above organic light emitting configurations 11 are configured to generate light for image display, the fingerprint identification light source 22 may be adopted as a light source of the fingerprint identification module 2. In the display phase, the fingerprint identification light source 22 does not emit light, to avoid influencing a display effect. In the fingerprint identification phase, the organic light emitting configurations 11 shall not emit light, to prevent the light leaked from the organic light emitting configurations 11, and the emitted light reflected by the touch body from reaching the fingerprint identification unit 21 to cause the interference with the fingerprint identification. Therefore, based on the above solution, the display module 1 in the present embodiment further includes a second display driving circuit (not shown in the figure), configured not to output the display driving signals for driving the organic light emitting configurations to emit light in the fingerprint identification phase, and not to output detection driving signals for driving the fingerprint identification light source to emit light in a display phase.

Optionally, the polarizer 13 in the present embodiment includes a first quarter-wave plate and a third linear polarizer stacked together. The first quarter-wave plate is located at one side, close to the organic light emitting configuration 11, of the third linear polarizer. The second polarizer 23 includes a second quarter-wave plate and a fourth linear polarizer stacked together. The second quarter-wave plate is located at one side, close to the organic light emitting configuration 11, of the fourth linear polarizer. The first quarter-wave plate and the second quarter-wave plate are identical in materials and thicknesses.

Facing a transmission direction of the fingerprint signal light, by taking an anticlockwise direction as a forward direction, an inclined angle between a direction of an optical axis of the first quarter-wave plate and the polarization direction of the third linear polarizer is 45°, and an inclined angle between a direction of an optical axis of the second quarter-wave plate and the polarization direction of the fourth linear polarizer is −45°. Alternatively, the inclined angle between a direction of the optical axis of the first quarter-wave plate and the polarization direction of the third linear polarizer is −45°; and the inclined angle between a direction of the optical axis of the second quarter-wave plate and the polarization direction of the fourth linear polarizer is 45°.

Exemplarily, description is made by taking the following situation as an example: facing a transmission direction of the fingerprint signal light, by taking an anticlockwise direction as a forward direction, an included angle between a direction of an optical axis of the first quarter-wave plate and the polarization direction of the third linear polarizer is 45°; and an included angle between a direction of an optical axis of the second quarter-wave plate and the polarization direction of the fourth linear polarizer is −45°. In this case, the first quarter-wave plate and the second quarter-wave plate are made of calcite, and an "e" axis of the first quarter-wave plate and the second quarter-wave plate is served as an optical axis. By continuing to refer to FIG. 23, solid lines indicate a light ray emitted from the fingerprint identification light source 22 to the light exiting side and a light ray of the fingerprint signal light formed after reflected through the touch body; and a dotted line indicates a light ray emitted by the fingerprint identification light source 22 and reflected by the metal in the display module 1.

Figure 24A:
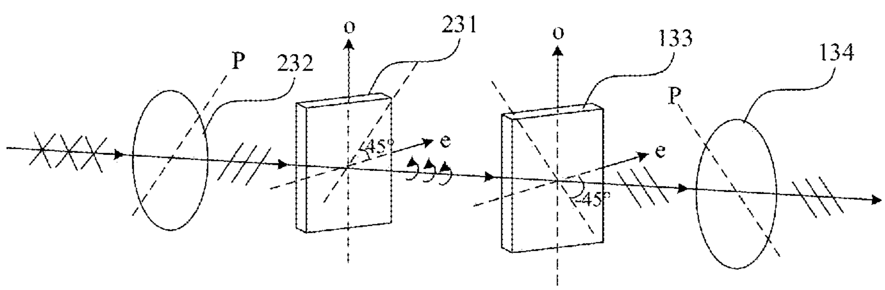
FIG. 24*a* is a schematic diagram illustrating an optical path before light emitted from a backlight source is reflected by a touch body according to an embodiment of the present disclosure.
Figure 24B:
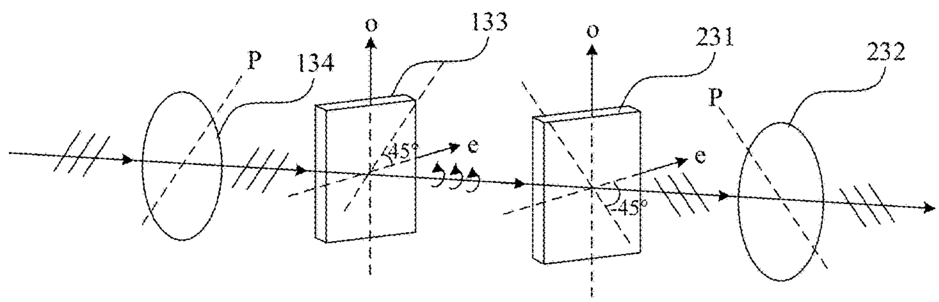
FIG. 24*b* is a schematic diagram illustrating an optical path after light emitted from a backlight source is reflected by a touch body according to an embodiment of the present disclosure.

In the fingerprint identification phase, with reference to FIG. 24*a*, before the light emitted from the fingerprint identification light source 22 is reflected through the touch body, facing a transmission direction of the light, by taking the anticlockwise direction as the forward direction, an inclined angle between a direction of the "e" axis of the first quarter-wave plate 133 and the polarization direction "P" of the third linear polarizer 134 is −45°; and an inclined angle between a direction of the "e" axis of the second quarter-wave plate 231 and the polarization direction of the fourth linear polarizer 232 is 45°. After passing through the fourth linear polarizer 232, the natural light emitted by the fingerprint identification light source 22 is changed to linearly polarized light having a polarization direction located in a first quadrant and a third quadrant. The linearly polarized light passes through the second quarter-wave plate 231 to become levorotatory circularly polarized light, and then passes through the first quarter-wave plate 133 to become linearly polarized light having a polarization direction located in a second quadrant and a fourth quadrant. The polarization direction of the linearly polarized light is parallel with the polarization direction of the third linear polarizer 134. Thus, when the linearly polarized light passes through the third linear polarizer 134, a polarization state is kept unchanged. With reference to FIG. 24*b*, the linearly polarized light forms the fingerprint signal light after reflected through the touch body, and is still linearly polarized light with an unchanged polarization direction. However, facing the transmission direction of the fingerprint signal light, the fingerprint signal light is the linearly polarized light with the polarization direction located in a first quadrant and a third quadrant; a polarization state and the light intensity of the fingerprint signal light when passing through the third linear polarizer 134 again are unchanged, and fingerprint signal light becomes levorotatory circularly polarized light when passing through the first quarter-wave plate 133 and the light intensity is unchanged. When passing through the second quarter-wave plate 231, the levorotatory circularly polarized light becomes the linearly polarized light with the polarization direction located in the second quadrant and the fourth quadrant and has unchanged light intensity. The linearly polarized light with the unchanged light intensity is output through the fourth linear polarizer 232 with the polarization direction parallel with the polarization direction of the linearly polarized light.

Figure 25A:
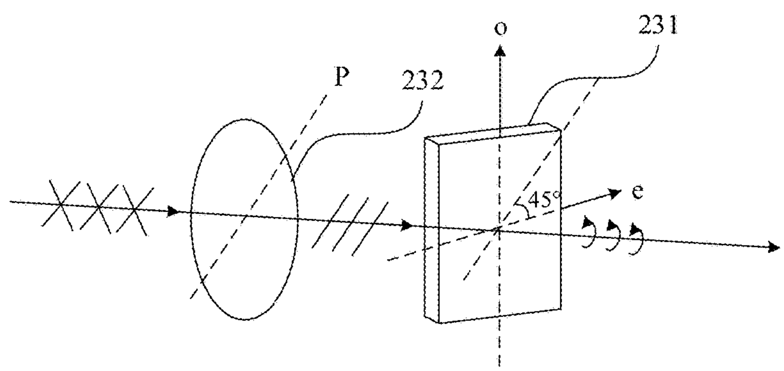
FIG. 25*a* is a schematic diagram illustrating an optical path prior fingerprint noise light emitted from a backlight source is reflected by metal according to an embodiment of the present disclosure.
Figure 25B:
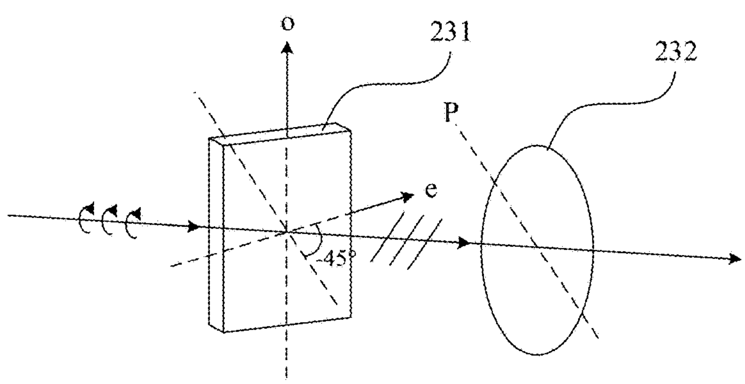
FIG. 25*b* is a schematic diagram illustrating an optical path after fingerprint noise light emitted from a backlight source is reflected by metal according to an embodiment of the present disclosure.

However, for fingerprint noise light emitted from the fingerprint identification light source and reflected by metal, please refer to FIG. 25*a*. After passing through the fourth linear polarizer 232, the natural light emitted from the fingerprint identification light source 22 is changed to linearly polarized light having a polarization direction located in a first quadrant and a third quadrant. The linearly polarized light passes through the second quarter-wave plate 231 to become levorotatory circularly polarized light, and the levorotatory circularly polarized light becomes dextrorotatory circularly polarized light after being reflected by the metal. Referring to FIG. 25*b*, the dextrorotatory circularly polarized light passes through the second quarter-wave plate 231 again to become linearly polarized light having a polarization direction located in a first quadrant and a third quadrant. The polarization direction is perpendicular with the polarization direction of the fourth linear polarizer 232. Therefore, the fingerprint noise light cannot pass through the fourth linear polarizer 232 to reach the fingerprint identification unit 21. Therefore, the second polarizer 23 can completely eliminate the fingerprint noise light reflected by the metal in the display module, to increase the signal-to-noise ratio.

Optionally, the display panel in the present embodiment is a rigid display panel. Specifically, as shown in FIG. 23, the array substrate 10 is a first glass substrate. The display module 1 further includes an encapsulation layer 12. The organic light emitting configuration 11 is arranged between the first glass substrate 10 and the encapsulation layer 12. The first glass substrate 10 and the encapsulation layer 12 are supported by supporting pillars 18. An air gap exists between the first glass substrate 10 and the encapsulation layer 12. Optionally, a thickness of the air gap is about 4 μm. The display panel further includes a cover plate glass 14. The cover plate glass 14 can be attached to a surface at one side facing away from the organic light emitting configuration of the polarizer 13 through a liquid optical adhesive. Optionally, a thickness of the display module is around 1410 μm. In the present embodiment, the fingerprint identification module 2 further includes a first substrate 20. The fingerprint identification unit 21 is arranged on a surface at one side close to the display module 1 of the first substrate 20. The fingerprint identification light source 22 is arranged on a surface at one side facing away from the display module 1 of the first substrate 20. Thus, the fingerprint identification unit 21 can be directly made on the first substrate 20, so that not only arrangement of the fingerprint identification unit 21 is facilitated, but also the first substrate 20 performs a protective effect on the fingerprint identification unit 21. In addition, the second polarizer 23 may be attached to the array substrate 10 through an optical adhesive layer (not shown in the figure), to attach the display module 1 and the fingerprint identification module 2 together to form the display panel.

Figure 26:
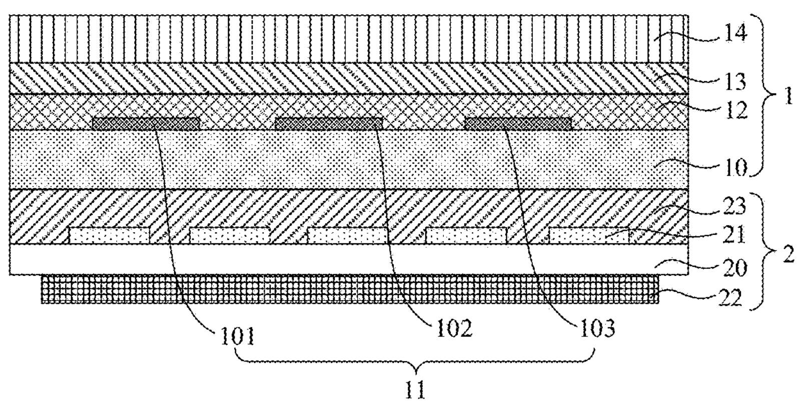
FIG. 26 is a cross sectional structural schematic diagram illustrating another display panel provided by an embodiment of the present disclosure.

FIG. 26 is a structural schematic diagram illustrating another display panel provided by an embodiment of the present disclosure. The display panel may be a flexible display panel. The encapsulation layer 12 may be a film encapsulation layer 12 to replace the second glass substrate in above embodiments to cover the organic light emitting configuration 11.

It should be noted that the directions of the optical axis of the quarter-wave plates and the polarization directions of the linear polarizers shown in corresponding FIG. 20*a*, FIG. 24*a* and FIG. 24*b* in above embodiments are only used to facilitate understanding. However, in embodiments of the present disclosure, the direction of the optical axis of the first quarter-wave plate and the direction of the optical axis of the second quarter-wave plate have no specific relationship, and the polarization direction of the third linear polarizer and the polarization direction of the fourth linear polarizer also have no specific relationship. The inclined angle between the direction of the optical axis of the first quarter-wave plate and the polarization direction of the third linear polarizer and the inclined angle between the direction of the optical axis of the second quarter-wave plate and the polarization direction of the fourth linear polarizer only need to satisfy limiting conditions of above embodiments.

Figure 27A:
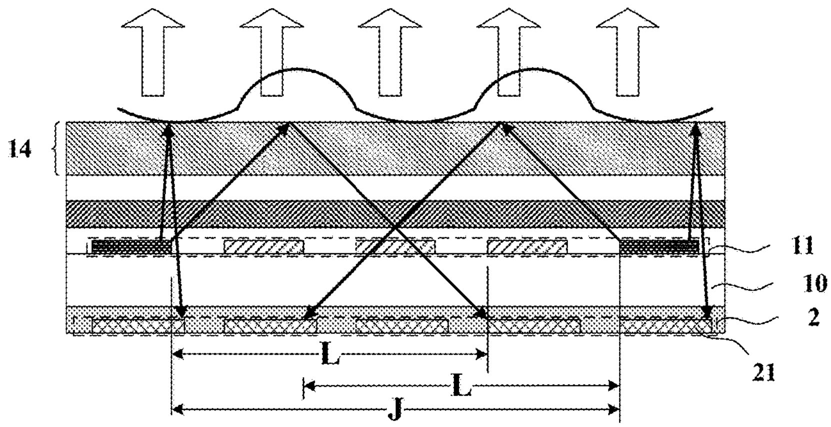
FIG. 27*a* is a cross sectional structural schematic diagram illustrating a display panel provided by an embodiment of the present disclosure.
Figure 27B:
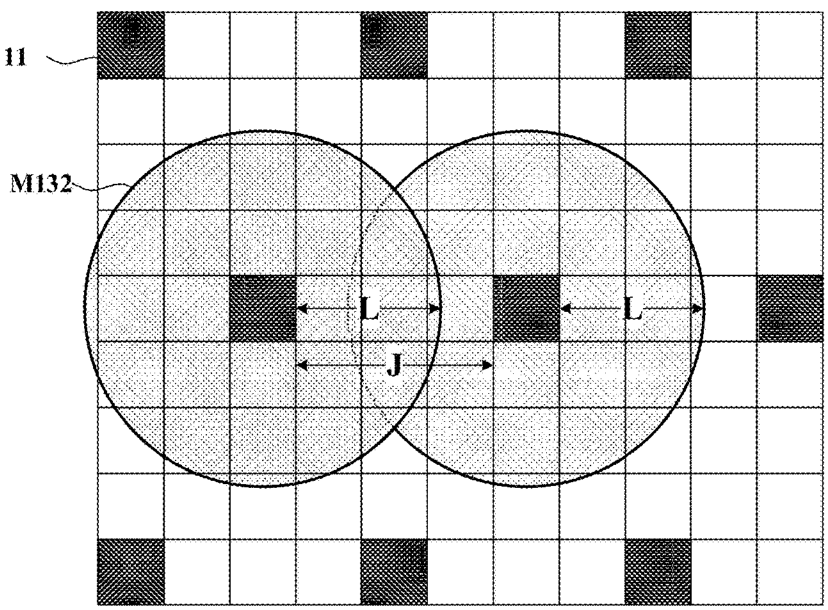
FIG. 27*b* is a local top view of illustrating a display panel shown in FIG. 27*a;*
Figure 27C:
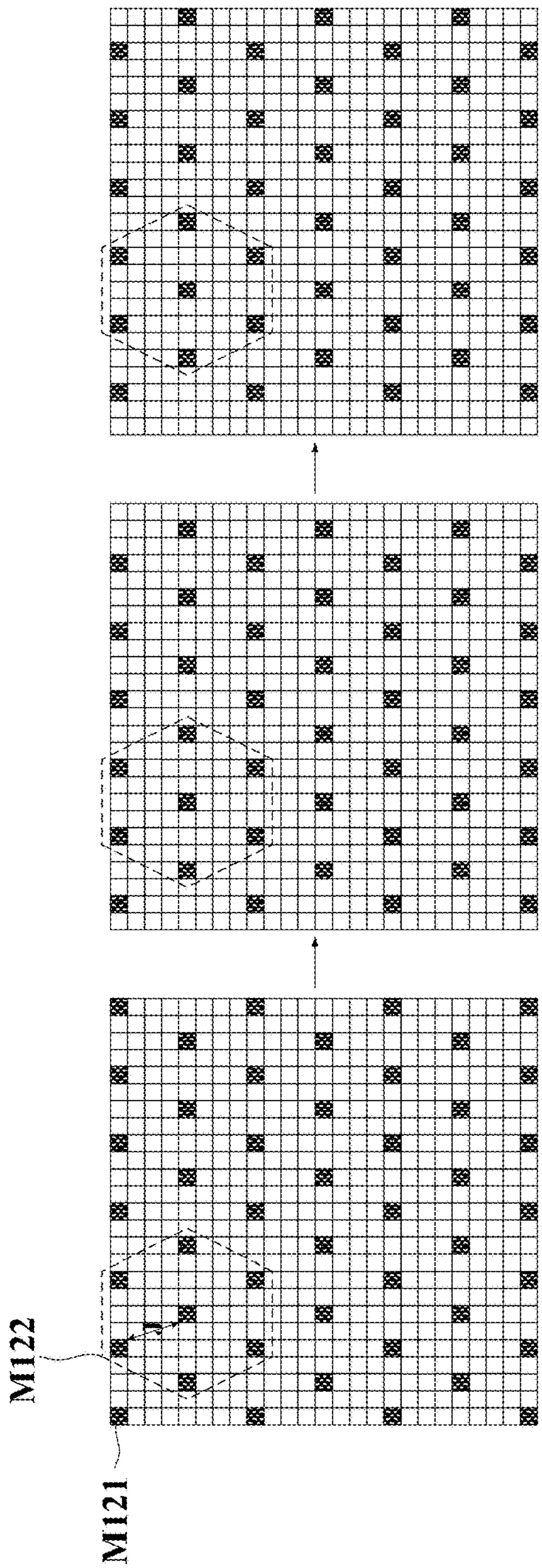
FIG. 27*c* is a scanning schematic diagram illustrating a fingerprint identification phase of a display panel shown in FIG. 27*a;*

FIG. 27*a* is a schematic diagram illustrating a display panel provided by an embodiment of the present disclosure. FIG. 27*b* is a local top view illustrating the display panel shown in FIG. 27*a*. FIG. 27*c* is a scanning schematic diagram illustrating a fingerprint identification phase of the display panel shown in FIG. 27*a*. The display panel provided by an embodiment of the present disclosure includes: an array substrate 10, organic light emitting configurations 11 disposed on the array substrate 10 at one side facing a cover plate 14, a fingerprint identification module 2 and a cover plate 14. A first surface, facing away from the array substrate 10 of the cover plate 14, of the organic light emitting configurations 11 is a light exiting side of the display panel. In the fingerprint identification phase, fingerprint identification is performed according to the light rays emitted from the organic light emitting configuration 11. In a fingerprint identification phase, the plurality of organic light emitting configurations 11 emit light in a first light emitting lattice M122 and shift. A distance J between any two adjacent organic light emitting configurations 11 in the first light emitting lattice M122 is greater than or equal to a minimum non-crosstalk distance L. The minimum non-crosstalk distance L is a maximum radius of a covering region M132 formed on the fingerprint identification module 2 by the light emitted from any organic light emitting configuration 11 and then reflected by the first surface of the cover plate 14. Optionally, the fingerprint identification module 2 is arranged at a side, facing away from the cover plate 14, of the array substrate 10. The fingerprint identification module 2 includes a plurality of fingerprint identification units 21. The plurality of fingerprint identification units 21 and the plurality of organic light emitting configurations 11 are correspondingly arranged.

Figure 28:
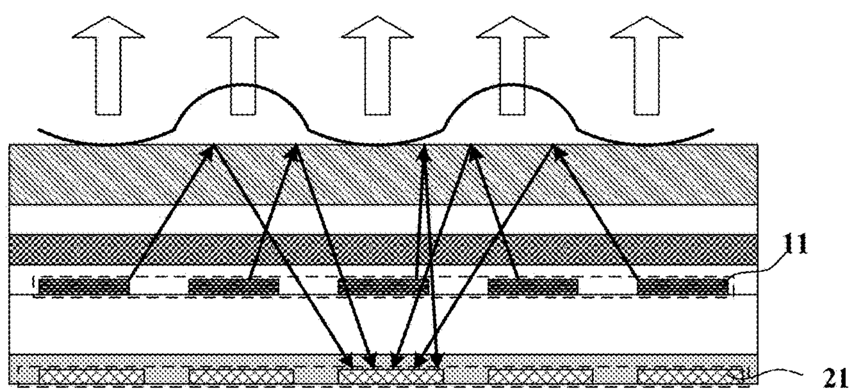
FIG. 28 is a schematic diagram illustrating crosstalk of a display panel.

The first light emitting lattice M122 is served as the detection light source of the fingerprint identification unit 21 because the light rays emitted from the organic light emitting configurations 11 have a wide range of angular distribution. As shown in FIG. 28, in the case that all the organic light emitting configurations 11 of the display apparatus are adopted to simultaneously emit light for performing the fingerprint identification, besides the fingerprint reflection light from the corresponding organic light emitting configuration 11, each fingerprint identification unit M13 also receives crosstalk signals from other organic light emitting configurations 11, causing low fingerprint identification precision.

In order to improve the fingerprint identification precision, in the fingerprint identification phase of the display apparatus provided by the present embodiment, a plurality of organic light emitting configurations 11 emit light according to the first light emitting lattice M122 and shift, and a distance J between any two adjacent organic light emitting configurations 11 in the first light emitting lattice M122 is greater than or equal to the minimum non-crosstalk distance L. As shown in FIG. 27*a* and FIG. 27*b*, the light rays emitted from the organic light emitting configurations 11 have angular distribution, so a covering region M132 is formed on the fingerprint identification module 2 by the light emitted from the organic light emitting configurations 11 and reflected through the first surface of the cover plate 14. The fingerprint reflection light for the light emitted at any angle from the organic light emitting configurations 11 will fall into the covering region M132. The maximum radius of the covering region M132 is the minimum non-crosstalk distance L. In the present embodiment, since the distance J between any two adjacent organic light emitting configurations 11 in the first light emitting lattice M122 is greater than or equal to the minimum non-crosstalk distance L, the fingerprint reflection light for any organic light emitting configuration 11 will not be irradiated on the fingerprint identification units 21 corresponding to other organic light emitting configurations 11 which simultaneously emit light. In other words, each fingerprint identification unit 21 corresponding to any one of the organic light emitting configurations 11 in the first light emitting lattice M122 can only receive the fingerprint reflection light from the organic light emitting configuration 11 corresponding to the fingerprint identification unit. Therefore, in the display apparatus provided by the present embodiment, the fingerprint identification unit 21 will not receive the crosstalk signals from other organic light emitting configurations. Accordingly, the fingerprint identification circuit of the display panel performs fingerprint identification according to sensing signals generated by the fingerprint identification unit 21, thereby improving the fingerprint identification precision of the display panel.

It should be noted that the fingerprint reflection light is a reflection light generated by reflecting the light rays emitted from the organic light emitting configuration 11 through the fingerprint of the user's finger pressed on the first surface of the cover plate 14. Since a distance between the fingerprint of the user's finger and the first surface of the cover plate 14 is very small compared with a thickness of the display apparatus, such distance has small influence on a scope of the covering region M132. Therefore, in the present embodiment, a reflection distance between the finger of the user and the first surface of the cover plate 14 is omitted in setting the minimum non-crosstalk distance L. In addition, the radius L of the covering region M132 should be substantially computed by taking the central point of the organic light emitting configuration 11 as the origin. However, a large number of organic light emitting configurations 11 are arranged in the actual display panel. Accordingly, the size of the organic light emitting configuration 11 is small. Therefore, in the present embodiment, the organic light emitting configuration 11 may be integrally regarded as the origin of the covering region M132. In other words, the radius L of the covering region M132 indicates a length from an edge of the organic light emitting configuration 11 to an edge of the covering region M132, and the size of the organic light emitting configuration 11 is not counted into the minimum non-crosstalk distance L. It can be understood by those skilled in the art that, the minimum non-crosstalk distance L is related to factors such as the thickness of the display panel, a light exiting angle of the organic light emitting configurations and the like. Therefore, the minimum non-crosstalk distances L of different display panels are different in numerical values. In other optional embodiments, the size of the organic light emitting configuration is optionally counted into the minimum non-crosstalk distance L, which is not specifically limited in the present disclosure.

As mentioned above, the light rays emitted from the organic light emitting configurations 11 have angular distribution, and the minimum non-crosstalk distance L is the maximum radius of the covering region M132 formed on the fingerprint identification module 2 by the light emitted from any organic light emitting configuration 11 and reflected by the first surface of the cover plate 14. Apparently, a region, defined by the reflection light for the light rays with a maximum angle emitted from the edge of the organic light emitting configurations 11, on the fingerprint identification module 2 is the covering region M132. Each reflection light for the light rays with any angle emitted from the organic light emitting configurations 11 falls into the covering region M132.

Figure 27D:
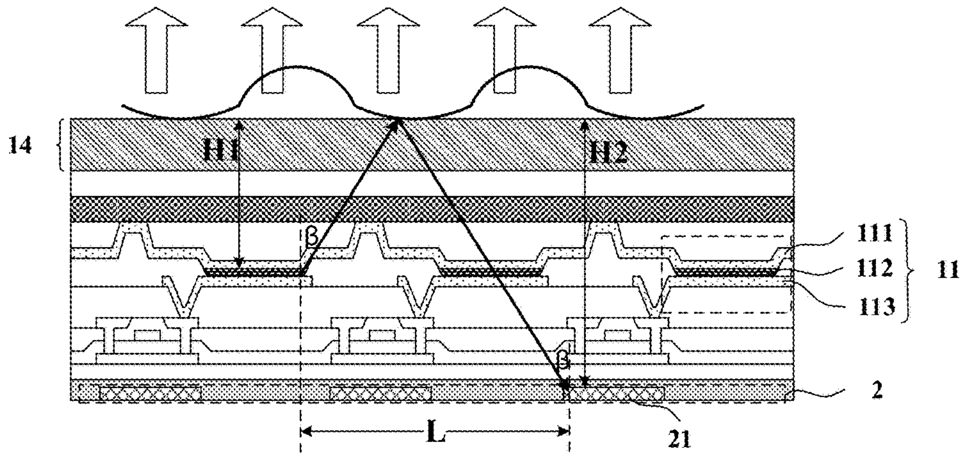
FIG. 27*d* is a specific structural schematic diagram of FIG. 27*a;*

As shown in FIG. 27*d*, in embodiments of the present disclosure, each organic light emitting configuration 11 includes a first electrode 111, a light emitting layer 112 and a second electrode 113 arranged successively along a direction in which the organic light emitting configuration 11 faces away from the array substrate 10. A first electrode 111, a light emitting layer 112 arranged correspondingly to the first electrode 111, and a second electrode 113 corresponding to the first electrode 111 form an organic light emitting unit. If the organic light emitting configurations 11 include organic light emitting units of three colors, each organic light emitting configuration 11 includes organic light emitting units of three different colors. If signals are applied to the first electrode 111 and the second electrode 113, the light emitting layer 112 emits light. The light rays emitted from the light emitting layer 112 have angular distribution. The fingerprint reflects the signals essentially through specular reflection. In other words, a reflection angle is equal to an incident angle. As can be known that $L=\tan\beta\times H1+\tan\beta\times H2$, where "L" is the minimum non-crosstalk distance; "β" is an included angle between a direction corresponding to a preset brightness of the organic light emitting configurations 11 and a direction perpendicular to the organic light emitting layer; "H1" is a height from the first surface of the cover plate 14 to the light emitting functional layer in the direction perpendicular to the display panel; "H2" is a height from the first surface of the cover plate 14 to the fingerprint identification module 2 in the direction perpendicular to the display panel; and the preset brightness is less than or equal to 10% of a brightness in the direction perpendicular to the organic light emitting layer.

In the present embodiment, an angle of the light rays emitted from the organic light emitting configurations 11 is related to the brightness of the organic light emitting configurations 11. The brightness on the observer's eyes is a subjective feeling for (discoloration) light emitting intensity. The full brightness of the organic light emitting configurations 11 in the normal direction is defined as 100% in the present embodiment. The lower the percentage of the brightness is, the larger the corresponding light exiting angle (an included angle between the direction of the light emitted and the normal to the organic light emitting layer) is and the weaker the light emitting intensity is. When the brightness of the organic light emitting configuration 11 is less than or equal to 10%, the light intensity of the light rays emitted from the organic light emitting configuration 11 is very weak. Therefore, the reflection light generated on the first surface of the cover plate 14 by the light rays emitted from the organic light emitting configuration 11 will not cause crosstalk to the fingerprint identification unit 21. Therefore, in the present embodiment, the light exiting angle of the organic light emitting configuration 11 is set to have a critical value of 10% brightness. Based on this, β is determined as follows: measuring the brightness of the organic light emitting configuration 11 in the perpendicular direction; determining a position corresponding to 10% of the brightness in the direction perpendicular to the organic light emitting layer; and determining β according to the included angle between the direction of the position and the direction perpendicular to the organic light emitting layer. It can be understood for those skilled in the art that the light intensities of the organic light emitting configurations of different display panels may be different, and preset brightness values may also be different accordingly. For example, in other optional embodiments, the preset brightness value is optionally 12% or 9% and the like of the brightness in the direction perpendicular to the organic light emitting layer, which is not limited in the present disclosure.

FIG. 27*c* is a scanning schematic diagram of a display panel. In the phase of fingerprint identification, the display panel performs the fingerprint identification in a manner of screen scanning. Specifically, the organic light emitting configurations 11 are illuminated at the same time according to the first light emitting lattice M122, and the sensing signals generated by the fingerprint identification units 21 at positions corresponding to the illuminated organic light emitting configurations 11 are recorded. In a next screen, the organic light emitting configurations 11 illuminated at the same time shift and corresponding sensing signals are recorded until all the organic light emitting configurations 11 are illuminated circularly; and the fingerprint identification is performed based on the acquired sensing signals of each fingerprint identification unit 21. Since no crosstalk signal is received by the fingerprint identification unit 21 in the present embodiment, the fingerprint identification precision of the present embodiment is very high. It can be understood for those skilled in the art that the first light emitting lattice optionally is a minimum repeating unit formed by a plurality of organic light emitting configurations that emit light at the same time, and is not limited to a lattice formed by a plurality of organic light emitting configurations that emit light at the same time.

In the display panel provided by an embodiment of the present disclosure, in the phase of fingerprint identification, a plurality of organic light emitting configurations emit light according to the first light emitting lattice and shift. The distance between any two adjacent organic light emitting configurations in the first light emitting lattice is greater than or equal to the minimum non-crosstalk distance. The minimum non-crosstalk distance is the maximum radius of the covering region formed on the fingerprint identification array by the light emitted from any organic light emitting configuration and reflected through the light exiting side. Apparently, the fingerprint reflection light of any organic light emitting configuration in the first light emitting lattice will never be irradiated on the fingerprint identification units corresponding to other organic light emitting configurations that emit light simultaneously. In other words, each fingerprint identification unit only receives the fingerprint reflection light of the organic light emitting configuration corresponding to the fingerprint identification unit in the first light emitting lattice. Therefore, no crosstalk signal from other organic light emitting configurations is received by each fingerprint identification unit. Accordingly, the fingerprint identification precision of the display panel is improved because the fingerprint identification is performed by the fingerprint identification circuit of the display apparatus based on sensing signals generated by the fingerprint identification units.

It should be noted that the display panel shown in FIG. 27*a* is only a structure of one display panel in the present disclosure. Various display panels with different structures are also provided in other embodiments of the present disclosure.

Figure 29:
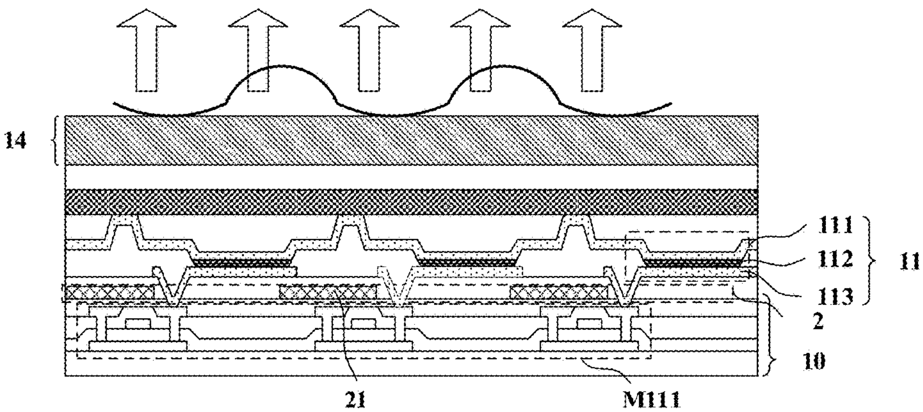
FIG. 29 is a cross sectional structural schematic diagram illustrating a second type of display panel provided by an embodiment of the present disclosure.

Embodiments of the present disclosure further provide a second type of display panel which is different from the display panel shown in FIG. 27*a* only in structures. Specifically, as shown in FIG. 29, in the display panel, a thin film transistor array M111, a fingerprint identification module 2 and an organic light emitting configuration 11 are stacked at one side, facing the cover plate 14, of the array substrate 110. As shown in FIG. 29, the fingerprint identification module 2 is arranged between the thin film transistor array M111 and the organic light emitting configuration 11. The fingerprint identification module 2 and the thin film transistor array M111 are stacked and insulated from each other, and the fingerprint identification module 2 and the organic light emitting configuration 11 are stacked and insulated from each other. The process of fingerprint identification of the display panel is similar to that of the display panel shown in FIG. 27*a*, and is not repeated herein. It should be noted that the fingerprint identification module 2 is arranged between the thin film transistor array M111 and the organic light emitting configuration 11, and thus will not influence an aperture ratio of the first electrode in the organic light emitting configurations 11. Therefore, an arrangement mode of the fingerprint identification units 21 in the fingerprint identification module 2 can be determined as required by products, and is not specifically limited in the present disclosure.

Figure 30A:
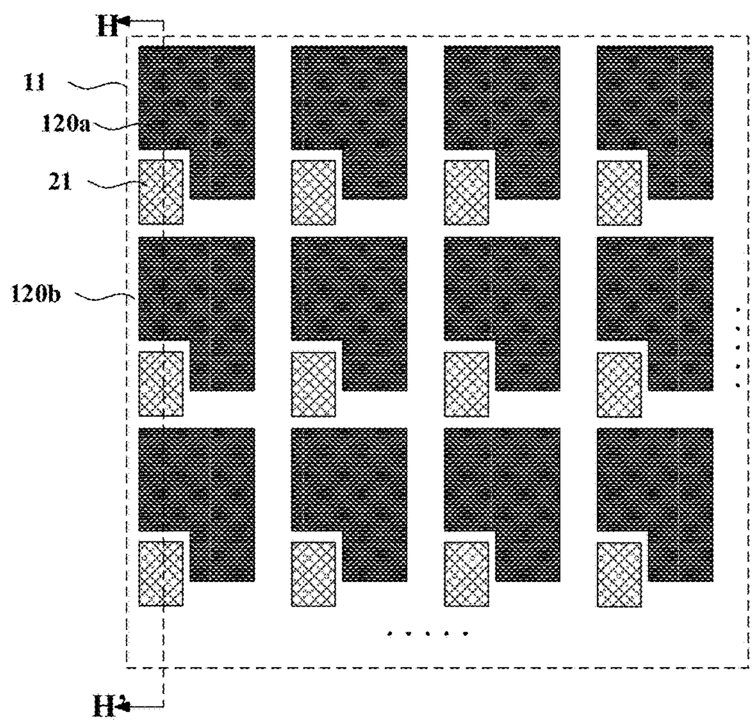
FIG. 30*a* is a top view of structural schematic diagram illustrating a third type of display panel provided by an embodiment of the present disclosure.
Figure 30B:
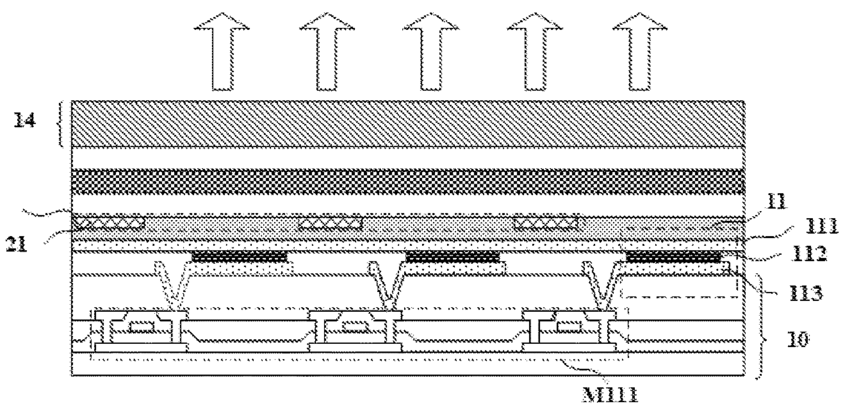
FIG. 30*b* is a cross sectional structural schematic diagram along line HH' in FIG. 30*a;*

Embodiments of the present disclosure further provide a third type of display panel which is different from the above display panel only in structures. Specifically, FIG. 30*a* is a top view of the display panel. FIG. 30*b* is a cross sectional view along line HH' in FIG. 30*a*. In the display panel shown in FIG. 30*a* to FIG. 30*b*, a thin film transistor array M111, an organic light emitting configurations 11 and a fingerprint identification module 2 are stacked at one side, facing the cover plate 14, of the array substrate 10. As shown in FIG. 30*a*, the organic light emitting layer formed by the organic light emitting configurations 11 includes a display region 120*a* and a non-display region 120*b*, and a projection of the fingerprint identification module 2 in the direction perpendicular to the display panel is located in the non-display region 120*b* of the organic light emitting layer. As shown in FIG. 30*a* to FIG. 30*b*, the fingerprint identification module 2 is arranged on a surface of one side facing the cover plate 14 of the organic light emitting configurations 11, and the fingerprint identification module 2 and the organic light emitting configurations 11 are arranged to be stacked and insulated. The fingerprint identification process of the display panel is similar to the fingerprint identification process of the display panel shown in FIG. 27*a*, and is not repeated herein. It should be noted that the fingerprint identification module 2 is arranged on the surface of one side facing the cover plate 14 of the organic light emitting configurations 11. In order to avoid reducing the aperture ratio of the first electrode 111 in the organic light emitting configurations 11, projections of the fingerprint identification units 21 in the fingerprint identification module 2 in the direction perpendicular to the display panel are located in the non-display region 120*b* of the organic light emitting configurations 11.

Figure 31A:
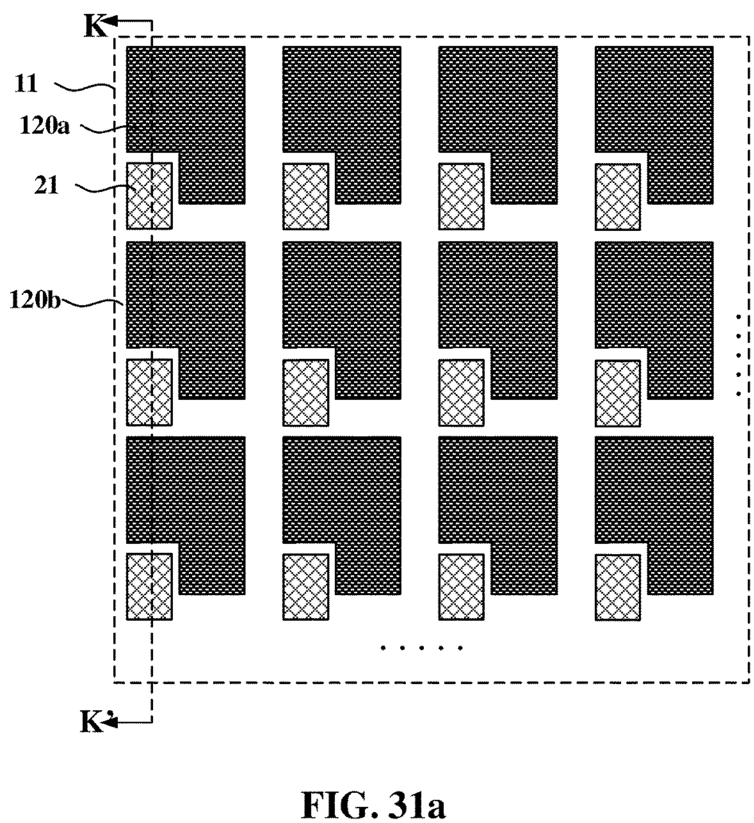
FIG. 31*a* is a top view of structural schematic diagram illustrating a fourth type of display panel provided by an embodiment of the present disclosure.
Figure 31B:
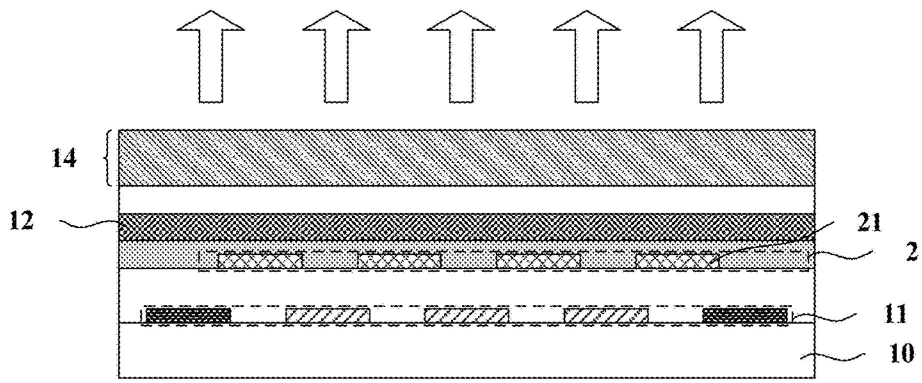
FIG. 31*b* is a cross sectional structural schematic diagram along line KK' in FIG. 31*a;*

Embodiments of the present disclosure further provide a fourth type of display panel. Specifically, FIG. 31*a* is a top view of the display panel. FIG. 31*b* is a cross sectional view along line KK' in FIG. 31*a*. The display panel shown in FIG. 31*a* to FIG. 31*b* further includes an encapsulating glass 12 arranged at one side, facing the cover plate 14, of the array substrate 10. The organic light emitting configurations 11 are arranged at one side facing the cover plate 14 of the array substrate 10; and the fingerprint identification module 2 is arranged at one side facing the array substrate 10 of the encapsulating glass 12. The organic light emitting configurations 11 include a display region 120*a* and a non-display region 120*b*. A projection of the fingerprint identification module 2 in the direction perpendicular to the display panel is located in the non-display region 120*b* of the organic light emitting configuration 11. The display panel is encapsulated by the encapsulating glass 12. The fingerprint identification module 2 is arranged at one side facing the array substrate 10 of the encapsulating glass 12, i.e., an inner side of the encapsulating glass 12. The fingerprint identification process of the display panel is similar to the fingerprint identification process of the display panel shown in FIG. 27a, and is not repeated herein. In order to avoid reducing the aperture ratio, the projections of the fingerprint identification units 21 in the fingerprint identification module 2 in the direction perpendicular to the display panel are located in the non-display region 120b of the organic light emitting configurations 11.

Figure 32A:
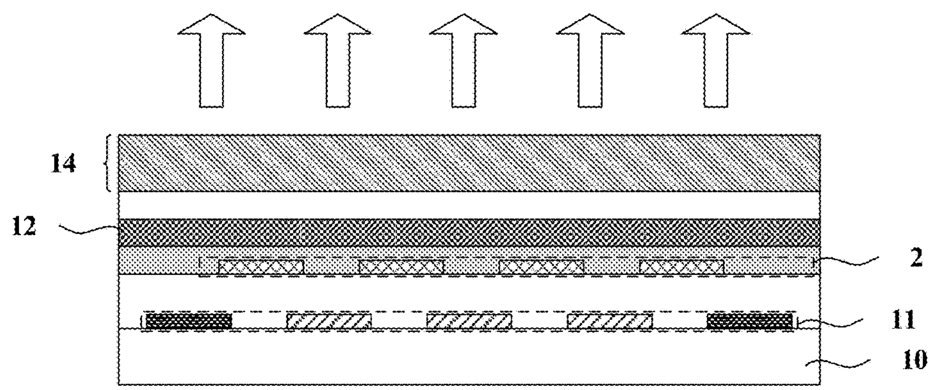
FIG. 32*a* to FIG. 32*b* are schematic diagrams illustrating two display panels provided by an embodiment of the present disclosure.
Figure 32B:
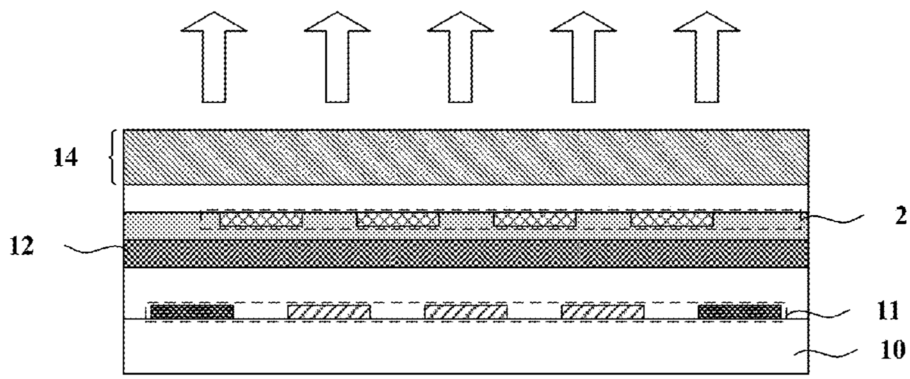
Figure 32C:
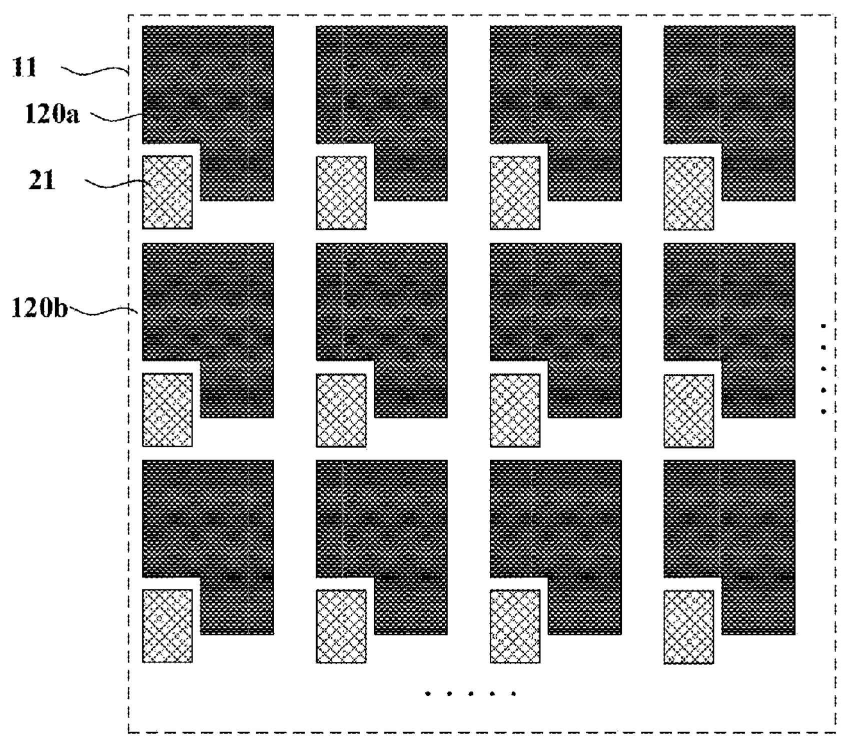
FIG. 32*c* is a top view illustrating display panels shown in FIG. 32*a* to FIG. 32*b;*

Embodiments of the present disclosure further provide two types of display panels. Specifically, in the display panels shown in FIG. 32a and FIG. 32b, the display panel further includes a thin film encapsulating layer 12 disposed at a side, facing the cover plate 14, of the array substrate 10. An organic light emitting configuration 11 is arranged at the side, facing the cover plate 14, of the array substrate 10. As shown in FIG. 32a, a fingerprint identification module 2 is arranged at a side, facing the array substrate 10, of the thin film encapsulating layer 12. As shown in FIG. 32b, a fingerprint identification module 2 is arranged at a side, facing away from the array substrate 10, of the film encapsulating layer 12. As shown in FIG. 32c, the organic light emitting configuration includes a display region 120a and a non-display region 120b. The projection of the fingerprint identification module 2 in the direction perpendicular to the display panel is within the non-display region 120b of the organic light emitting configuration 11. The display apparatus is encapsulated with the thin film encapsulating layer 12. The fingerprint identification module 2 may be arranged at an inner side of the thin film encapsulating layer 12, and may also be arranged at an outer side of the thin film encapsulating layer 12. The fingerprint identification process of these display panels is similar to that of the display panel shown in FIG. 27a, and is not repeated herein. In order to avoid reducing the aperture ratio, the projections of the fingerprint identification units 21 in the fingerprint identification module 2 in the direction perpendicular to the display panel are within the non-display region 120b of the organic light emitting configuration.

Figure 33A:
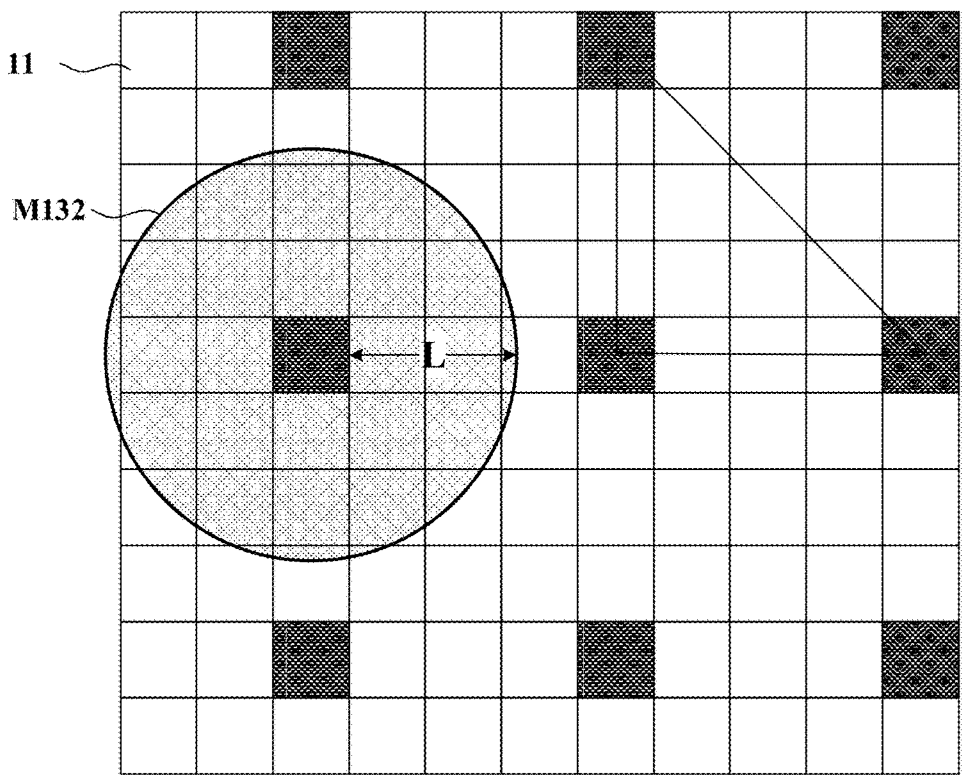
FIG. 33*a* to FIG. 33*b* are scanning schematic diagrams illustrating a fingerprint identification phase of two types of display panels provided in another embodiment of the present disclosure.

It should be noted that fingerprint information is read by the display panel in the manner of screen scanning. In one frame, the organic light emitting configurations 11 are controlled to emit light according to the first light emitting lattice M122, and the fingerprint signals from the fingerprint identification units 21 corresponding to the organic light emitting configurations 11 which emit light are collected. In a next frame, the organic light emitting configurations 11 which emit light shift. The organic light emitting configurations 11 which emit light shift successively, until all the organic light emitting configurations 11 are illuminated through multiple frames. Apparently, the fingerprint information is read by the display panel through multiple frames. The smaller the number of the organic light emitting configurations 11 being illuminated in the one-frame picture is, the more the number of frames required for the reading of the fingerprint information is, and the longer the time required for reading the fingerprint information is. For example, assuming that the fingerprint information is read by the display panel in the manner of screen scanning shown in FIG. 33a, and the number of the organic light emitting configurations which emit light simultaneously in the one frame (11×10 organic light emitting configurations) is 9. In this case, at least 12 frames need to be scanned to complete the reading of the fingerprint information from the fingerprint identification units 21 for all the organic light emitting configurations 11, and the time for reading the fingerprint information for each frame is constant.

Figure 33B:
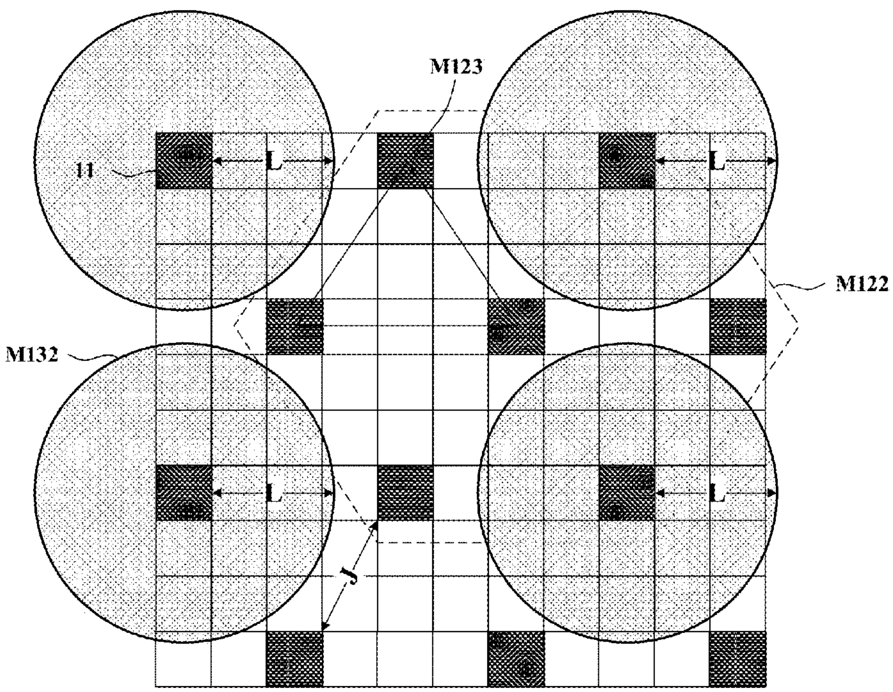

To reduce the time required for reading the fingerprint, optionally, as shown in FIG. 33b, the plurality of organic light emitting configurations 11 of the first light emitting lattice M122 form a plurality of patterns. As shown in FIG. 33b, an angle of each corner of pattern M123 with a minimum area among the plurality of patterns is not equal to 90°. Apparently, compared with FIG. 33a, the distance J between any two adjacent organic light emitting configurations 11 emitting light in the first light emitting lattice M122 is reduced. Accordingly, the number of the organic light emitting configurations 11 illuminated in the one frame is larger. Specifically, the number of the organic light emitting configurations 11 emitting light simultaneously in one frame (11×10 organic light emitting configurations) is 12, so at most 10 frames need to be scanned to complete the reading of the fingerprint information from the fingerprint identification units 21 for all the organic light emitting configurations 11. By forming a plurality of patterns with the plurality of organic light emitting configurations 11 in the first light emitting lattice M122 and setting the angle of each corner of the pattern M123 with a minimum area among the plurality of patterns to be not equal to 90°, the number of the organic light emitting configurations 11 illuminated simultaneously is increased while no signal crosstalk is ensured, so as to significantly reduce the time required for reading the fingerprint.

Figure 34A:
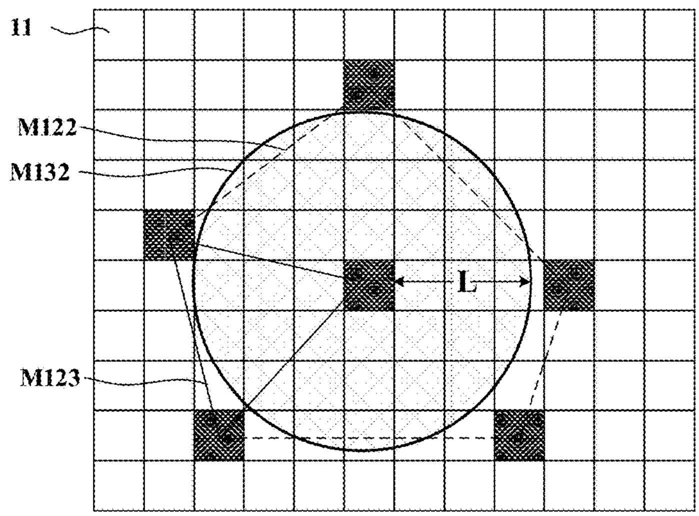
FIG. 34*a* to FIG. 34*c* are schematic diagrams illustrating three types of first light emitting lattices provided in another embodiment of the present disclosure.

Exemplarily, based on the display panels described in any of above embodiments, optionally, the first light emitting lattice M122 is a pentagonal light emitting lattice including a central organic light emitting configuration 11 and five marginal organic light emitting configurations 11, as shown in FIG. 34a. The organic light emitting configurations 11 of the first light emitting lattice M122 form a plurality of patterns, and an angle of each corner of pattern M123 with a minimum area among the plurality of patterns is not equal to 90°. The pentagonal light emitting lattice can increase the number of the organic light emitting configurations 11 illuminated simultaneously while ensuring no signal crosstalk, thereby reducing the time required for reading the fingerprint.

Figure 34B:
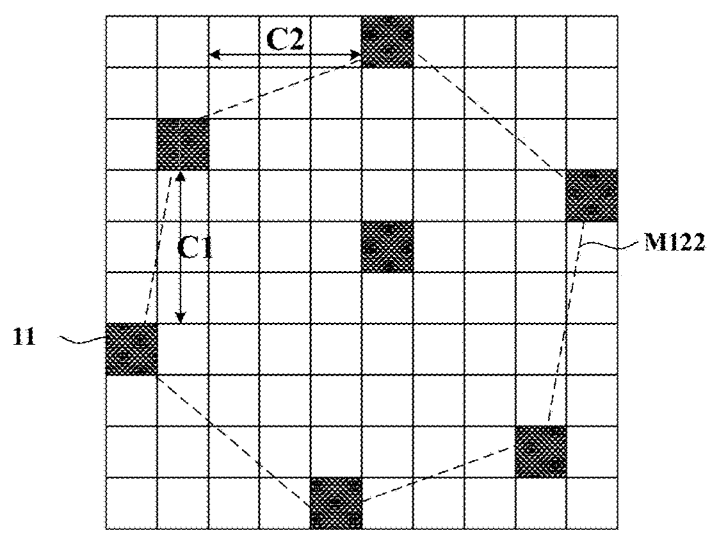

Exemplarily, based on the display panels described in any of above embodiments, optionally, the first light emitting lattice M122 is a hexagonal light emitting lattice including a central organic light emitting configuration 11 and six marginal organic light emitting configurations 11, as shown in FIG. 34b. The hexagonal light emitting lattice can increase the number of the organic light emitting configurations 11 illuminated simultaneously while ensuring no signal crosstalk, thereby reducing the time required for reading the fingerprint.

Figure 34C:
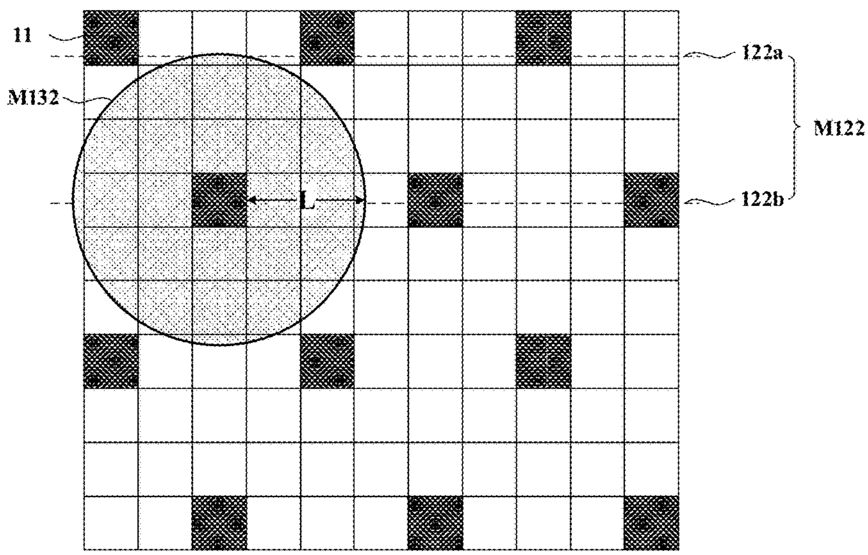

Exemplarily, based on the display panels described in any of above embodiments, the first light emitting lattice M122 optionally includes first light emitting rows 122a and second light emitting rows 122b alternately arranged, and any organic light emitting configuration 11 in the first light emitting rows 122a and any organic light emitting configuration 11 in the second light emitting rows 122b are arranged in different columns, as shown in FIG. 34c. Compared with the scanning mode shown in FIG. 33a, by arranging any organic light emitting configuration 11 in the first light emitting rows 122a and any organic light emitting configuration 11 in the second light emitting rows 122b in different columns, the number of the organic light emitting configurations 11 illuminated simultaneously is increased while ensuring no signal crosstalk. In FIG. 34c, the number of the organic light emitting configurations 11 emitting light simultaneously in one frame (11×10 organic light emitting configurations) is 12, so at most 10 frames need to be scanned to complete the reading of the fingerprint information from the fingerprint identification units 21 for all the organic light emitting configurations 11, thereby significantly reducing the time required for reading the fingerprint.

Optionally, for any type of first light emitting lattice M122 provided by any of above embodiments, the distance J between any two adjacent organic light emitting configurations 11 in the first light emitting lattice M122 is equal to the minimum non-crosstalk distance L. Apparently, the fingerprint identification unit 21 corresponding to one of the organic light emitting configuration 11 emitting light in the first light emitting lattice M122 will not receive crosstalk signals from other organic light emitting configurations which emit light at the same time, thereby ensuring the accuracy of the fingerprint signal. Meanwhile, the distance J between any two adjacent organic light emitting configurations 11 in the first light emitting lattice M122 is equal to the minimum non-crosstalk distance L, thereby also increasing the number of the organic light emitting configurations 11 illuminated at the same time, reducing the time required for reading the fingerprint signal and improving fingerprint reading efficiency.

Optionally, in any type of first light emitting lattice M122 provided by any of above embodiments, for any two adjacent organic light emitting configurations 11 located in different rows in the first light emitting lattice M122, a perpendicular distance C1 (shown in FIG. 34*b*) from one of the two adjacent organic light emitting configurations 11 to the row in which the other organic light emitting configuration 11 is located is smaller than the minimum non-crosstalk distance L; and/or for any two adjacent organic light emitting configurations 11 located in different columns in the first light emitting lattice M122, a perpendicular distance C2 (shown in FIG. 34*b*) from one of the two adjacent organic light emitting configurations 11 to the column in which the other organic light emitting configuration 11 is located is smaller than the minimum non-crosstalk distance L. Such first light emitting lattice M122 ensures that the fingerprint identification unit 21 corresponding to the organic light emitting configuration 11 emitting light will not receive crosstalk signals from other organic light emitting configurations emitting light simultaneously, thereby improving the fingerprint identification precision. Meanwhile, with such first light emitting lattice M122, the number of the organic light emitting configurations M121 illuminated at the same time can also be increased, the time required for reading the fingerprint signal is reduced and the fingerprint reading efficiency is improved.

Herein, to describe the fingerprint reading efficiency of the display panel provided by an embodiment of the present disclosure more clearly, a square array scanning mode and an orthohexagonal array scanning mode are taken as examples to describe the fingerprint reading efficiency of the display panel provided by an embodiment of the present disclosure. The crosstalk can be avoided only if the distance between adjacent illuminated organic light emitting configurations 11 in a screen being scanned is set to be at least 20 organic light emitting configurations 11 (a distance between centers of two organic light emitting configurations). Specifically, the size of each of the 20 organic light emitting configurations 11 is 20P.

Figure 35A:
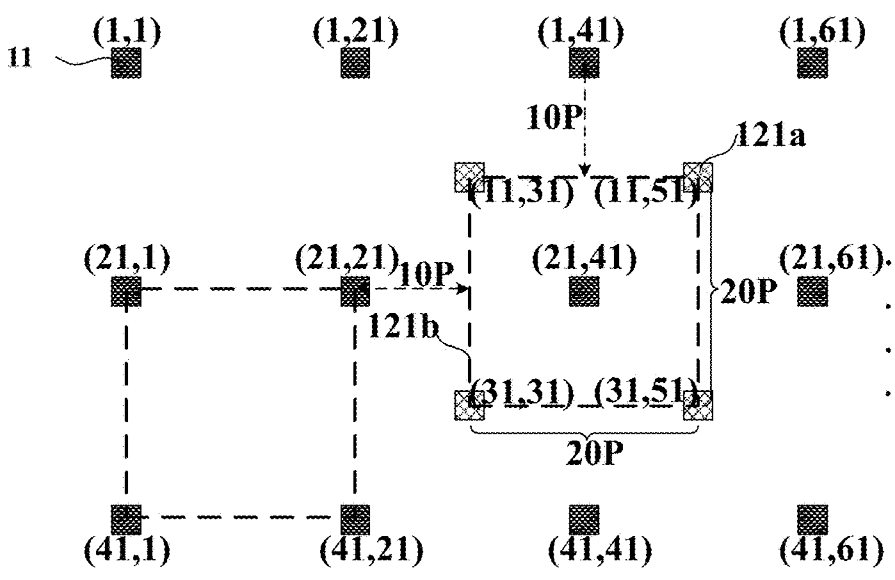
FIG. 35*a* is a schematic diagram illustrating a scanning mode of a square array of a display panel.

As for the square array scanning mode shown in FIG. 35*a*, coordinates of the illuminated organic light emitting configurations 11 are set as (row, column), and the coordinate of the first organic light emitting configuration 11 in an upper left corner is set as (1, 1). As can be seen, coordinates of the illuminated organic light emitting configurations 11 in the first row are successively set as (1,1), (1,21), (1,41) . . . ; coordinates of the illuminated organic light emitting configurations 11 in the second row are successively set as (21,1), (21,21), (21,41) . . . ; coordinates of the illuminated organic light emitting configurations 11 in the third row are successively set as (41,1), (41,21), (41,41) . . . , and so on, thereby forming the coordinates of all the organic light emitting configurations 11 illuminated at the same time in one frame. The organic light emitting layer of the display panel is divided transversely and longitudinally by having each illuminated organic light emitting configuration 11 as a central point. As a result, the organic light emitting layer is divided into a plurality of identical bright regions 121*b*. The sizes of all the bright regions 121*b* are completely the same. Each bright region 121*b* includes one illuminated organic light emitting configuration 11 and a plurality of non-illuminated organic light emitting configurations 121*a* encircling the illuminated organic light emitting configuration 11. It should be noted that a corresponding region of the illuminated organic light emitting configuration 11, located at the border of the organic light emitting configuration 11, in the organic light emitting layer is only a part of the bright region for the organic light emitting configuration.

Taking the illuminated organic light emitting configuration 11 (21,41) as an example, the bright region 121*b* corresponding to the illuminated organic light emitting configuration 11 (21,41) is encircled by four non-illuminated organic light emitting configurations 121*a*. The coordinates of the four non-illuminated organic light emitting configurations 121*a* are (11,31), (11,51), (31,31) and (31,51) respectively. Apparently, a length and a width of the bright region 121*b* are both 20P. In other words, the number of the organic light emitting configurations forming the bright region 121*b* is 20*20=400. There is only one illuminated organic light emitting configuration (21,41) in the bright region 121*b*, that is, one organic light emitting configuration 11 is illuminated in every 400 organic light emitting configurations 11. Therefore, a density of the illuminated organic light emitting configurations in the bright region 121*b* is $1/400$. Since the organic light emitting layer M120 is divided into a plurality of bright regions 121*b*, a density of the illuminated organic light emitting configurations 11 in one frame is $1/400$. As can be seen, 20*20=400 frames need to be scanned to illuminate all the organic light emitting configurations 11 in the display apparatus. FIG. 35*a* only shows some organic light emitting configurations 11 illuminated at the same time and coordinates thereof, and non-illuminated organic light emitting configurations 121*a* at four vertexes of one bright region 121*b* and coordinates thereof.

Figure 35B:
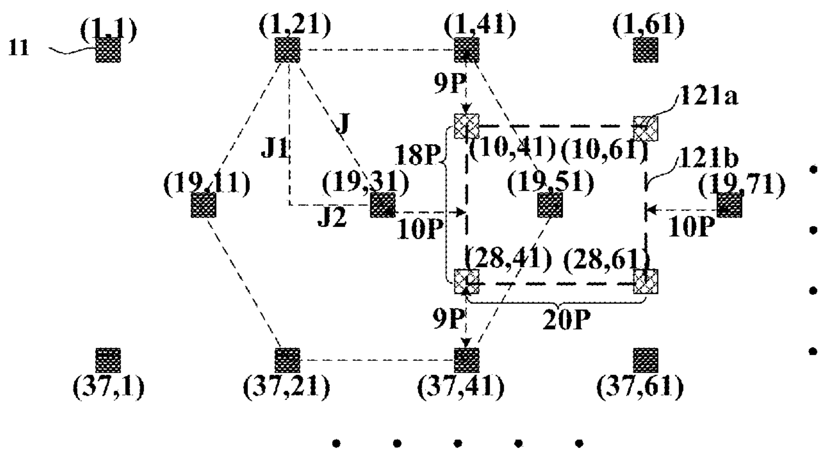
FIG. 35*b* is a schematic diagram illustrating a scanning mode of a hexagonal array of a display panel provided by an embodiment of the present disclosure.

As for the hexagonal array scanning mode shown in FIG. 35*b*, coordinates of the illuminated organic light emitting configurations 11 are set as (row, column), and the coordinate of the first organic light emitting configuration 11 in the upper left corner is set as (1, 1). In the orthohexagonal array, the distance J between any two adjacent illuminated organic light emitting configurations 11 reaches 20 organic light emitting configurations 11 (20P), a distance J1 from the marginal organic light emitting configuration 11 located in different rows from the central organic light emitting configuration 11 to the row, in which the central organic light emitting configuration 11 is located, shall reach $10P\sqrt{3}\approx 18P$, and a distance J2 from the marginal organic light emitting configuration 11 located in different rows from the central organic light emitting configuration 11 to the column, in which the central organic light emitting configuration 11 is located, shall reach 10P. As can be seen, coordinates of the illuminated organic light emitting configurations 11 in the first row are successively set as (1,1), (1,21), (1,41) . . . ; coordinates of the illuminated organic light emitting configurations 11 in the second row are successively set as (19,11), (19,31), (19,51) . . . ; coordinates of the illuminated organic light emitting configurations 11 in the third row are successively set as (37,1), (37,21), (37,41) . . . , and so on, thereby forming the coordinates of all the organic light emitting configurations 11 illuminated at the same time in one frame. Apparently, when the organic light emitting configurations 11 are illuminated, a row spacing between illuminated organic light emitting configurations 11 in different rows is reduced from 20P to 18P if a spacing between adjacent illuminated organic light emitting configurations 11 in each row is still 20P. At this moment, the distance between the marginal organic light emitting configuration 11 located in different rows from the central organic light emitting configuration 11 and the central organic light emitting configuration 11 is $\sqrt{(10P)^2+(18P)^2}\approx 20.59P>20P$, which can meet the requirements for avoiding crosstalk.

By taking each illuminated organic light emitting configuration 11 as a central point, the organic light emitting layer formed by the organic light emitting configurations 11 of the display panel is divided transversely and longitudinally. The organic light emitting layer is divided into a plurality of identical bright regions 121*b*. Sizes of all the bright regions 121*b* are completely consistent. Each bright region 121*b* includes one illuminated organic light emitting configuration 11 and a plurality of non-illuminated organic light emitting configurations 121*a* encircling the illuminated organic light emitting configuration 11. It should be noted that a corresponding region of the illuminated organic light emitting configuration 11, located at the edge of the organic light emitting layer, in the organic light emitting layer is only part of the bright regions.

By taking the illuminated organic light emitting configuration 11 (19,51) as an example, the bright region 121*b* corresponding to the illuminated organic light emitting configuration 11 (19,51) is encircled by four non-illuminated organic light emitting configurations 121*a*. The coordinates of the four non-illuminated organic light emitting configurations 121*a* are respectively (10,41), (10,61), (28,41) and (28,61). Apparently, a size of the bright region 121*b* in a row direction is 20P, and a size in a column direction is 18P, namely the number of the organic light emitting configurations forming the bright region 121*b* is 20×18=360, while the bright region 121*b* only has one illuminated organic light emitting configuration (19,51). That is, one organic light emitting configuration 11 is illuminated in every 360 organic light emitting configurations 11. Therefore, a density of the illuminated organic light emitting configurations in the bright region 121*b* is 1/360. The organic light emitting layer is divided into a plurality of bright regions 121*b*. Therefore, a density of the illuminated organic light emitting configurations 11 in one frame is 1/360. It can be seen that 20×18=360 frames need to be scanned to illuminate all the organic light emitting configurations 11 in the display panel. FIG. 35*b* only shows some organic light emitting configurations 11 illuminated at the same time and coordinates thereof, and non-illuminated organic light emitting configurations 121*b* at four vertexes of one bright region 121*b* and coordinates thereof.

Apparently, the hexagonal array scanning mode shown in FIG. 35*b* is better than the square array scanning mode shown in FIG. 35*a*.

Figure 36:
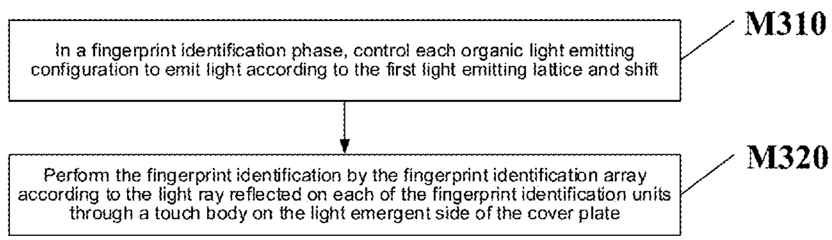
FIG. 36 is a flow chart illustrating a fingerprint identification method of a display panel provided by an embodiment of the present disclosure.

Another embodiment of the present disclosure further provides a fingerprint identification method of a display panel. The display panel may be the display panel shown in above FIG. 27*a* to FIG. 27*d* and FIG. 29 to FIG. 34*c*, and includes: an array substrate 10, an organic light emitting configuration 11 disposed at the side, facing a cover plate 14, of the array substrate 10, and a fingerprint identification module 2 and the cover plate 14. The first surface, facing away from the array substrate 10, of the cover plate 14 is the light exiting surface of the organic light emitting configuration 11. As shown in FIG. 36, the fingerprint identification method provided by the present embodiment includes steps described below.

In step M310, in the fingerprint identification phase, each organic light emitting configuration is controlled to emit light according to the first light emitting lattice and shift, where the distance between any two adjacent organic light emitting configurations in the first light emitting lattice is greater than or equal to a minimum non-crosstalk distance. The minimum non-crosstalk distance is a maximum radius of a covering region formed on the fingerprint identification array by the light emitted from any organic light emitting configuration and reflected through the light exiting side of the cover plate.

In step M320, the fingerprint identification is performed by the fingerprint identification array according to the light ray reflected on each of the fingerprint identification units by a touch body on the light exiting side of the cover plate. Optionally, the touch body in the present embodiment is the user's finger.

In the fingerprint identification method of the present embodiment performed by the display panel in a manner of screen scanning, each of the organic light emitting configurations in one screen emits light according to the first light emitting lattice and shifts. Since the distance between any two adjacent organic light emitting configurations in the first light emitting lattice is greater than or equal to the minimum non-crosstalk distance, the fingerprint reflection light formed by reflecting the light ray emitted from any organic light emitting configuration in the first light emitting lattice with the fingerprint of the finger of the user will not be irradiated on the fingerprint identification units corresponding to other organic light emitting configurations in the lattice. Therefore, each fingerprint identification unit can only receive the fingerprint reflection light formed by the light ray emitted from the organic light emitting configuration corresponding to the fingerprint identification unit in the first light emitting lattice. Namely, the fingerprint identification unit will not receive crosstalk signals from other organic light emitting configurations. Accordingly, the sensing signals generated by the fingerprint identification unit accurately indicates the reflection of the light ray emitted from the corresponding organic light emitting configuration on the fingerprint of the user's finger. Therefore, the display apparatus provided by the present embodiment improves the fingerprint identification precision.

Figure 37:
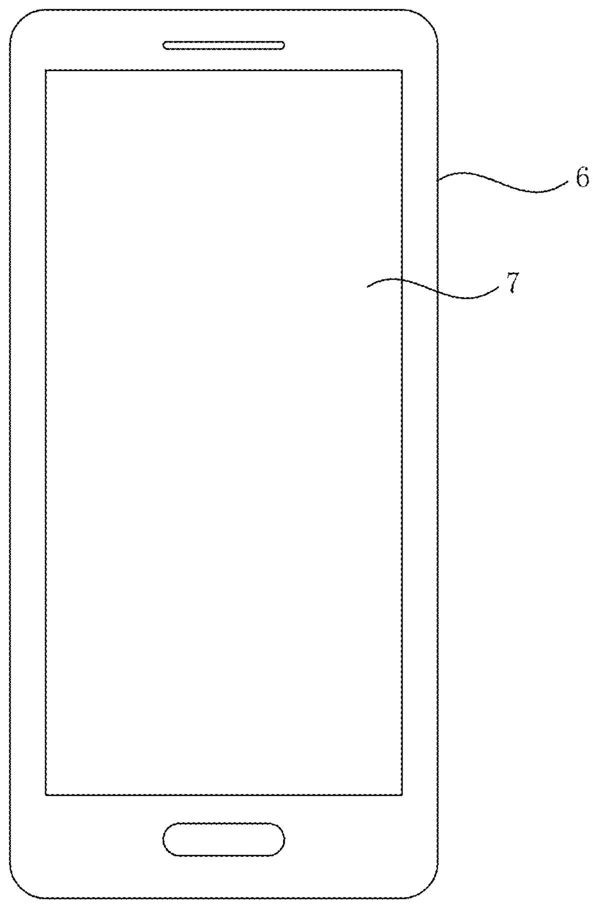
FIG. 37 is a structural schematic diagram illustrating a display apparatus provided by an embodiment of the present disclosure.

Embodiments of the present disclosure further provide a display apparatus. FIG. 37 is a structural schematic diagram illustrating a display apparatus provided by an embodiment of the present disclosure. As shown in FIG. 37, the display apparatus 6 includes the display panel 7 in above embodiments. Therefore, the display apparatus 6 provided in embodiments of the present disclosure also has beneficial effects described in above embodiments, and is not repeated herein. It should be noted that the display apparatus may be a mobile phone shown in FIG. 37, or a computer, a television, a smart wearable device and the like, and is not limited in embodiments of the present disclosure.

It should be noted that the above contents are only preferred embodiments of the present disclosure and used technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. A display panel, comprising:

a display module;

a fingerprint identification module; and an angle limiting film;

wherein the display module comprises an array substrate, and a plurality of organic light emitting configurations disposed on the array substrate;

the fingerprint identification module is located in a display region and arranged at a side, facing away from the plurality of organic light emitting configurations, of the array substrate; the fingerprint identification module comprises a first substrate and at least one fingerprint identification unit disposed on the first substrate, wherein the at least one fingerprint identification unit is configured to perform fingerprint identification according to light rays reflected, through a touch body, on the fingerprint identification unit; and the angle limiting film is arranged between the display module and the fingerprint identification module, and configured to filter out the following light rays among the light rays reflected, through the touch body, on the fingerprint identification unit: relative to the angle limiting film, the light rays have an incident angle greater than a penetration angle of the angle limiting film, wherein a transmittance of the angle limiting film for incident light rays perpendicular to the angle limiting film is "α"; the penetration angle of the angle limiting film means an incident angle of the light rays with a transmittance of "kα" relative to the angle limiting film, wherein $0<k<1$.

2. The display panel according to claim 1, wherein $k=0.1$.

3. The display panel according to claim 1, wherein the plurality of organic light emitting configurations are configured to provide a light source for the fingerprint identification module, and the at least one fingerprint identification unit is configured to perform fingerprint identification according to the light rays emitted from the plurality of organic light emitting configurations and reflected, through the touch body, on the fingerprint identification unit.

4. The display panel according to claim 3, wherein, as for the light rays reflected perpendicularly from the touch body, a transmittance is greater than 1% when being irradiated on the fingerprint identification unit after passing through the display module.

5. The display panel according to claim 3, wherein the display panel comprises a light exiting side and a non-light exiting side, wherein the light exiting side is a side, facing away from the array substrate, of the plurality of organic light emitting configurations, and the non-light exiting side is a side, facing away from the plurality of organic light emitting configurations, of the array substrate; and wherein a luminance ratio of the light exiting side to the non-light exiting side of the display panel is greater than 10:1.

6. The display panel according to claim 1, wherein the fingerprint identification module further comprises a fingerprint identification light source arranged at a side, facing away from the fingerprint identification unit, of the first substrate, wherein the fingerprint identification unit is configured to perform fingerprint identification according to light rays emitted from the fingerprint identification light source and reflected, through the touch body, on the fingerprint identification unit.

7. The display panel according to claim 6, wherein the light rays emitted from the fingerprint identification light source are irradiated on the touch body through a gap between two adjacent fingerprint identification units, and reflected perpendicularly from the touch body, a transmittance of the light rays is greater than 10% when being irradiated on the fingerprint identification unit after passing through the display module.

8. The display panel according to claim 1, wherein the angle limiting film comprises a plurality of opaque regions and a plurality of transparent regions, wherein the plurality of opaque regions and the plurality of transparent regions are parallel to a plane of the first substrate, and are arranged alternatively along a same direction; and the plurality of opaque regions are provided with light absorbing materials.

9. The display panel according to claim 8, wherein the penetration angle of the angle limiting film meets the following formula:

$$\theta = \arctan\frac{p}{h}$$

wherein "θ" is the penetration angle of the angle limiting film; "p" is a width of each of the transparent regions along an arrangement direction of the transparent regions; and "h" is the thickness of the angle limiting film.

10. The display panel according to claim 9, wherein a diffusion distance of the angle limiting film meets the following formula:

$$\Delta X = \frac{p\cdot(H+h)}{h}$$

wherein ΔX is the diffusion distance of the angle limiting film; "H" is a thickness of the display module; wherein the diffusion distance of the angle limiting film is a distance between the following two reflection points on the touch body: a reflection point of actual detection light rays, and a reflection point of interference detection light rays, wherein the actual detection light rays and interference detection light rays correspond to the same fingerprint identification unit;

wherein the actual detection light rays mean reflection light rays with a minimum incident angle relative to the fingerprint identification unit, compared with the incident angle of the actual detection light rays relative to the fingerprint identification unit, reflection light rays with greater incident angle relative to the fingerprint identification unit are the interference detection light rays.

11. The display panel according to claim 1, wherein the angle limiting film comprises porous configurations, and a side wall of each of the porous configurations is configured to absorb light rays incident on the side wall.

12. The display panel according to claim 11, wherein the penetration angle of the angle limiting film meets the following formula:

$$\theta = \arctan\frac{d}{h}$$

wherein "θ" is the penetration angle of the angle limiting film; "d" is a diameter of each of the porous configurations; and "h" is a thickness of the angle limiting film.

13. The display panel according to claim 12, wherein a diffusion distance of the angle limiting film meets the following formula:

$$\Delta X = \frac{d \cdot (H + h)}{h}$$

wherein ΔX is the diffusion distance of the angle limiting film; "H" is a thickness of the display module; wherein the diffusion distance of the angle limiting film means a distance between the following two reflection points on the touch body: a reflection point of actual detection light rays, and a reflection point of interference detection light rays, wherein the actual detection light rays and interference detection light rays correspond to the same fingerprint identification unit;

wherein the actual detection light rays mean reflection light rays with a minimum incident angle relative to the fingerprint identification unit, compared with the incident angle of the actual detection light rays relative to the fingerprint identification unit, reflection light rays with greater incident angle relative to the fingerprint identification unit are the interference detection light rays.

14. The display panel according to claim 1, wherein the angle limiting film comprises a plurality of optical fiber configurations arranged along a same direction, each of the plurality of optical fiber configurations comprises an inner core and an outer shell, and light absorbing materials are provided between every two adjacent optical fiber configurations.

15. The display panel according to claim 14, wherein the inner core and the outer shell have different refractive indexes, and the penetration angle of the angle limiting film meets the following formula:

$$n \cdot \sin\theta = \sqrt{n_{core}^2 - n_{clad}^2}$$

wherein "θ" is the penetration angle of the angle limiting film; "n" is the refractive index of a film, which comes into contact with the angle limiting film, in the display module; $n_{core}$ is the refractive index of the inner core of each of the optical fiber configurations; and $n_{clad}$ is the refractive index of the outer shell of each of the optical fiber configurations.

16. The display panel according to claim 15, wherein a diffusion distance of the angle limiting film meets the following formula:

$$\Delta X = H \cdot \tan\theta$$

wherein ΔX is the diffusion distance of the angle limiting film; "H" is a thickness of the display module; wherein the diffusion distance of the angle limiting film is defined as a distance between the following two reflection points on the touch body: a reflection point of actual detection light rays, and a reflection point of interference detection light rays, wherein the actual detection light rays and interference detection light rays are detected by the same fingerprint identification unit;

wherein the actual detection light rays mean reflection light rays with a minimum incident angle relative to the fingerprint identification unit, compared with the incident angle of the actual detection light rays relative to the fingerprint identification unit, reflection light rays with greater incident angle relative to the fingerprint identification unit are the interference detection light rays.

17. The display panel according to claim 1, wherein the angle limiting film comprises a plurality of pillar configurations arranged along a same direction, each of the pillar configurations comprises an inner core and an outer shell, and the inner core and the outer shell have a same refractive index, and the outer shell comprises light absorbing materials.

18. The display panel according to claim 17, wherein the penetration angle of the angle limiting film meets the following formula:

$$\theta = \arctan\frac{D}{h}$$

wherein "θ" is the penetration angle of the angle limiting film, "D" is a diameter of the inner core, and "h" is the thickness of the angle limiting film.

19. The display panel according to claim 18, wherein a diffusion distance of the angle limiting film meets the following formula:

$$\Delta X = \frac{D \cdot (H + h)}{h}$$

wherein ΔX is the diffusion distance of the angle limiting film; "H" is a thickness of the display module; wherein the diffusion distance of the angle limiting film means a distance between the following two reflection points on the touch body: a reflection point of actual detection light rays, and a reflection point of interference detection light rays, wherein the actual detection light rays and interference detection light rays correspond to the same fingerprint identification unit;

wherein the actual detection light rays mean reflection light rays with a minimum incident angle relative to the fingerprint identification unit, compared with the incident angle of the actual detection light rays relative to the fingerprint identification unit, reflection light rays with greater incident angle relative to the fingerprint identification unit are the interference detection light rays.

20. A display apparatus having a display panel, comprising:

a display module;

a fingerprint identification module; and an angle limiting film;

wherein the display module comprises an array substrate, and a plurality of organic light emitting configurations disposed on the array substrate;

the fingerprint identification module is located in a display region and arranged at a side, facing away from the plurality of organic light emitting configurations, of the array substrate; the fingerprint identification module comprises a first substrate and at least one fingerprint identification unit disposed on the first substrate, wherein the at least one fingerprint identification unit is configured to perform fingerprint identification according to light rays reflected, through a touch body, on the fingerprint identification unit; and the angle limiting film is arranged between the display module and the fingerprint identification module, and configured to filter out the following light rays among the light rays reflected, through the touch body, on the fingerprint identification unit: relative to the angle limiting film, the light rays have an incident angle greater than a penetration angle of the angle limiting film, wherein a transmittance of the angle limiting film for incident light rays perpendicular to the angle limiting film is "$\alpha$"; the penetration angle of the angle limiting film means an incident angle of the light rays with a transmittance of "$k\alpha$" relative to the angle limiting film, wherein $0<k<1$.

* * * * *